United States Patent
Doan et al.

(10) Patent No.: US 11,228,396 B2
(45) Date of Patent: Jan. 18, 2022

(54) PROBABILISTIC AMPLITUDE SHAPING

(71) Applicant: QUALCOMM Incorporated, San Diego, CA (US)

(72) Inventors: Dung Ngoc Doan, San Diego, CA (US); Lin Yang, San Diego, CA (US); Didier Johannes Richard Van Nee, Tull en 't Waal (NL); Bin Tian, San Diego, CA (US); Thomas Joseph Richardson, South Orange, NJ (US); Stephen Jay Shellhammer, Ramona, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/140,626

(22) Filed: Jan. 4, 2021

(65) Prior Publication Data
US 2021/0211229 A1    Jul. 8, 2021

Related U.S. Application Data

(60) Provisional application No. 62/957,522, filed on Jan. 6, 2020.

(51) Int. Cl.
*H04L 1/00* (2006.01)
*H03M 13/11* (2006.01)
(Continued)

(52) U.S. Cl.
CPC .............. *H04L 1/0057* (2013.01); *G06F 1/03* (2013.01); *G06F 17/18* (2013.01);
(Continued)

(58) Field of Classification Search
CPC ....... H04L 1/0057; H04L 1/0068; G06F 1/03; G06F 17/18; H03M 13/1148; H03M 13/6393
See application file for complete search history.

(56) References Cited

U.S. PATENT DOCUMENTS 10,091,046 B1 * 10/2018 Lefevre ................. H04L 1/0041
10,200,231 B1 *  2/2019 Lefevre ............... H04L 27/2628
(Continued)

OTHER PUBLICATIONS

International Search Report and Written Opinion—PCT/US2021/012150—ISA/EPO—dated Apr. 20, 2021.

*Primary Examiner* — Kyle Vallecillo
(74) *Attorney, Agent, or Firm* — Paradice and Li LLP

(57) ABSTRACT

This disclosure provides methods, devices and systems for encoding data in wireless communications. Some implementations more specifically relate to performing a first encoding operation on data bits of a code block to shape the amplitudes of the resultant symbols such that the amplitudes have a non-uniform distribution. In some aspects, the probabilities associated with the respective amplitudes generally increase with decreasing amplitude. For example, the non-uniform distribution of the amplitudes of the symbols may be approximately Gaussian. In some aspects, the first encoding operation is or includes a prefix encoding operation having an effective coding rate greater than 0.94 but less than 1. The first encoding operation is followed by a second encoding operation that also adds redundancy but does not alter the data bits themselves. In some aspects, the second encoding operation is or includes a low-density parity-check (LDPC) encoding operation associated with a coding rate greater than 5/6.

34 Claims, 20 Drawing Sheets

(51) Int. Cl.
*H03M 13/00* (2006.01)
*G06F 17/18* (2006.01)
*G06F 1/03* (2006.01)

(52) U.S. Cl.
CPC ... *H03M 13/1148* (2013.01); *H03M 13/6393* (2013.01); *H04L 1/0068* (2013.01)

(56) References Cited

U.S. PATENT DOCUMENTS

| | | | |
|---|---|---|---|
| 2002/0044073 A1 | 4/2002 | Ungerboeck et al. | |
| 2018/0026725 A1* | 1/2018 | Cho | H04L 1/0042 |
| | | | 714/776 |
| 2018/0083716 A1* | 3/2018 | Cho | H04L 27/3411 |
| 2020/0044770 A1* | 2/2020 | Lefevre | H04L 1/0065 |
| 2020/0382139 A1* | 12/2020 | Yoffe | H03M 13/255 |
| 2021/0091886 A1* | 3/2021 | Yoffe | H04L 1/0057 |
| 2021/0194596 A1* | 6/2021 | Kim | H04B 10/616 |

\* cited by examiner

|  |  |  |  |  |  |  |
|---|---|---|---|---|---|---|
| 902a | 0 | 0 |  |  |  | 1/4 |
| 902b | 0 | 1 |  |  |  | 1/4 |
| 902c | 1 | 1 | 1 |  |  | 1/8 |
| 902d | 1 | 0 | 0 |  |  | 1/8 |
| 902e | 1 | 0 | 1 |  |  | 1/8 |
| 902f | 1 | 1 | 0 | 1 |  | 1/16 |
| 902g | 1 | 1 | 0 | 0 | 0 | 1/32 |
| 902h | 1 | 1 | 0 | 0 | 1 | 1/32 |

| | Z=3 | |
|---|---|---|
| 1 | 0 | 0 |
| 0 | 1 | 0 |
| 0 | 0 | 1 |

| | Z=3 | |
|---|---|---|
| 0 | 1 | 0 |
| 0 | 0 | 1 |
| 1 | 0 | 0 |

| | Z=3 | |
|---|---|---|
| 0 | 0 | 1 |
| 1 | 0 | 0 |
| 0 | 1 | 0 |

*Figure 14C*

PROBABILISTIC AMPLITUDE SHAPING

CROSS-REFERENCE TO RELATED APPLICATIONS

This Patent Application claims priority to U.S. Provisional Patent Application No. 62/957,522 entitled "PROBABILISTIC AMPLITUDE SHAPING" and filed on Jan. 6, 2020, which is assigned to the assignee hereof. The disclosure of the prior Application is considered part of and are incorporated by reference in this Patent Application.

TECHNICAL FIELD

This disclosure relates generally to wireless communication, and more specifically, to encoding data to achieve a non-uniform amplitude distribution.

DESCRIPTION OF THE RELATED TECHNOLOGY

A wireless local area network (WLAN) may be formed by one or more access points (APs) that provide a shared wireless communication medium for use by a number of client devices also referred to as stations (STAs). The basic building block of a WLAN conforming to the Institute of Electrical and Electronics Engineers (IEEE) 802.11 family of standards is a Basic Service Set (BSS), which is managed by an AP. Each BSS is identified by a Basic Service Set Identifier (BSSID) that is advertised by the AP. An AP periodically broadcasts beacon frames to enable any STAs within wireless range of the AP to establish or maintain a communication link with the WLAN.

Transmitting and receiving devices may support the use of various modulation and coding schemes (MCSs) to transmit and receive data so as to optimally take advantage of wireless channel conditions, for example, to increase throughput, reduce latency, or enforce various quality of service (QoS) parameters. For example, existing technology supports the use of up to 1024-QAM and it is expected that 4096-QAM (also referred to as "4k QAM") will also be implemented. 1024-QAM and 4096-QAM, among other MCSs, involve the use of low-density parity check (LDPC) encoding. An LDPC encoding operation may be performed on the data bits of a code block to, for example, add redundancy for forward error correction (FEC).

Real world wireless channels generally contain noise that imposes a limit on the maximum rate at which data can be communicated. The Shannon-Hartley theorem establishes an upper bound or limit (referred to as the "Shannon bound") that represents the absolute channel capacity of a link, that is, the maximum amount of error-free information per unit time that can be transmitted over a particular bandwidth in the presence of noise. Unfortunately, the channel capacity achievable with LDPC encoding shows a significant gap to the Shannon bound even for high MCSs. Additionally, to be able to use high MCSs, including 1024-QAM and 4096-QAM, a high signal-to-noise ratio (SNR) is required, but it may be difficult to obtain the SNRs needed for such high MCSs.

SUMMARY

The systems, methods and devices of this disclosure each have several innovative aspects, no single one of which is solely responsible for the desirable attributes disclosed herein.

One innovative aspect of the subject matter described in this disclosure can be implemented as a method of wireless communication. The method may be performed by a wireless communication device, and may include performing a first encoding operation on a plurality of information bits that produces a plurality of amplitude-shaped bits; arranging the plurality of amplitude-shaped bits into a plurality of code blocks, where each code block has a number (M) of bits that includes one or more of the plurality of amplitude-shaped bits; performing a second encoding operation on the plurality of code blocks that produces a plurality of respective codewords, where each codeword has a number (L) of bits that includes the one or more amplitude-shaped bits of the respective code block and one or more parity bits resulting from the second encoding operation, where $M/L > 5/6$; arranging the one or more amplitude-shaped bits and the one or more parity bits of each of the plurality of codewords into a plurality of symbols, where each symbol has an amplitude based on the respective amplitude-shaped bits arranged in the symbol, and where the first encoding operation produces the plurality of amplitude-shaped bits so that the amplitudes of the plurality of symbols have a non-uniform distribution; and transmitting a wireless packet, including the plurality of symbols, to at least one receiving device.

In some implementations, $M/L = 7/8$. In some implementations, the first encoding operation has an effective coding rate greater than or equal to 0.5 and less than 1. In some implementations, the first encoding operation is not performed on a plurality of unshaped information bits, where the M bits of each code block further include one or more of the plurality of unshaped bits.

In some implementations, the performing of the first encoding operation includes selecting, from a look-up table (LUT), a pattern of bit values that matches a subset of the information bits, where the LUT stores a plurality of patterns of bit values corresponding to a respective plurality of patterns of amplitude-shaped bits, and where the plurality of amplitude-shaped bits includes the pattern of amplitude-shaped bits corresponding to the selected pattern of bit values. In some aspects, each of the plurality of patterns of amplitude-shaped bits may represent a respective amplitude level having a probability of occurrence based on a probability mass function (PMF). In some other aspects, each of the plurality of patterns of amplitude-shaped bits may represent two or more amplitude levels having a probability of occurrence based on a PMF.

In some implementations, the second encoding operation is based on a low-density parity-check (LDPC) code. In some aspects, the LDPC code may have a coding rate equal to 7/8. In some other aspects, the LDPC code may have a coding rate equal to 5/6. In some implementations, the performing of the second encoding operation includes encoding the M bits of each code block as a respective number (N) of codeword bits based on the LDPC code; and puncturing a number (K) of the codeword bits associated with each code block so that $L = N - K$. In some aspects, $M = 1620$, $N = 1944$, and $K \geq 90$. In some other aspects, $M = 1701$, $N = 2106$, and $K = 162$. In some implementations, the puncturing is not performed on the plurality of amplitude-shaped bits.

Another innovative aspect of the subject matter described in this disclosure can be implemented in a wireless communication device. In some implementations, the wireless communication device may include at least one modem, at least one processor communicatively coupled with the at least one modem, and at least one memory communicatively coupled with the at least one processor and storing processor-readable code. In some implementations, execution of the processor-readable code by the at least one processor causes the wireless communication device to perform operations including performing a first encoding operation on a plurality of information bits that produces a plurality of amplitude-shaped bits; arranging the plurality of amplitude-shaped bits into a plurality of code blocks, where each code block has a number (M) of bits that includes one or more of the plurality of amplitude-shaped bits; performing a second encoding operation on the plurality of code blocks that produces a plurality of respective codewords, where each codeword has a number (L) of bits that includes the one or more amplitude-shaped bits of the respective code block and one or more parity bits resulting from the second encoding operation, where M/L>5/6; arranging the one or more amplitude-shaped bits and the one or more parity bits of each of the plurality of codewords into a plurality of symbols, where each symbol has an amplitude based on the respective amplitude-shaped bits arranged in the symbol, and where the first encoding operation produces the plurality of amplitude-shaped bits so that the amplitudes of the plurality of symbols have a non-uniform distribution; and transmitting a wireless packet, including the plurality of symbols, to at least one receiving device.

Another innovative aspect of the subject matter described in this disclosure can be implemented as a method of wireless communication. The method may be performed by a wireless communication device, and may include receiving a wireless packet including a plurality of symbols having a plurality of amplitudes, where the plurality of symbols represents a plurality of codeword bits, and where the plurality of amplitudes has a non-uniform distribution; arranging the plurality of codeword bits into a plurality of code blocks, where each code block includes a number (L) of the codeword bits; performing a first decoding operation on the plurality of code blocks that produces a plurality of respective codewords, where each codeword has a number (M) of bits that includes a plurality of amplitude-shaped bits and a plurality of parity bits, where M/L>5/6, and where the plurality of amplitude-shaped bits of each codeword indicates the amplitude of a respective symbol of the plurality of symbols; and performing a second decoding operation on the plurality of amplitude-shaped bits of each codeword that produces a plurality of respective de-shaped bits for each of the plurality of codewords.

In some implementations, M/L=7/8. In some implementations, the first decoding operation is based on an LDPC code. In some aspects, the LDPC code may have a coding rate equal to 7/8. In some other aspects, the LDPC code may have a coding rate equal to 5/6.

In some implementations, the second decoding operation reverses a prefix encoding operation having an effective coding rate greater than or equal to 0.5 and less than 1. In some implementations, the performing of the second decoding operation includes selecting, from a LUT, a pattern of de-shaped bits that matches the plurality of amplitude-shaped bits of a respective codeword of the plurality of codewords, where the LUT stores a plurality of patterns of de-shaped bits corresponding to a respective plurality of patterns of amplitude-shaped bits, and where the plurality of de-shaped bits includes the selected pattern of de-shaped bits. In some aspects, each of the plurality of patterns of amplitude-shaped bits may represent a respective amplitude of the plurality of amplitudes having a probability of occurrence based on a PMF. In some other aspects, each of the plurality of patterns of amplitude-shaped bits may represent two or more amplitudes of the plurality of amplitudes having a probability of occurrence based on a PMF.

Another innovative aspect of the subject matter described in this disclosure can be implemented in a wireless communication device. In some implementations, the wireless communication device may include at least one modem, at least one processor communicatively coupled with the at least one modem, and at least one memory communicatively coupled with the at least one processor and storing processor-readable code. In some implementations, execution of the processor-readable code by the at least one processor causes the wireless communication device to perform operations including receiving a wireless packet including a plurality of symbols having a plurality of amplitudes, where the plurality of symbols represents a plurality of codeword bits, and where the plurality of amplitudes has a non-uniform distribution; arranging the plurality of codeword bits into a plurality of code blocks, where each code block includes a number (L) of the codeword bits; performing a first decoding operation on the plurality of code blocks that produces a plurality of respective codewords, where each codeword has a number (M) of bits that includes a plurality of amplitude-shaped bits and a plurality of parity bits, where M/L>5/6, and where the plurality of amplitude-shaped bits of each codeword indicates the amplitude of a respective symbol of the plurality of symbols; and performing a second decoding operation on the plurality of amplitude-shaped bits of each codeword that produces a plurality of respective de-shaped bits for each of the plurality of codewords.

BRIEF DESCRIPTION OF THE DRAWINGS

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

FIG. 9 shows an example look-up table (LUT) that supports amplitude shaping according to some implementations.

FIG. 13 shows an example parity-check matrix for a low-density parity-check (LDPC) code according to some implementations.

FIGS. 14A-14C show example cyclic permutation matrices.

Like reference numbers and designations in the various drawings indicate like elements.

DETAILED DESCRIPTION

Figure 1:
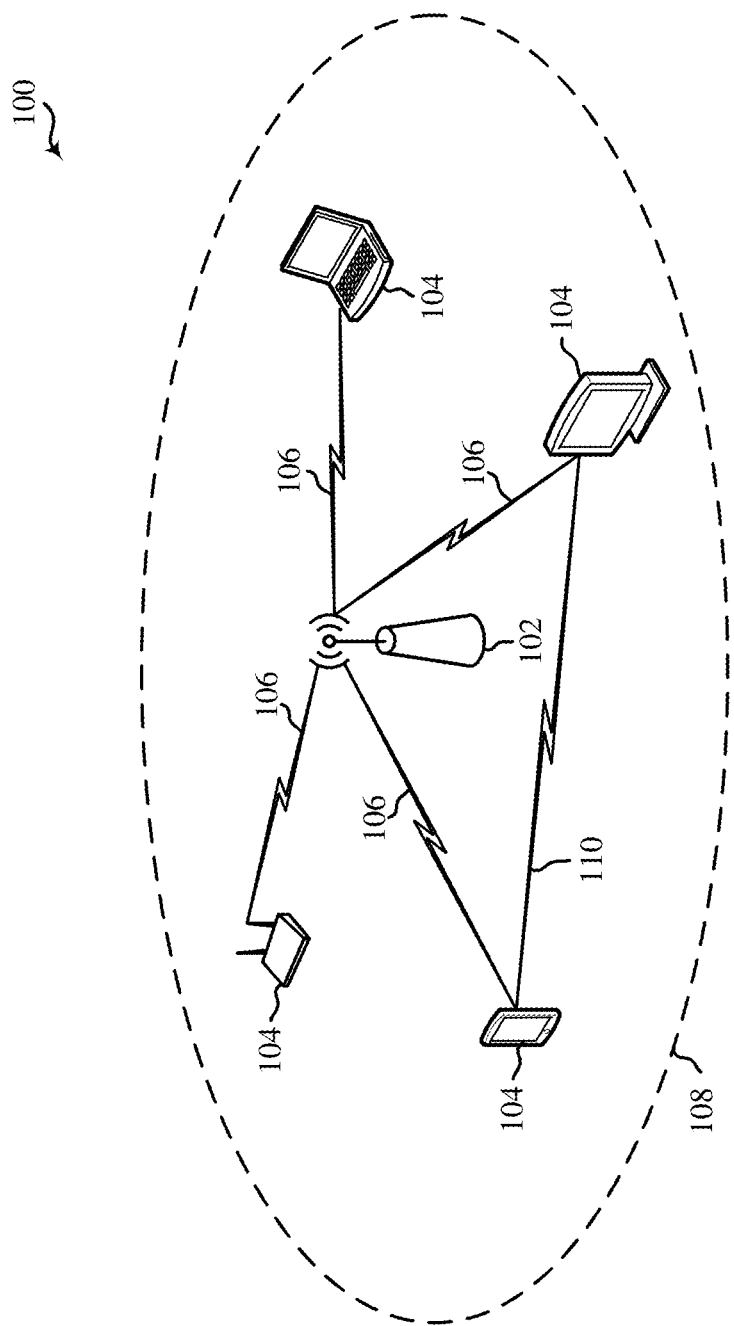
FIG. 1 shows a pictorial diagram of an example wireless communication network.

The following description is directed to some particular implementations for the purposes of describing innovative aspects of this disclosure. However, a person having ordinary skill in the art will readily recognize that the teachings herein can be applied in a multitude of different ways. The described implementations can be implemented in any device, system or network that is capable of transmitting and receiving radio frequency (RF) signals according to one or more of the Institute of Electrical and Electronics Engineers (IEEE) 802.11 standards, the IEEE 802.15 standards, the Bluetooth® standards as defined by the Bluetooth Special Interest Group (SIG), or the Long Term Evolution (LTE), 3G, 4G or 5G (New Radio (NR)) standards promulgated by the 3rd Generation Partnership Project (3GPP), among others. The described implementations can be implemented in any device, system or network that is capable of transmitting and receiving RF signals according to one or more of the following technologies or techniques: code division multiple access (CDMA), time division multiple access (TDMA), frequency division multiple access (FDMA), orthogonal FDMA (OFDMA), single-carrier FDMA (SC-FDMA), single-user (SU) multiple-input multiple-output (MIMO) and multi-user (MU) MIMO. The described implementations also can be implemented using other wireless communication protocols or RF signals suitable for use in one or more of a wireless personal area network (WPAN), a wireless local area network (WLAN), a wireless wide area network (WWAN), or an internet of things (IOT) network.

Various aspects relate generally to encoding data for wireless communication to achieve a desired amplitude distribution, and more particularly, to performing a first encoding operation on data bits of a code block to shape the amplitudes of the resultant symbols such that the amplitudes have a non-uniform distribution. In some aspects, the probabilities associated with the respective amplitudes generally increase with decreasing amplitude. For example, the non-uniform distribution of the amplitudes of the symbols may be approximately Gaussian. In some aspects, the first encoding operation is or includes a prefix encoding operation having an effective coding rate greater than 0.94 but less than 1. For example, the first encoding operation may add redundancy to the input data bits by expanding the overall number of data bits. The first encoding operation is followed by a second encoding operation that also adds redundancy but does not alter the data bits themselves. In some aspects, the second encoding operation is or includes a low-density parity-check (LDPC) encoding operation associated with a coding rate greater than 5/6, such as 7/8.

Particular implementations of the subject matter described in this disclosure can be implemented to realize one or more of the following potential advantages. In some implementations, the described techniques can be used to close the gap between the channel capacity actually attainable by a transmitting device and the theoretical Shannon bound, for example, by encoding the amplitudes such that the resultant amplitude distributions are approximately Gaussian. In the present implementations, the spectral efficiency of the wireless communications is affected by the coding rate of the first encoding operation as well as the coding rate of the second encoding operation. As described above, the first encoding operation has an effective coding rate <1. By combining the first encoding operation with a second encoding operation having a coding rate of 7/8, aspects of the present disclosure may achieve an overall coding rate of ~5/6 (which allows for peak spectral efficiency in accordance with existing versions of the IEEE 802.11 standard).

FIG. 1 shows a block diagram of an example wireless communication network 100. According to some aspects, the wireless communication network 100 can be an example of a wireless local area network (WLAN) such as a Wi-Fi network (and will hereinafter be referred to as WLAN 100). For example, the WLAN 100 can be a network implementing at least one of the IEEE 802.11 family of wireless communication protocol standards (such as that defined by the IEEE 802.11-2016 specification or amendments thereof including, but not limited to, 802.11ah, 802.11ad, 802.11ay, 802.11ax, 802.11az, 802.11ba and 802.11be). The WLAN 100 may include numerous wireless communication devices such as an access point (AP) 102 and multiple stations (STAs) 104. While only one AP 102 is shown, the WLAN network 100 also can include multiple APs 102.

Each of the STAs 104 also may be referred to as a mobile station (MS), a mobile device, a mobile handset, a wireless handset, an access terminal (AT), a user equipment (UE), a subscriber station (SS), or a subscriber unit, among other possibilities. The STAs 104 may represent various devices such as mobile phones, personal digital assistant (PDAs), other handheld devices, netbooks, notebook computers, tablet computers, laptops, display devices (for example, TVs, computer monitors, navigation systems, among others), music or other audio or stereo devices, remote control devices ("remotes"), printers, kitchen or other household appliances, key fobs (for example, for passive keyless entry and start (PKES) systems), among other possibilities.

A single AP 102 and an associated set of STAs 104 may be referred to as a basic service set (BSS), which is managed by the respective AP 102. FIG. 1 additionally shows an example coverage area 106 of the AP 102, which may represent a basic service area (BSA) of the WLAN 100. The BSS may be identified to users by a service set identifier (SSID), as well as to other devices by a basic service set identifier (BSSID), which may be a medium access control (MAC) address of the AP 102. The AP 102 periodically broadcasts beacon frames ("beacons") including the BSSID to enable any STAs 104 within wireless range of the AP 102 to "associate" or re-associate with the AP 102 to establish a respective communication link 108 (hereinafter also referred to as a "Wi-Fi link"), or to maintain a communication link 108, with the AP 102. For example, the beacons can include an identification of a primary channel used by the respective AP 102 as well as a timing synchronization function for establishing or maintaining timing synchronization with the AP 102. The AP 102 may provide access to external networks to various STAs 104 in the WLAN via respective communication links 108.

To establish a communication link 108 with an AP 102, each of the STAs 104 is configured to perform passive or active scanning operations ("scans") on frequency channels in one or more frequency bands (for example, the 2.4 GHz, 5 GHz, 6 GHz or 60 GHz bands). To perform passive scanning, a STA 104 listens for beacons, which are transmitted by respective APs 102 at a periodic time interval referred to as the target beacon transmission time (TBTT) (measured in time units (TUs) where one TU may be equal to 1024 microseconds (μs)). To perform active scanning, a STA 104 generates and sequentially transmits probe requests on each channel to be scanned and listens for probe responses from APs 102. Each STA 104 may be configured to identify or select an AP 102 with which to associate based on the scanning information obtained through the passive or active scans, and to perform authentication and association operations to establish a communication link 108 with the selected AP 102. The AP 102 assigns an association identifier (AID) to the STA 104 at the culmination of the association operations, which the AP 102 uses to track the STA 104.

As a result of the increasing ubiquity of wireless networks, a STA 104 may have the opportunity to select one of many BSSs within range of the STA or to select among multiple APs 102 that together form an extended service set (ESS) including multiple connected BSSs. An extended network station associated with the WLAN 100 may be connected to a wired or wireless distribution system that may allow multiple APs 102 to be connected in such an ESS. As such, a STA 104 can be covered by more than one AP 102 and can associate with different APs 102 at different times for different transmissions. Additionally, after association with an AP 102, a STA 104 also may be configured to periodically scan its surroundings to find a more suitable AP 102 with which to associate. For example, a STA 104 that is moving relative to its associated AP 102 may perform a "roaming" scan to find another AP 102 having more desirable network characteristics such as a greater received signal strength indicator (RSSI) or a reduced traffic load.

In some cases, STAs 104 may form networks without APs 102 or other equipment other than the STAs 104 themselves. One example of such a network is an ad hoc network (or wireless ad hoc network). Ad hoc networks may alternatively be referred to as mesh networks or peer-to-peer (P2P) networks. In some cases, ad hoc networks may be implemented within a larger wireless network such as the WLAN 100. In such implementations, while the STAs 104 may be capable of communicating with each other through the AP 102 using communication links 108, STAs 104 also can communicate directly with each other via direct wireless links 110. Additionally, two STAs 104 may communicate via a direct communication link 110 regardless of whether both STAs 104 are associated with and served by the same AP 102. In such an ad hoc system, one or more of the STAs 104 may assume the role filled by the AP 102 in a BSS. Such a STA 104 may be referred to as a group owner (GO) and may coordinate transmissions within the ad hoc network. Examples of direct wireless links 110 include Wi-Fi Direct connections, connections established by using a Wi-Fi Tunneled Direct Link Setup (TDLS) link, and other P2P group connections.

The APs 102 and STAs 104 may function and communicate (via the respective communication links 108) according to the IEEE 802.11 family of wireless communication protocol standards (such as that defined by the IEEE 802.11-2016 specification or amendments thereof including, but not limited to, 802.11ah, 802.11ad, 802.11ay, 802.11ax, 802.11az, 802.11ba and 802.11be). These standards define the WLAN radio and baseband protocols for the PHY and medium access control (MAC) layers. The APs 102 and STAs 104 transmit and receive wireless communications (hereinafter also referred to as "Wi-Fi communications") to and from one another in the form of physical layer convergence protocol (PLCP) protocol data units (PPDUs). The APs 102 and STAs 104 in the WLAN 100 may transmit PPDUs over an unlicensed spectrum, which may be a portion of spectrum that includes frequency bands traditionally used by Wi-Fi technology, such as the 2.4 GHz band, the 5 GHz band, the 60 GHz band, the 3.6 GHz band, and the 900 MHz band. Some implementations of the APs 102 and STAs 104 described herein also may communicate in other frequency bands, such as the 6 GHz band, which may support both licensed and unlicensed communications. The APs 102 and STAs 104 also can be configured to communicate over other frequency bands such as shared licensed frequency bands, where multiple operators may have a license to operate in the same or overlapping frequency band or bands.

Each of the frequency bands may include multiple sub-bands or frequency channels. For example, PPDUs conforming to the IEEE 802.11n, 802.11ac and 802.11ax standard amendments may be transmitted over the 2.4 and 5 GHz bands, each of which is divided into multiple 20 MHz channels. As such, these PPDUs are transmitted over a physical channel having a minimum bandwidth of 20 MHz, but larger channels can be formed through channel bonding. For example, PPDUs may be transmitted over physical channels having bandwidths of 40 MHz, 80 MHz, 160 or 320 MHz by bonding together multiple 20 MHz channels.

Each PPDU is a composite structure that includes a PHY preamble and a payload in the form of a PLCP service data unit (PSDU). The information provided in the preamble may be used by a receiving device to decode the subsequent data in the PSDU. In instances in which PPDUs are transmitted over a bonded channel, the preamble fields may be duplicated and transmitted in each of the multiple component channels. The PHY preamble may include both a legacy portion (or "legacy preamble") and a non-legacy portion (or "non-legacy preamble"). The legacy preamble may be used for packet detection, automatic gain control and channel estimation, among other uses. The legacy preamble also may generally be used to maintain compatibility with legacy devices. The format of, coding of, and information provided in the non-legacy portion of the preamble is based on the particular IEEE 802.11 protocol to be used to transmit the payload.

Figure 2A:
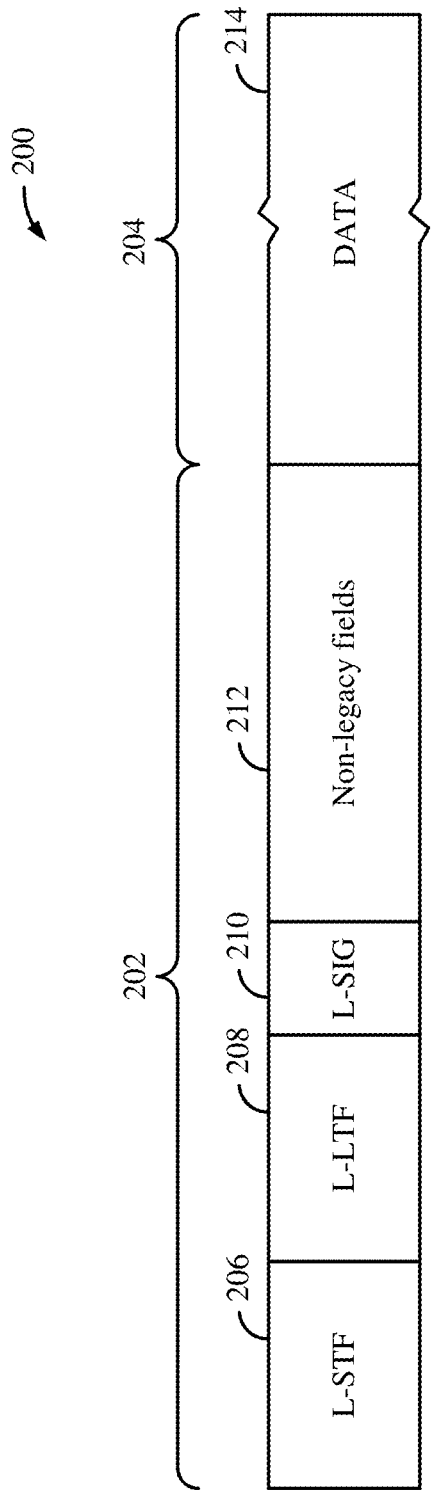
FIG. 2A shows an example protocol data unit (PDU) usable for communications between an access point (AP) and a number of stations (STAs).

FIG. 2A shows an example protocol data unit (PDU) 200 usable for wireless communication between an AP and a number of STAs. For example, the PDU 200 can be configured as a PPDU. As shown, the PDU 200 includes a PHY preamble 202 and a PHY payload 204. For example, the preamble 202 may include a legacy portion that itself includes a legacy short training field (L-STF) 206, which may consist of two BPSK symbols, a legacy long training field (L-LTF) 208, which may consist of two BPSK symbols, and a legacy signal field (L-SIG) 210, which may consist of two BPSK symbols. The legacy portion of the preamble 202 may be configured according to the IEEE 802.11a wireless communication protocol standard. The preamble 202 may also include a non-legacy portion including one or more non-legacy fields 212, for example, conforming to an IEEE wireless communication protocol such as the IEEE 802.11ac, 802.11ax, 802.11be or later wireless communication protocol standards.

The L-STF 206 generally enables a receiving device to perform automatic gain control (AGC) and coarse timing and frequency estimation. The L-LTF 208 generally enables a receiving device to perform fine timing and frequency estimation and also to perform an initial estimate of the wireless channel. The L-SIG 210 generally enables a receiving device to determine a duration of the PDU and to use the determined duration to avoid transmitting on top of the PDU. For example, the L-STF 206, the L-LTF 208 and the L-SIG 210 may be modulated according to a binary phase shift keying (BPSK) modulation scheme. The payload 204 may be modulated according to a BPSK modulation scheme, a quadrature BPSK (Q-BPSK) modulation scheme, a quadrature amplitude modulation (QAM) modulation scheme, or another appropriate modulation scheme. The payload 204 may include a PSDU including a data field (DATA) 214 that, in turn, may carry higher layer data, for example, in the form of medium access control (MAC) protocol data units (MPDUs) or an aggregated MPDU (A-MPDU).

Figure 2B:
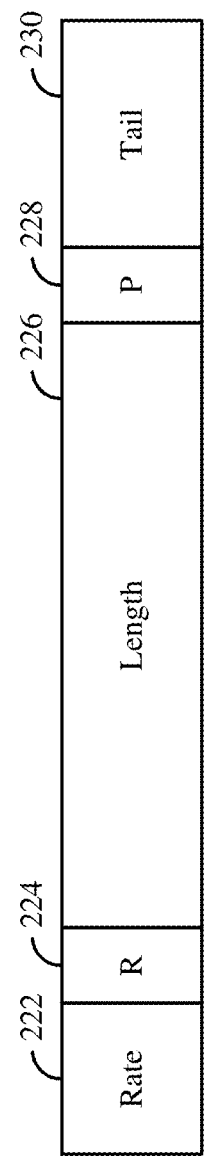
FIG. 2B shows an example field in the PDU of FIG. 2A.

FIG. 2B shows an example L-SIG 210 in the PDU 200 of FIG. 2A. The L-SIG 210 includes a data rate field 222, a reserved bit 224, a length field 226, a parity bit 228, and a tail field 230. The data rate field 222 indicates a data rate (note that the data rate indicated in the data rate field 212 may not be the actual data rate of the data carried in the payload 204). The length field 226 indicates a length of the packet in units of, for example, symbols or bytes. The parity bit 228 may be used to detect bit errors. The tail field 230 includes tail bits that may be used by the receiving device to terminate operation of a decoder (for example, a Viterbi decoder). The receiving device may utilize the data rate and the length indicated in the data rate field 222 and the length field 226 to determine a duration of the packet in units of, for example, microseconds (µs) or other time units.

Figure 3:
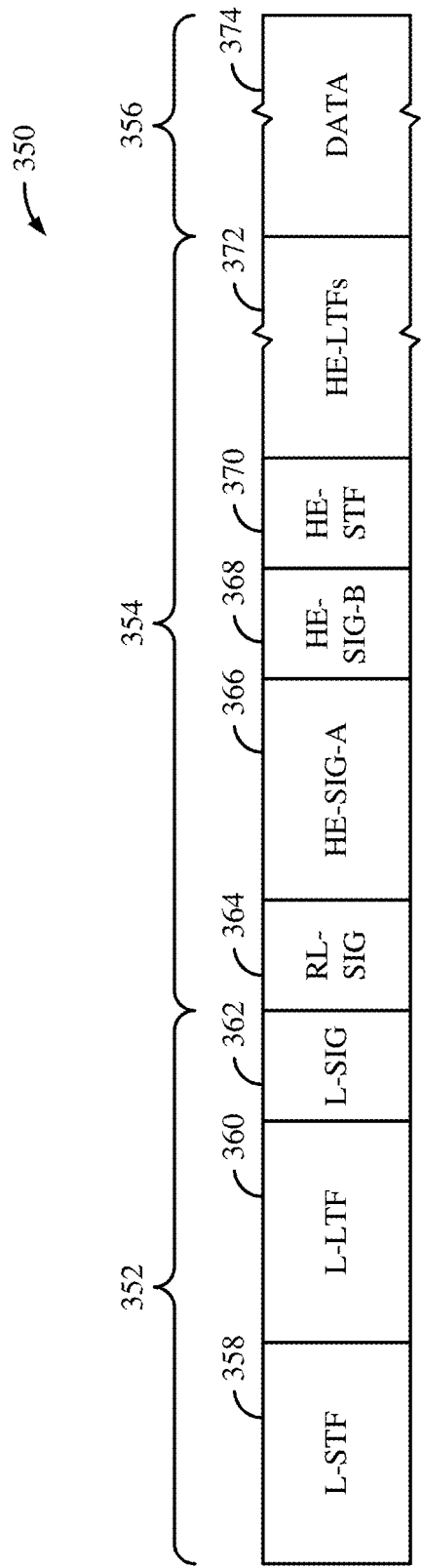
FIG. 3 shows another example PDU usable for communications between an AP and a number of STAs.

FIG. 3 shows another example PDU 350 usable for wireless communication between an AP and a number of STAs. The PDU 350 ay be used for MU-OFDMA or MU-MIMO transmissions. The PDU 350 includes a PHY preamble including a legacy portion 352 and a non-legacy portion 354. The PDU 350 may further include a PHY payload 356 after the preamble, for example, in the form of a PSDU including a DATA field 374. The legacy portion 352 includes L-STF 358, L-LTF 360, and L-SIG 362. The non-legacy portion 354 of the preamble and the DATA field 374 may be formatted as a High Efficiency (HE) WLAN preamble and frame, respectively, in accordance with the IEEE 802.11ax amendment to the IEEE 802.11 wireless communication protocol standard. The non-legacy portion 354 includes a repeated legacy signal field (RL-SIG) 364, a first HE signal field (HE-SIG-A) 366, a second HE signal field (HE-SIG-B) 368 encoded separately from HE-SIG-A 366, an HE short training field (HE-STF) 370 and a number of HE long training fields (HE-LTFs) 372. Like the L-STF 358, L-LTF 360, and L-SIG 362, the information in RL-SIG 364 and HE-SIG-A 366 may be duplicated and transmitted in each of the component 20 MHz channels in instances involving the use of a bonded channel. In contrast, HE-SIG-B 368 may be unique to each 20 MHz channel and may target specific STAs 104.

RL-SIG 364 may indicate to HE-compatible STAs 104 that the PPDU is an HE PPDU. An AP 102 may use HE-SIG-A 366 to identify and inform multiple STAs 104 that the AP has scheduled UL or DL resources for them. HE-SIG-A 366 may be decoded by each HE-compatible STA 104 served by the AP 102. HE-SIG-A 366 includes information usable by each identified STA 104 to decode an associated HE-SIG-B 368. For example, HE-SIG-A 366 may indicate the frame format, including locations and lengths of HE-SIG-Bs 368, available channel bandwidths, modulation and coding schemes (MCSs), among other possibilities. HE-SIG-A 366 also may include HE WLAN signaling information usable by STAs 104 other than the number of identified STAs 104.

HE-SIG-B 368 may carry STA-specific scheduling information such as, for example, per-user MCS values and per-user RU allocation information. In the context of DL MU-OFDMA, such information enables the respective STAs 104 to identify and decode corresponding RUs in the associated data field. Each HE-SIG-B 368 includes a common field and at least one STA-specific ("user-specific") field. The common field can indicate RU distributions to multiple STAs 104, indicate the RU assignments in the frequency domain, indicate which RUs are allocated for MU-MIMO transmissions and which RUs correspond to MU-OFDMA transmissions, and the number of users in allocations, among other possibilities. The common field may be encoded with common bits, CRC bits, and tail bits. The user-specific fields are assigned to particular STAs 104 and may be used to schedule specific RUs and to indicate the scheduling to other WLAN devices. Each user-specific field may include multiple user block fields (which may be followed by padding). Each user block field may include two user fields that contain information for two respective STAs to decode their respective RU payloads in DATA field 374.

As described above, APs 102 and STAs 104 can support multi-user (MU) communications; that is, concurrent transmissions from one device to each of multiple devices (for example, multiple simultaneous downlink (DL) communications from an AP 102 to corresponding STAs 104), or concurrent transmissions from multiple devices to a single device (for example, multiple simultaneous uplink (UL) transmissions from corresponding STAs 104 to an AP 102). To support the MU transmissions, the APs 102 and STAs 104 may utilize multi-user multiple-input, multiple-output (MU-MIMO) and multi-user orthogonal frequency division multiple access (MU-OFDMA) techniques.

In MU-OFDMA schemes, the available frequency spectrum of the wireless channel may be divided into multiple resource units (RUs) each including a number of different frequency subcarriers ("tones"). Different RUs may be allocated or assigned by an AP 102 to different STAs 104 at particular times. The sizes and distributions of the RUs may be referred to as an RU allocation. In some implementations, RUs may be allocated in 2 MHz intervals, and as such, the smallest RU may include 26 tones consisting of 24 data tones and 2 pilot tones. Consequently, in a 20 MHz channel, up to 9 RUs (such as 2 MHz, 26-tone RUs) may be allocated (because some tones are reserved for other purposes). Similarly, in a 160 MHz channel, up to 74 RUs may be allocated. Larger 52 tone, 106 tone, 242 tone, 484 tone and 996 tone RUs may also be allocated. Adjacent RUs may be separated by a null subcarrier (such as a DC subcarrier), for example, to reduce interference between adjacent RUs, to reduce receiver DC offset, and to avoid transmit center frequency leakage.

For UL MU transmissions, an AP 102 can transmit a trigger frame to initiate and synchronize an UL MU-OFDMA or UL MU-MIMO transmission from multiple STAs 104 to the AP 102. Such trigger frames may thus enable multiple STAs 104 to send UL traffic to the AP 102 concurrently in time. A trigger frame may address one or more STAs 104 through respective association identifiers (AIDs), and may assign each AID (and thus each STA 104) one or more RUs that can be used to send UL traffic to the AP 102. The AP also may designate one or more random access (RA) RUs that unscheduled STAs 104 may contend for.

Figure 4:
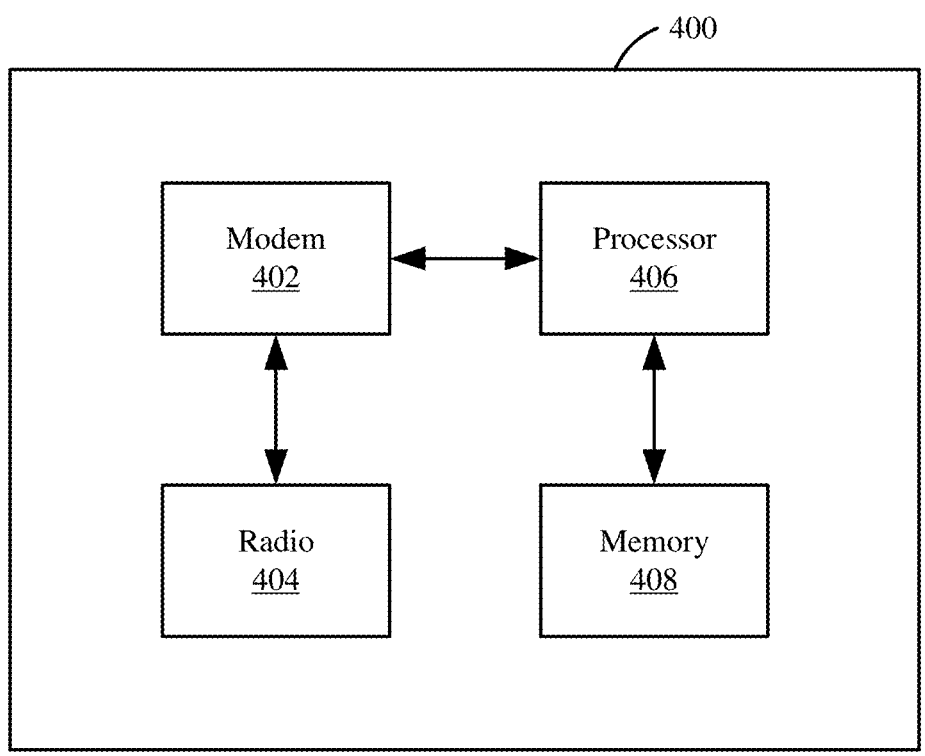
FIG. 4 shows a block diagram of an example wireless communication device.

FIG. 4 shows a block diagram of an example wireless communication device 400. In some implementations, the wireless communication device 400 can be an example of a device for use in a STA such as one of the STAs 104 described with reference to FIG. 1. In some implementations, the wireless communication device 400 can be an example of a device for use in an AP such as the AP 102 described with reference to FIG. 1. The wireless communication device 400 is capable of transmitting (or outputting for transmission) and receiving wireless communications (for example, in the form of wireless packets). For example, the wireless communication device can be configured to transmit and receive packets in the form of physical layer convergence protocol (PLCP) protocol data units (PPDUs) and medium access control (MAC) protocol data units (MPDUs) conforming to an IEEE 802.11 wireless communication protocol standard, such as that defined by the IEEE 802.11-2016 specification or amendments thereof including, but not limited to, 802.11ah, 802.11ad, 802.11ay, 802.11ax, 802.11az, 802.11ba and 802.11be.

The wireless communication device 400 can be, or can include, a chip, system on chip (SoC), chipset, package or device that includes one or more modems 402, for example, a Wi-Fi (IEEE 802.11 compliant) modem. In some implementations, the one or more modems 402 (collectively "the modem 402") additionally include a WWAN modem (for example, a 3GPP 4G LTE or 5G compliant modem). In some implementations, the wireless communication device 400 also includes one or more radios 404 (collectively "the radio 404"). In some implementations, the wireless communication device 406 further includes one or more processors, processing blocks or processing elements 406 (collectively "the processor 406") and one or more memory blocks or elements 408 (collectively "the memory 408").

The modem 402 can include an intelligent hardware block or device such as, for example, an application-specific integrated circuit (ASIC) among other possibilities. The modem 402 is generally configured to implement a PHY layer. For example, the modem 402 is configured to modulate packets and to output the modulated packets to the radio 404 for transmission over the wireless medium. The modem 402 is similarly configured to obtain modulated packets received by the radio 404 and to demodulate the packets to provide demodulated packets. In addition to a modulator and a demodulator, the modem 402 may further include digital signal processing (DSP) circuitry, automatic gain control (AGC), a coder, a decoder, a multiplexer and a demultiplexer. For example, while in a transmission mode, data obtained from the processor 406 is provided to a coder, which encodes the data to provide encoded bits. The encoded bits are then mapped to points in a modulation constellation (using a selected MCS) to provide modulated symbols. The modulated symbols may then be mapped to a number $N_{SS}$ of spatial streams or a number $N_{STS}$ of space-time streams. The modulated symbols in the respective spatial or space-time streams may then be multiplexed, transformed via an inverse fast Fourier transform (IFFT) block, and subsequently provided to the DSP circuitry for Tx windowing and filtering. The digital signals may then be provided to a digital-to-analog converter (DAC). The resultant analog signals may then be provided to a frequency upconverter, and ultimately, the radio 404. In implementations involving beamforming, the modulated symbols in the respective spatial streams are precoded via a steering matrix prior to their provision to the IFFT block.

While in a reception mode, digital signals received from the radio 404 are provided to the DSP circuitry, which is configured to acquire a received signal, for example, by detecting the presence of the signal and estimating the initial timing and frequency offsets. The DSP circuitry is further configured to digitally condition the digital signals, for example, using channel (narrowband) filtering, analog impairment conditioning (such as correcting for I/Q imbalance), and applying digital gain to ultimately obtain a narrowband signal. The output of the DSP circuitry may then be fed to the AGC, which is configured to use information extracted from the digital signals, for example, in one or more received training fields, to determine an appropriate gain. The output of the DSP circuitry also is coupled with the demodulator, which is configured to extract modulated symbols from the signal and, for example, compute the logarithm likelihood ratios (LLRs) for each bit position of each subcarrier in each spatial stream. The demodulator is coupled with the decoder, which may be configured to process the LLRs to provide decoded bits. The decoded bits from all of the spatial streams are then fed to the demultiplexer for demultiplexing. The demultiplexed bits may then be descrambled and provided to the MAC layer (the processor 406) for processing, evaluation or interpretation.

The radio 404 generally includes at least one radio frequency (RF) transmitter (or "transmitter chain") and at least one RF receiver (or "receiver chain"), which may be combined into one or more transceivers. For example, the RF transmitters and receivers may include various DSP circuitry including at least one power amplifier (PA) and at least one low-noise amplifier (LNA), respectively. The RF transmitters and receivers may, in turn, be coupled to one or more antennas. For example, in some implementations, the wireless communication device 400 can include, or be coupled with, multiple transmit antennas (each with a corresponding transmit chain) and multiple receive antennas (each with a corresponding receive chain). The symbols output from the modem 402 are provided to the radio 404, which then transmits the symbols via the coupled antennas. Similarly, symbols received via the antennas are obtained by the radio 404, which then provides the symbols to the modem 402.

The processor 406 can include an intelligent hardware block or device such as, for example, a processing core, a processing block, a central processing unit (CPU), a microprocessor, a microcontroller, a digital signal processor (DSP), an application-specific integrated circuit (ASIC), a programmable logic device (PLD) such as a field programmable gate array (FPGA), discrete gate or transistor logic, discrete hardware components, or any combination thereof designed to perform the functions described herein. The processor 406 processes information received through the radio 404 and the modem 402, and processes information to be output through the modem 402 and the radio 404 for transmission through the wireless medium. For example, the processor 406 may implement a control plane and MAC layer configured to perform various operations related to the generation and transmission of MPDUs, frames or packets. The MAC layer is configured to perform or facilitate the coding and decoding of frames, spatial multiplexing, space-time block coding (STBC), beamforming, and OFDMA resource allocation, among other operations or techniques. In some implementations, the processor 406 may generally control the modem 402 to cause the modem to perform various operations described above.

The memory 404 can include tangible storage media such as random-access memory (RAM) or read-only memory (ROM), or combinations thereof. The memory 404 also can store non-transitory processor- or computer-executable software (SW) code containing instructions that, when executed by the processor 406, cause the processor to perform various operations described herein for wireless communication, including the generation, transmission, reception and interpretation of MPDUs, frames or packets. For example, various functions of components disclosed herein, or various blocks or steps of a method, operation, process or algorithm disclosed herein, can be implemented as one or more modules of one or more computer programs.

Figure 5B:
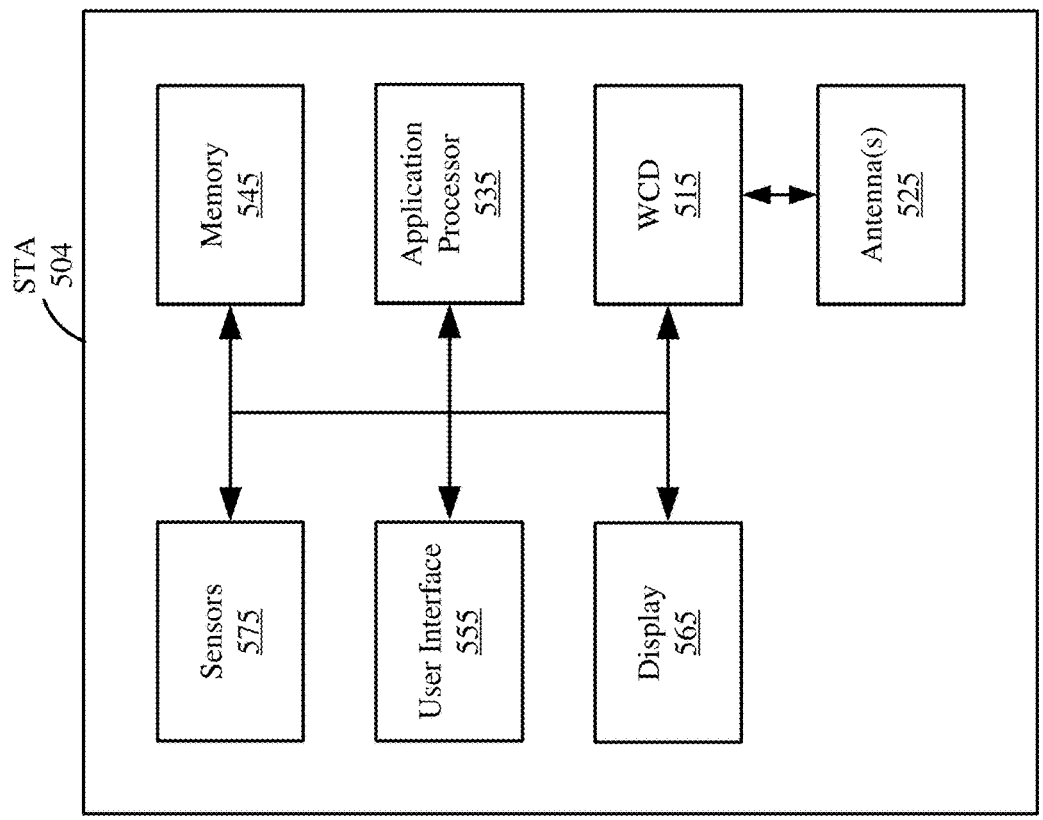
FIG. 5B shows a block diagram of an example station (STA).
Figure 5A:
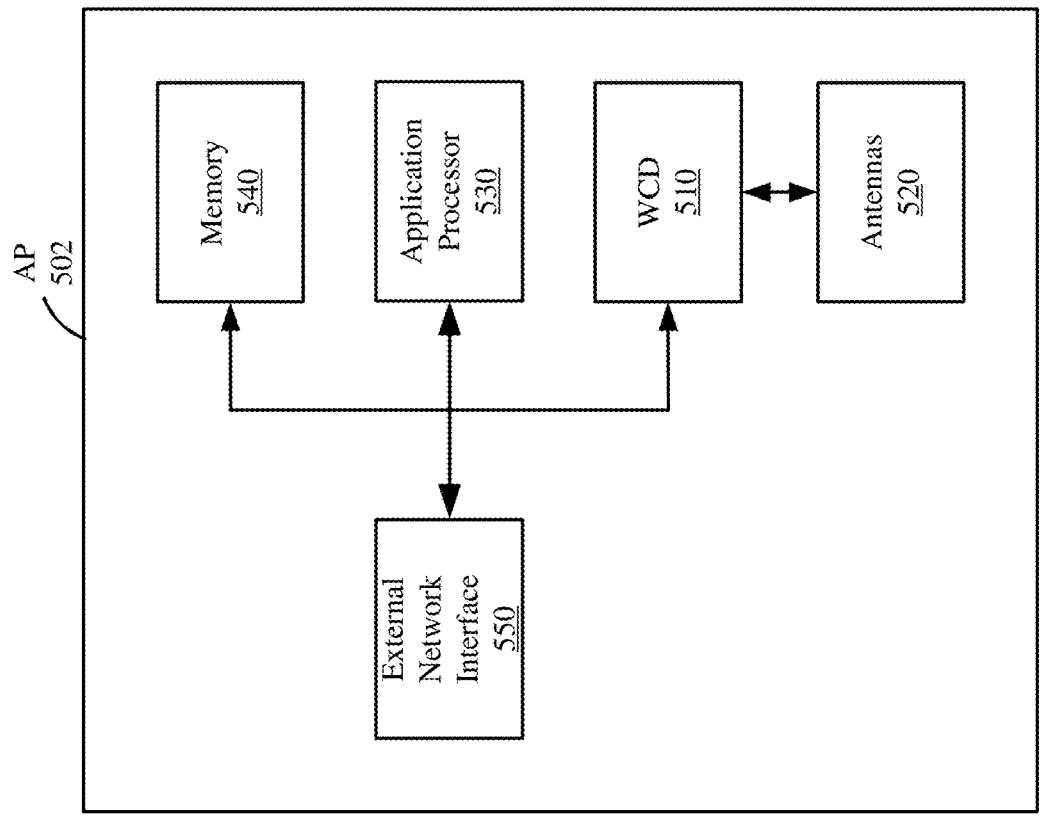
FIG. 5A shows a block diagram of an example access point (AP).

FIG. 5A shows a block diagram of an example AP 502. For example, the AP 502 can be an example implementation of the AP 102 described with reference to FIG. 1. The AP 502 includes a wireless communication device (WCD) 510 (although the AP 502 may itself also be referred to generally as a wireless communication device as used herein). For example, the wireless communication device 510 may be an example implementation of the wireless communication device 4000 described with reference to FIG. 4. The AP 502 also includes multiple antennas 520 coupled with the wireless communication device 510 to transmit and receive wireless communications. In some implementations, the AP 502 additionally includes an application processor 530 coupled with the wireless communication device 510, and a memory 540 coupled with the application processor 530. The AP 502 further includes at least one external network interface 550 that enables the AP 502 to communicate with a core network or backhaul network to gain access to external networks including the Internet. For example, the external network interface 550 may include one or both of a wired (for example, Ethernet) network interface and a wireless network interface (such as a WWAN interface). Ones of the aforementioned components can communicate with other ones of the components directly or indirectly, over at least one bus. The AP 502 further includes a housing that encompasses the wireless communication device 510, the application processor 530, the memory 540, and at least portions of the antennas 520 and external network interface 550.

FIG. 5B shows a block diagram of an example STA 504. For example, the STA 504 can be an example implementation of the STA 104 described with reference to FIG. 1. The STA 504 includes a wireless communication device 515 (although the STA 504 may itself also be referred to generally as a wireless communication device as used herein). For example, the wireless communication device 515 may be an example implementation of the wireless communication device 400 described with reference to FIG. 4. The STA 504 also includes one or more antennas 525 coupled with the wireless communication device 515 to transmit and receive wireless communications. The STA 504 additionally includes an application processor 535 coupled with the wireless communication device 515, and a memory 545 coupled with the application processor 535. In some implementations, the STA 504 further includes a user interface (UI) 555 (such as a touchscreen or keypad) and a display 565, which may be integrated with the UI 555 to form a touchscreen display. In some implementations, the STA 504 may further include one or more sensors 575 such as, for example, one or more inertial sensors, accelerometers, temperature sensors, pressure sensors, or altitude sensors. Ones of the aforementioned components can communicate with other ones of the components directly or indirectly, over at least one bus. The STA 504 further includes a housing that encompasses the wireless communication device 515, the application processor 535, the memory 545, and at least portions of the antennas 525, UI 555, and display 565.

Transmitting and receiving devices may support the use of various modulation and coding schemes (MCSs) to transmit and receive data so as to optimally take advantage of wireless channel conditions, for example, to increase throughput, reduce latency, or enforce various quality of service (QoS) parameters. For example, existing technology supports the use of up to 1024-QAM and it is expected that 4096-QAM (also referred to as "4k QAM") will also be implemented. 1024-QAM and 4096-QAM, among other MCSs, involve the use of low-density parity check (LDPC) encoding. For example, a PHY layer of the transmitting device may receive one or more MPDUs or A-MPDUs from a MAC layer of the transmitting device in the form of a PSDU. The PSDU may be arranged into multiple code blocks, each of which contains primary information (or "systematic information") representative of some or all of one or more of the MPDUs in the form of information bits. Some of the information bits (also referred to herein as "amplitude bits") in the code block are used to determine the amplitudes of the symbols to be modulated and transmitted to the receiving device. An LDPC encoding operation may be performed on the information bits in the code block to, for example, encode the data bits to add redundancy for forward error correction. Because LDPC encoding is an example of systematic encoding, the LDPC encoding operation does not change the data bits; rather, the amplitude bits output from the LDPC encoder are the same as the amplitude bits input to the LDPC encoder. In other words, the values of the amplitude bits used for the modulation come directly from the initial code block.

Real world wireless channels generally contain noise that imposes a limit on the maximum rate at which data can be communicated. The Shannon-Hartley theorem establishes an upper bound or limit (referred to as the "Shannon bound") that represents the absolute channel capacity of a link, that is, the maximum amount of error-free information per unit time that can be transmitted over a particular bandwidth in the presence of noise. Equation (1) below shows one representation of the Shannon-Hartley theorem.

$$C = B \log_2(1+\text{SNR}) \quad (1)$$

In Equation (1), C represents the channel capacity in bits per second, B represents the bandwidth in hertz, and SNR represents the signal-to-noise ratio defined as the ratio of the average received signal power to the average power of the noise and interference. Unfortunately, the channel capacity achievable with LDPC encoding shows a significant gap to the Shannon bound even for high MCSs. Additionally, to be able to use high MCSs, including 1024-QAM and 4096-QAM, high SNR is required, but it may be difficult to obtain the SNRs needed for such high MCSs.

Various implementations relate generally to encoding data for wireless communication to achieve a desired amplitude distribution. Some implementations more specifically relate to performing a first encoding operation on information bits from one or more MPDUs to shape the amplitudes of the resultant symbols such that the amplitudes have a non-uniform distribution. In some implementations of the non-uniform distribution, the probabilities associated with the respective amplitudes generally increase with decreasing amplitude. For example, the non-uniform distribution of the amplitudes of the symbols may be approximately Gaussian. In some implementations, the first encoding operation is or includes an arithmetic encoding operation, a prefix encoding operation or other encoding operation that adds redundancy to the input information bits by expanding the number of information bits. As described above, in particular implementations, the redundancy is added such that the probabilities associated with encoding input data bits into symbols with lower amplitudes are greater than the probabilities associated with encoding input data bits into symbols with higher amplitudes. In some implementations, the first encoding operation is followed by a second encoding operation, for example, an LDPC encoding operation, that also adds redundancy, but which does not alter the information bits themselves.

Particular implementations of the subject matter described in this disclosure can be implemented to realize one or more of the following potential advantages. In some implementations, the described techniques can be used to close the gap between the channel capacity actually attainable by a transmitting device and the theoretical Shannon bound, for example, by encoding the amplitudes such that the resultant amplitude distributions are approximately Gaussian. Some implementations also enable the tracking of MPDU boundaries to facilitate successful decoding by a receiving device. Additionally or alternatively, some implementations enable the determination of a packet length after performing the amplitude shaping, which enables a transmitting device to determine the number of padding bits to add to the payload and to signal the packet length to a receiving device so that the receiving device may determine the duration of the packet.

Figure 6:
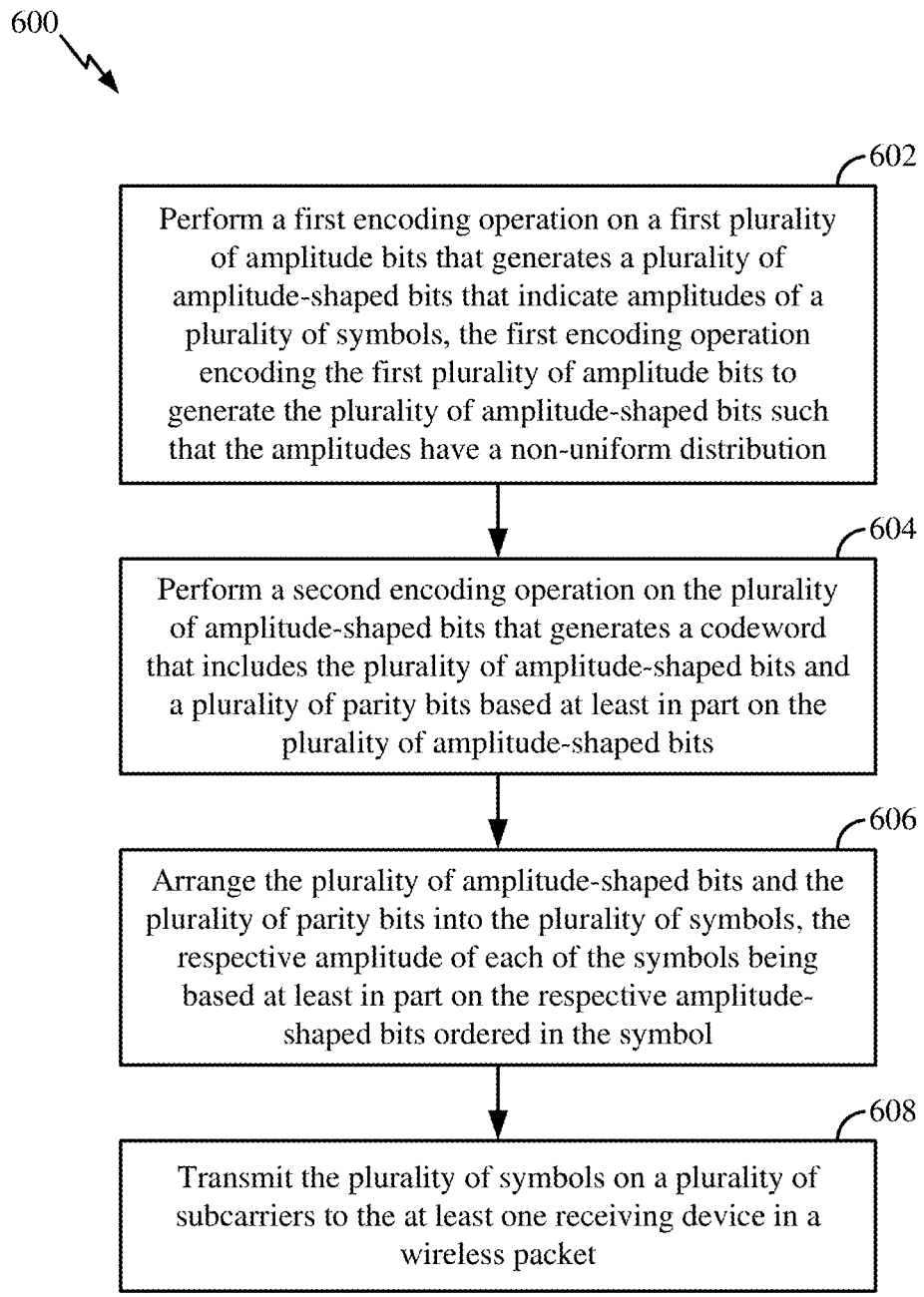
FIG. 6 shows a flowchart illustrating an example process for wireless communication that supports amplitude shaping according to some implementations.

FIG. 6 shows a flowchart illustrating an example process 600 for wireless communication that supports amplitude shaping according to some implementations. The operations of the process 600 may be implemented by a transmitting device or its components as described herein. For example, the process 600 may be performed by a wireless communication device such as the wireless communication device 400 described with reference to FIG. 4. In some implementations, the process 600 may be performed by a wireless communication device operating as or within an AP, such as one of the APs 102 and 502 described with reference to FIGS. 1 and 5A, respectively. In some other implementations, the process 600 may be performed by a wireless communication device operating as or within a STA, such as one of the STAs 104 and 504 described with reference to FIGS. 1 and 5B, respectively.

In block 602, the wireless communication device performs a first encoding operation on a plurality of amplitude bits that generates a plurality of amplitude-shaped bits that indicate amplitudes of a plurality of symbols. In some implementations, the first encoding operation encodes the plurality of amplitude bits to generate the plurality of amplitude-shaped bits such that the amplitudes have a non-uniform distribution. In block 604, the wireless communication device performs a second encoding operation on the plurality of amplitude-shaped bits that generates a codeword that includes the plurality of amplitude-shaped bits and a plurality of parity bits based at least in part on the plurality of amplitude-shaped bits. In block 606, the wireless communication device arranges the plurality of amplitude-shaped bits and the plurality of parity bits into the plurality of symbols, the respective amplitude of each of the symbols being based at least in part on the respective amplitude-shaped bits ordered in the symbol. In block 608, the wireless communication device transmits the plurality of symbols on a plurality of subcarriers to at least one receiving device in a wireless packet.

In some implementations, the performance of the first encoding operation (also referred to herein as an "amplitude-shaping encoding operation" or simply an "amplitude shaping operation") in block 602 encodes the plurality of amplitude bits to generate the plurality of amplitude-shaped bits such that the non-uniform distribution of the amplitudes of the symbols is a distribution in which the probabilities associated with the respective amplitudes generally increase with decreasing amplitude. For example, the non-uniform distribution may be approximately Gaussian centered around the center point (0,0) of the modulation constellation. As described above, such amplitude shaping may be used to increase the SNR and the channel capacity enabling greater throughput.

In some implementations, prior to performing the first encoding operation in block 602, a MAC layer of the wireless communication device generates an A-MPDU that includes a plurality of MPDUs. Each MPDU includes a plurality of data bits including a plurality of information bits (also referred to as "payload bits") as well as a plurality of control bits or a plurality of signaling bits (for example, MAC signaling bits). The first encoding operation may be performed in block 602 on all or a subset of the data bits in the MPDUs. For example, the information bits in each MPDU may be, or may include, a plurality of bits (amplitude bits) to be used for determining the amplitudes of the symbols. In some implementations, the first encoding operation may be performed in block 602 on only the amplitude bits. Additionally, in some implementations, to reduce complexity or because of the effective resultant coding rate, it may be sufficient or advantageous to perform the first encoding operation in block 602 on, for example, only the most significant bits (MSB s) of the amplitude bits (for example, if four bits are normally used to encode an amplitude component of a symbol, the number of MSBs may be three for each symbol). In such implementations, the first encoding operation is not performed on the remaining least significant bits (LSBs) of the amplitude bits.

Based on an MCS selected for transmission, the PHY layer may package the data bits in the MPDUs (either before or after performing the first encoding operation in block 602) into code blocks to be transmitted using M symbols. Each of the M symbols ultimately includes a set of n amplitude bits indicating at least one amplitude of the symbol. In some implementations, a first n/2 bits of the set of n amplitude bits for each symbol may indicate a first amplitude component of the amplitude of the symbol along a real axis of the modulation constellation, and a second n/2 bits of the set of n amplitude bits for each symbol of the M symbols may indicate a second amplitude component of the amplitude of the symbol along an imaginary axis of the modulation constellation. As such, there may be $2^{n/2}$ possible first amplitude levels for the first (real) amplitude component of each symbol, and $2^{n/2}$ possible second amplitude levels for the second (imaginary) amplitude component of each symbol.

Each of the M symbols may further include a sign bit for each of the amplitude components that indicates the sign of the respective amplitude. For example, when using QAM, a first sign bit of a pair of sign bits for each QAM symbol may indicate whether the respective first amplitude component along the real axis (the in-phase (i) component) is positive or negative, and the second sign bit of the pair of sign bits may indicate whether the respective second amplitude component along the imaginary axis (the quadrature (q) component) is positive or negative. As such, the first and the second amplitude components combine to provide the overall amplitude of the respective QAM symbol, and the first and the second sign bits combine to indicate the quadrant of the modulation constellation the overall amplitude lies in. For example, when using 1024-QAM, each symbol may include ten encoded bits in which a first four of the bits indicate the first (real) amplitude, another four of the bits indicate the second (imaginary) amplitude, another one of the bits indicates the sign (positive or negative) of the first amplitude, and another one of the bits indicates the sign (positive or negative) of the second amplitude.

Figure 7A:
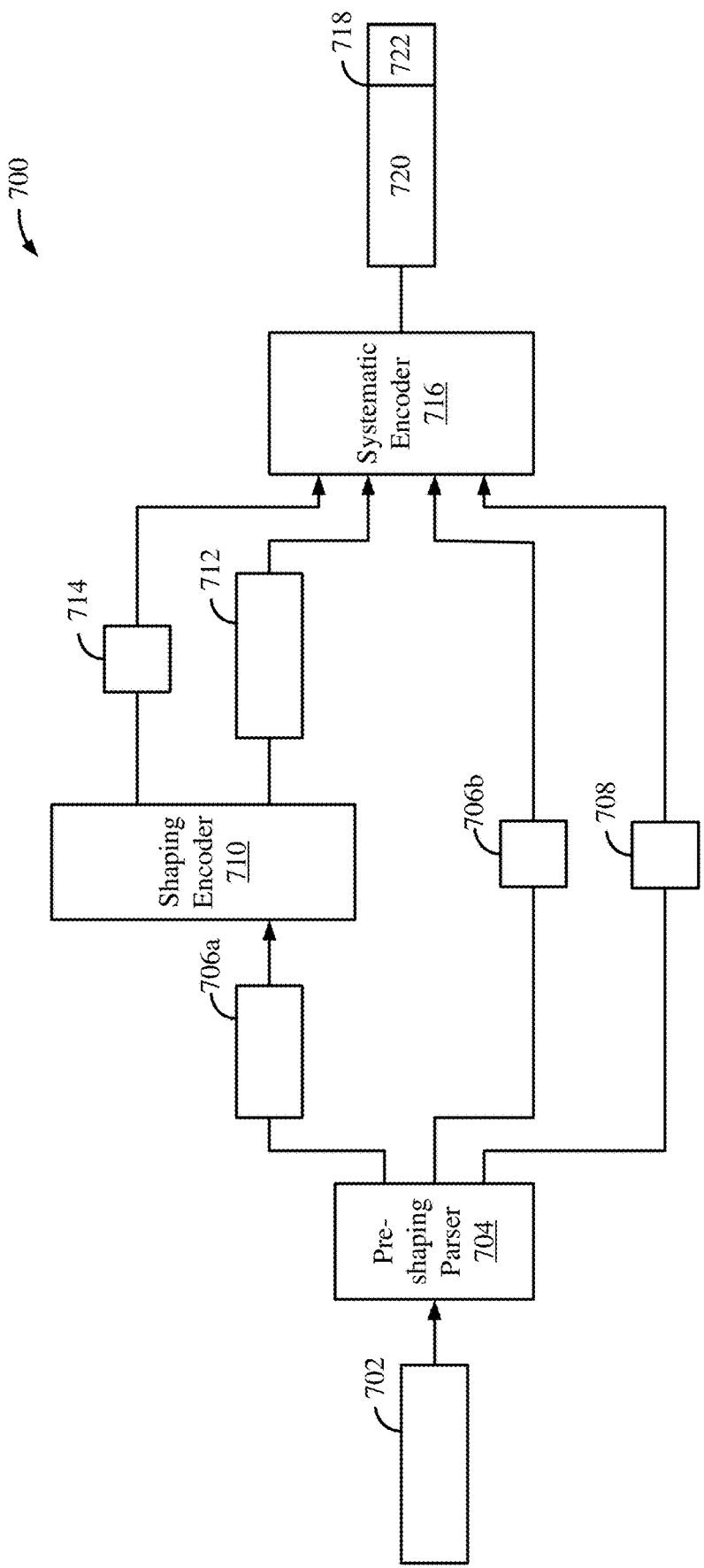
FIGS. 7A and 7B show a diagram of a flow that supports amplitude shaping according to some implementations.
Figure 7B:
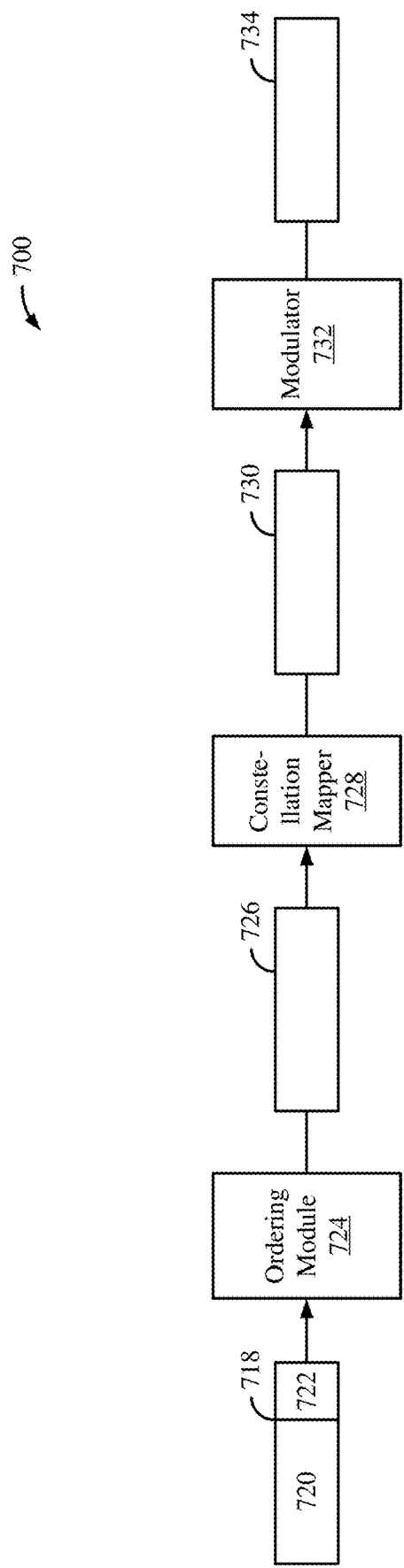

FIGS. 7A and 7B show a diagram of a flow 700 that supports amplitude shaping according to some implementations. For example, the flow 700 may illustrate aspects of the process 600. In the illustrated example, an information block 702 is provided to a pre-shaping parser 704 to obtain the plurality of amplitude bits on which a shaping encoder 710 will perform the first encoding operation in block 602. For example, the pre-shaping parser 704 may separate or divide amplitude bits 706 from sign bits 708 in the information block 702. In some implementations, the parser also separates or divides the amplitude bits into MSBs 706a and LSBs 706b. In some implementations, the plurality of amplitude bits provided to the shaping encoder 710 includes only the MSBs 706a of the amplitude bits 706. In some other implementations, the plurality of amplitude bits may include all of the amplitude bits 706. In the illustrated example, the shaping encoder 710 performs the first encoding operation on the MSBs 706a in block 602 to generate amplitude-shaped bits 712.

In some implementations, to perform the first encoding operation in block 602, and in particular, to obtain the set of n amplitude bits (eight in the 1024-QAM example) that indicate the first and the second amplitude components, the pre-shaping parser 704 (or the shaping encoder 710 itself) may further parse the plurality of amplitude bits (for example, the MSBs 706a) into a first stream of amplitude bits that will define the first amplitude components for the symbols when coded, and a second stream of amplitude bits that will define the second amplitude components for the symbols when coded. For example, in some implementations, a QAM flow is implemented via two independent pulse amplitude modulation (PAM) flows. In some such implementations, the shaping encoder 710 may perform the first encoding operation on the first stream of amplitude bits to provide a first PAM symbol stream in parallel with independently performing the first encoding operation on the second stream of amplitude bits to provide a second PAM symbol stream (which may ultimately be combined with the first PAM symbol stream to obtain a QAM symbol stream).

In some implementations, the performance of the first encoding operation in block 602 adds redundancy to the plurality of amplitude bits (the MSBs 706a in the example of FIGS. 7A and 7B) to generate the amplitude-shaped bits 712 such that the amplitude-shaped bits 712 include more bits than the plurality of amplitude bits input to the shaping encoder 710. By adding redundancy, the shaping encoder 710 may encode the MSBs 706a to generate the amplitude-shaped bits 712 such that the amplitudes of the associated symbols have a non-uniform distribution, and specifically, a distribution in which the probabilities associated with the respective amplitudes generally increase with decreasing amplitude, such as a Gaussian distribution.

In some implementations, the first encoding operation performed in block 602 is or includes an arithmetic encoding operation. In some such implementations, the performance of the arithmetic encoding operation in block 602 includes defining a first distribution of M first (real) amplitudes into $2^{b/2}$ bins, each bin being associated with a respective one of $2^{b/2}$ possible amplitude levels and having an associated size (for example, the size being equal to the number of instances of an amplitude of the respective amplitude level in the bin). Similarly, the performance of the arithmetic encoding operation also includes defining a second distribution of M second (imaginary) amplitudes into $2^{b/2}$ bins, each bin being associated with a respective one of $2^{b/2}$ possible amplitude levels and having an associated size (for example, the size being equal to the number of instances of an amplitude of the respective amplitude level in the bin). In such implementations, b equals n if the plurality of amplitude bits provided to the shaping encoder 706 includes all of the amplitude bits in the code block. However, if the plurality of amplitude bits comprises less than all of the data bits in the code block, for example, only the MSBs 706a of the amplitude bits 706, b may equal the number of MSBs of the n bits for each symbol (for example, for 1024-QAM, b may be equal to six when n is equal to eight such that three of the four amplitude bits for the real amplitude component are selected for the first encoding operation, and such that three of the four amplitude bits for the imaginary amplitude component are selected for the first encoding operation).

In some implementations, to achieve a non-uniform distribution of amplitudes, the sizes of the bins in the first distribution are initially not uniform, and the sizes of the bins in the second distribution are initially not uniform. To achieve a non-uniform distribution in which the probabilities associated with the respective amplitudes generally increase with decreasing amplitude, a size of at least a lowest bin of the bins in each of the first and the second distributions is configured to be greater than a size of at least a highest bin of the bins in the respective one of the first and the second distributions. However, as will be described below, during the arithmetic encoding operation performed in block 602, the sizes of the bins may dynamically change as amplitudes are selected from the bins.

FIGS. 8A-8D show an example distribution 800 of amplitude values that supports amplitude shaping according to some implementations. For example, the distribution 800 can be an example of each of the first distribution of amplitudes for the real axis and the second distribution of amplitudes for the imaginary axis used when performing the arithmetic coding operation in block 602. In FIGS. 8A-8D, the distribution 800 includes M amplitude instances arranged in four bins 802, 804, 806 and 808. In other words, the lowest bin 802 includes a number of selectable amplitudes all having a first, lowest amplitude level, the second-lowest bin 804 includes a number of selectable amplitudes all having a second amplitude level, the second-highest bin 806 includes a number of selectable amplitudes all having a third amplitude level, and the highest bin 808 includes a number of selectable amplitudes all having a fourth, highest amplitude level.

As described above, the probabilities associated with the respective amplitude values generally decrease with increasing amplitude. To achieve this, a size of at least the lowest bin 802 is greater than a size of at least the highest bin 808. In the illustrated example, the probabilities associated with each of the amplitude levels are different because the sizes of the associated bins 802, 804, 806 and 808 are different. Indeed, in the example shown, the second-lowest bin 804 is smaller than the lowest bin 802, the second-highest bin 806 is smaller than the second-lowest bin 804, and the highest bin 808 is smaller than the second-highest bin 806. For further illustration, if 100 symbols are to be encoded by the first encoding operation in block 602 (that is, M equals 100), then the first bin may have, for example, 50 amplitude instances having the first amplitude level, the second bin may have, for example, 25 amplitude instances of the second amplitude level, the third bin may have, for example, 15 amplitude instances of the third amplitude level, and the fourth bin may have, for example, 10 amplitude instances of the fourth amplitude level. Because the size of each of the bins is defined by the respective number of amplitude instances of the respective amplitude level that may be selected from the bin, the probabilities associated with the respective amplitude levels decrease with increasing amplitude.

Referring back to the process 600 and the flow 700 described with reference to FIGS. 6 and 7, respectively, the performance of the arithmetic encoding operation in block 602 includes, for each symbol of the M symbols, selecting, for the first amplitude component, a first (real) amplitude from one of the bins in the first distribution and selecting, for the second amplitude component, a second (imaginary) amplitude from one of the bins in the second distribution. For example, during the arithmetic encoding operation in block 602, the shaping encoder 710 may select, from the first distribution (and thus for the real amplitude component), either an upper half or a lower half of the distribution based on a value of a first bit of the first stream of amplitude bits. Similarly, the shaping encoder 710 may select, from the second distribution (and thus for the imaginary amplitude component), either an upper half or a lower half of the distribution based on a value of a first bit of the second stream of amplitude bits. For example, moving to FIG. 8B, the shaping encoder 710 may select the upper half UH of the distribution 800 if a first bit of the amplitude bits 706 (for example, the MSB s 706a) has a value of "1" and select the lower half LH if the first bit has a value of "0." In the example shown in FIG. 8B, the first bit has a value of 1 and, as a result, the shaping encoder 710 selects the upper half UH. In this way, each input data bit of a given one of the first and the second streams of amplitude bits defines a binary choice. In other words, the amplitude distribution associated with the respective amplitude component shrinks by a factor of two with each additional input data bit per symbol provided by the respective stream of amplitude bits.

Responsive to selecting the upper half UH or the lower half LH of the respective distribution, the arithmetic encoding operation performed in block 602 may further include determining whether the selected half of the distribution is within a single one of the bins of the respective distribution. Responsive to determining that the selected half is within a single one of the bins, the shaping encoder 710 may output a set of bits indicating the amplitude level for the respective real or imaginary amplitude component. For example, the shaping encoder 710 may output b/2 amplitude-shaped bits 712 for the respective PAM symbol to indicate the respective amplitude level associated with the single bin (where, again, b is equal to n if the first encoding operation is performed on all of the data bits and where b may be equal to the number of MSBs in other cases). In such case, only one input data bit may be encoded for the respective PAM symbol.

Figure 8A:
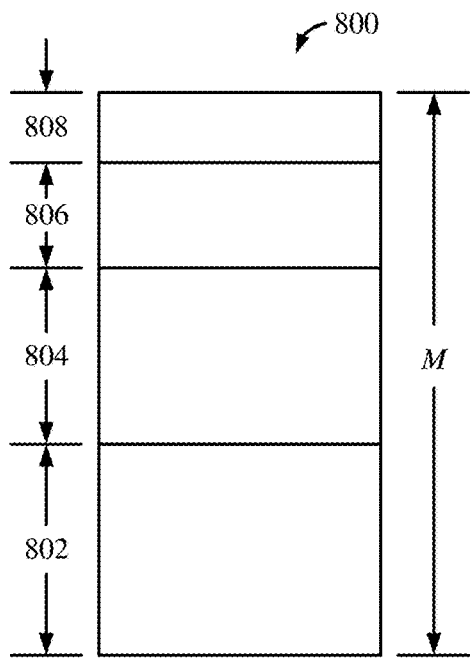
FIGS. 8A-8D show an example distribution of amplitude values that supports amplitude shaping according to some implementations.
Figure 8B:
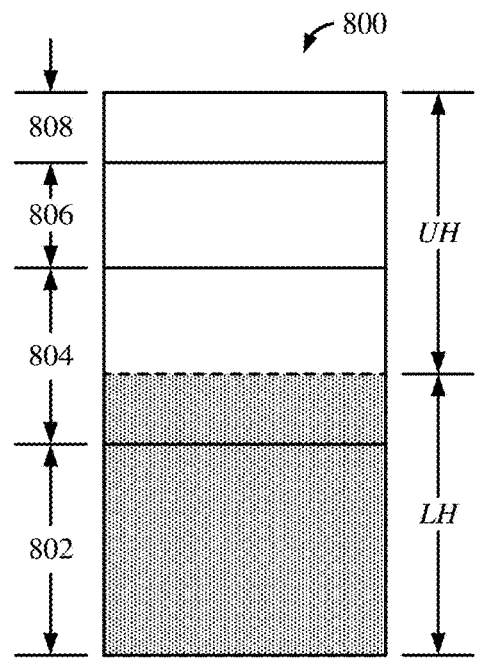

However, responsive to determining that the selected half is not within a single one of the bins, the shaping encoder 710 determines the value of a next bit of the respective stream of amplitude bits to be encoded. Because only one amplitude can be selected from each of the first and the second distributions for each symbol, the shaping encoder 710 may need to determine the value of at least one subsequent bit of the respective stream of amplitude bits to be encoded before an amplitude selection may be made from the respective distribution. For example, as FIG. 8B illustrates, although the number of possible amplitudes was reduced to those in the upper half UH of the distribution 800 based on the value of the first bit, the amplitude may still be selected from any of the bins 804, 806 and 808. Only the lowest bin 802 is excluded from the possible amplitudes that may be selected because it is located entirely within the lower half LH of the distribution 800. As such, the shaping encoder 710 needs more information (at least one next data bit in the respective stream) in order to select an amplitude and thereby encode the respective input data bits.

For example, responsive to determining that the selected half is not within a single one of the bins, the shaping encoder 710 may then select either an upper quarter UQ (the upper half of the selected half) or a lower quarter LQ (the lower half of the selected half) based on a value of a second bit of the respective stream of amplitude bits. Responsive to selecting the upper quarter UQ or the lower half LQ of the respective distribution, the arithmetic encoding operation performed in block 602 may further include determining whether the selected resultant quarter of the distribution is within a single one of the bins of the respective distribution. Responsive to determining that the selected quarter is within a single one of the bins, the shaping encoder 710 may output a set of bits indicating the amplitude level for the respective real or imaginary component. For example, the shaping encoder 710 may output b/2 amplitude-shaped bits 712 for the respective PAM symbol to indicate the respective amplitude level associated with the single bin. In such case, two input data bits would be encoded for the respective PAM symbol.

Figure 8C:
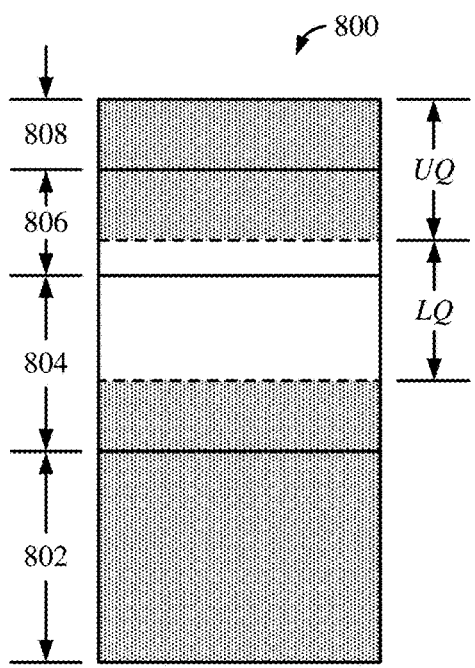

On the other hand, responsive to determining that the selected quarter is not within a single one of the bins, the shaping encoder 710 determines the value of a next bit of the respective stream of amplitude bits to be encoded before an amplitude selection may be made from the respective distribution. For example, as FIG. 8C illustrates, although the number of possible amplitudes was reduced to those in the lower quarter LQ of the distribution 800 based on the value of the second bit, the amplitude may still be selected from either of the bins 804 and 806. Only the lowest bin 802 and the highest bin 808 are excluded from the possible amplitudes that may be selected. As such, the shaping encoder 710 needs more information (at least one next data bit in the respective stream) in order to select an amplitude and thereby encode the respective input data bits.

Figure 8D:
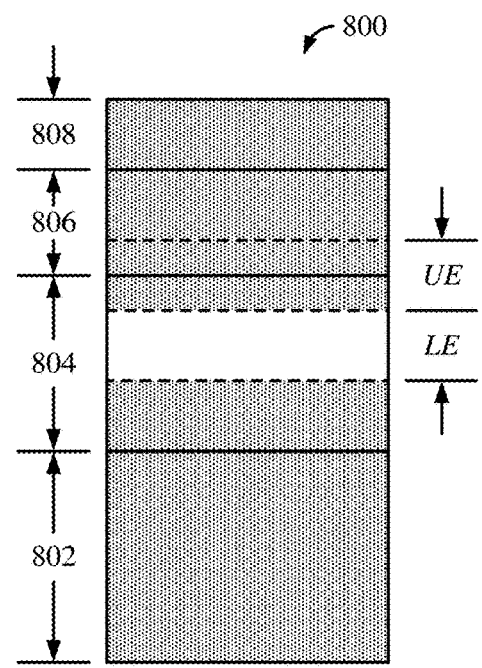

For example, responsive to determining that the selected quarter is not within a single one of the bins, the shaping encoder 710 may then select either an upper eighth UE (the upper half of the selected quarter) or a lower eighth LE (the lower half of the selected quarter) based on a value of a third bit of the respective stream of amplitude bits. Responsive to selecting the upper eighth UE or the lower eighth LE of the respective distribution, the arithmetic encoding operation performed in block 602 may further include determining whether the selected resultant eighth of the distribution is within a single one of the bins of the respective distribution. Responsive to determining that the selected eighth is within a single one of the bins, the shaping encoder 710 may output a set of bits indicating the amplitude level for the respective real or imaginary component. For example, the shaping encoder 710 may output b/2 amplitude-shaped bits 712 for the respective PAM symbol to indicate the respective amplitude level associated with the single bin. For example, as FIG. 8D illustrates, the number of possible amplitudes is reduced to those in the lower eighth LE of the distribution 800 based on the value of the third bit. Because the lower eighth LE lies within only a single bin 804, the shaping encoder 710 selects the amplitude from the bin 804. In such case, three input data bits are encoded for the respective PAM symbol. This process may continue as long as an additional bit is needed to select one of the bins to converge to a single amplitude.

In some implementations, to ensure that each of the amplitudes in the respective distribution is selected once and only once, when an amplitude is encoded, the shaping encoder 710 removes the respective instance of the amplitude from the respective bin thereby decreasing the respective bin size (in other words, the shaping encoder 710 practices drawing without replacement). In this way, the relative probabilities of selecting an amplitude from each of the bins changes after an amplitude has been selected from a bin. In some such implementations, all of the M amplitudes may be produced once and only once because the size of each of the bins at the end of the arithmetic encoding operation in block 602 is zero (because all of the bins have been emptied through selection). In this way, a fixed number of amplitude-shaped bits 712, and a fixed number M of output symbols, may always result from the arithmetic encoding operation in block 602.

As described above, the number of amplitude bits actually required to encode the M amplitudes needed for the M symbols may vary based on the particular values of the amplitude bits. For example, in some instances, based on the values of the amplitude bits, it may be possible that there are no more bits in the plurality of amplitude bits left in the code block but that there are still amplitude instances remaining in one or more of the bins. In some such implementations, the shaping encoder 710 may add zero padding bits to the input information block or code block 702 to obtain enough bits to encode to obtain the M symbols in the first encoding operation in block 602.

In some other implementations, the aggregate size of all of the bins within each distribution at the start of the arithmetic encoding operation in block 602 may be greater than M. In this way, the efficiency of the arithmetic encoding operation may be increased because there are more possible amplitudes that may be selected and more bits may be encoded for the same number of amplitudes.

In some implementations, performing the arithmetic encoding operation in block 602 further comprises measuring or monitoring the aggregate power of the resultant symbols during the arithmetic encoding operation and dynamically adjusting the size of one or more of the bins (and as a consequence modifying the relative probabilities associated with the amplitude levels) in one or both of the first and the second distributions based on the aggregate power. For example, a power metric for the aggregate power may be obtained by tracking the selected amplitudes or the sum of the squares of the selected amplitudes. For example, if the shaping encoder 710 receives an indication, or otherwise determines, that the aggregate power is above a first threshold value, the shaping encoder 710 may reduce the sizes of one or more of the highest amplitude level bins. This will reduce the number of high amplitude level symbols, and as a result, reduce the aggregate power. On the other hand, if the shaping encoder 710 determines that the aggregate power is below a second threshold value (which may be the same as or different than the first threshold value), the shaping encoder 710 may increases the sizes of one or more of the high amplitude level bins. This will increase the number of high amplitude level symbols, and as such, more bits may be encoded into the larger amplitude symbols, which may increase the efficiency of the arithmetic coding operation.

In some other implementations, the first encoding operation performed in block 602 is or includes a prefix encoding operation. In some such implementations, the performance of the prefix encoding operation in block 602 includes, for each symbol of the M symbols, and for each of the first (real) and second (imaginary) amplitude components, comparing one or more patterns of a set of $2^{b/2}$ patterns of bit values of various lengths to bits of the plurality of amplitude bits input to the shaping encoder 710. Again, in such implementations, b equals n if the plurality of amplitude bits provided to the shaping encoder 706 includes all of the data bits in the code block. However, if the plurality of amplitude bits comprises less than all of the data bits in the code block, for example, only the MSBs 706a of the amplitude bits 706, b may equal the number of MSBs of the n bits for each symbol. Each of the patterns in the set of patterns may be associated with a respective amplitude level of the $2^{b/2}$ possible first (real) amplitude levels or the $2^{b/2}$ possible second (imaginary) amplitude levels. In this way, each of the amplitude levels is associated with a respective probability of occurrence associated with a probability mass function. In some implementations, the set of patterns and associated probability mass function are based on a Huffman algorithm. In some implementations, the probability mass function is dyadic, that is, all probabilities in the probability mass function are a negative power of 2.

For example, the shaping decoder 710 may input bits of the plurality of amplitude bits (for example, the MSBs 706a) into a look-up table (LUT) that includes the set of patterns that implement the probability mass function. In some such implementations, the shaping encoder 710 includes a first LUT for determining the first (real) amplitude components for the first PAM symbol stream based on the first stream of amplitude bits, and a second LUT for determining the second (imaginary) components for the second PAM symbol stream based on the second stream of amplitude bits. The first and the second LUTs may initially be identical in some implementations; however, as described below, the first and the second LUTs may each be independently, dynamically-adjusted or switched-out for a more desirable LUT as the prefix encoding operation progresses in block 602.

FIG. 9 shows an example LUT 900 that supports amplitude shaping according to some implementations. In the illustrated example, the LUT 900 includes eight rows 902a-902h, each row indicating a pattern of bit values corresponding to a respective one of eight amplitude levels associated with a probability mass function. For example, a first row 902a associated with a first (lowest) amplitude level includes a first pattern of bit values 00 associated with a probability of occurrence of 1/4, a second row 902b associated with a second amplitude level includes a second pattern of bit values 01 associated with a probability of occurrence of 1/4, a third row 902c associated with a third amplitude level includes a third pattern of bit values 111 associated with a probability of occurrence of 1/8, a fourth row 902d associated with a fourth amplitude includes a fourth pattern of bit values 100 associated with a probability of occurrence of 1/8, a fifth row 902e associated with a fifth amplitude includes a fifth pattern of bit values 101 associated with a probability of occurrence of 1/8, a sixth row 902f associated with a sixth amplitude level includes a sixth pattern of bit values 1101 associated with a probability of occurrence of 1/16, a seventh row 902g associated with a seventh amplitude level includes a seventh pattern of bit values 11000 associated with a probability of occurrence of 1/32, and an eighth row 902h associated with an eighth (highest) amplitude level includes an eighth pattern of bit values 11001 associated with a probability of occurrence of 1/32.

In some implementations, the performance of the prefix encoding operation in block 602 further includes identifying a match between bits of the plurality of amplitude bits (for example, the MSBs 706a) and one of the patterns. For example, the shaping encoder 710 may compare consecutive bits of the plurality of amplitude bits to the patterns in the LUT 900. Generally, with each additional data bit that is input to the LUT 900 and matched, the number of possible matching patterns decreases until only one of the patterns is remaining, which is then selected by the shaping encoder 710. In other words, the shaping encoder 710 may, in block 602, compare numbers of next consecutive input bits of the respective stream of amplitude bits with one, some or all of the respective patterns in the LUT 900. For example, the shaping encoder 710 may compare the first two bits with one or both of the patterns in the rows 902a and 902b, the first three bits with one, two or all of the patterns in the rows 902c, 902d and 902e, the first four bits with the pattern in the row 902f, or the first five bits with one or both of the patterns in the rows 902g and 902h. Responsive to finding a match, the shaping encoder 710 may output a set of b/2 amplitude-shaped bits 712 for the respective PAM symbol indicating the amplitude level associated with the respective pattern. In some implementations, the shaping encoder 710 may generally output an average number of amplitude-shaped bits 712 per PAM symbol as defined in Equation (2) below.

$$\# \text{ of bits} = \sum_k -p_k \log_2 p_k$$

In Equation (2), $p_k$ is the probability associated with a respective number k of input data bits. For example, based on the probability mass function associated with the LUT 900, the number of amplitude-shaped bits 712 output per PAM symbol would be 2.6875 bits; that is, the effective coding rate to encode eight different amplitude levels would be reduced from the 3 typically required down to 2.6875 as a result of the amplitude shaping.

In some implementations, unlike arithmetic encoding operations in general, the performance of a prefix encoding operation can be parallelized. Such parallelization may enable the use of a lower clock rate or achieve a high data rate, among other advantages. For example, in some implementations, the pre-shaping parser 704 or the shaping encoder 710 itself may separate or divide the plurality of amplitude bits into separate streams of amplitude bits (for example, in a round robin fashion) and perform an independent prefix encoding operation on each of the streams of amplitude bits in parallel. In some such implementations, continuing the example above, the pre-shaping parser 704 may further divide the first stream of amplitude bits for the first PAM symbol stream into m parallel data streams. Similarly, the pre-shaping parser 704 may further divide the second stream of amplitude bits for the second PAM symbol stream into m parallel data streams. The shaping encoder 710 may include 2m prefix encoders to encode the 2m streams in parallel. However, depending on the values of the particular amplitude bits, each prefix encoder may have 0 to K−1 leftover bits from its respective stream (where K is the size in bits of the largest pattern in the respective LUT). In some implementations, to encode the leftover bits, the shaping encoder 710 identifies the leftover bits from each of the m prefix encoding operations for each amplitude component, concatenates the leftover bits, and adds padding bits to the concatenated leftover bits (if necessary to fully encode a symbol) such that all of the leftover bits from each of the first and the second streams of amplitude bits are encoded into respective PAM symbols.

As described above, after performing the first encoding operation on the plurality of amplitude bits (for example, the MSBs 706a) in block 602 to generate the amplitude-shaped bits 712, a second encoding operation may then be performed on the amplitude-shaped bits 712 in block 604. For example, a second encoder 716 may receive a code block that includes the amplitude-shaped bits 712, and perform the second encoding operation in block 604 in the code block to generate a codeword 718 that includes a second plurality of coded data bits 720. In the illustrated example, the second encoder 716 performs the second encoding operation in block 604 on the amplitude-shaped bits 712 (based on the MSBs 706a) as well as on the LSBs 706b and the sign bits 708. Additionally, in implementations in which the shaping encoder generates signaling bits 714, such signaling bits may also be input to the second encoder 716 and encoded in the second encoding operation in block 604.

In some implementations, the second encoder 716 is a systematic encoder that performs a systematic encoding operation in block 604 such that the bits output from the second encoder 716 match those input to the second encoder. For example, in some such implementations, the second encoding operation performed is or includes a low-density parity check (LDPC) encoding operation (and as such, the second encoder 716 may hereinafter be referred to as the "LDPC encoder 716"). As such, the resultant second plurality of coded data bits 720 may include the amplitude-shaped bits 712, the LSBs 706b, the sign bits 708 and the signaling bits 714.

The performance of the LDPC encoding operation in block 604 adds redundancy to the data, for example, by generating a plurality of parity bits 722 based on the amplitude-shaped bits 712, the LSBs 706b, the sign bits 708 and the signaling bits 714. The parity bits 722 add redundancy to the data, for example, for forward error correction purposes, without changing the data. As such, for each code block input to the LDPC encoder 716, the resultant codeword 718 includes a systematic portion that contains the amplitude-shaped bits 712, the LSBs 706b, the sign bits 708 and the signaling bits 714 (collectively the second plurality of coded data bits 720), and a parity portion that contains the parity bits 722.

Upon performing the second encoding operation in block 604 to generate the codeword 718, the wireless communication device, in block 606, orders (or "arranges") the bits of the second plurality of coded data bits 720 and the plurality of parity bits 722 into M (for example, QAM) symbols 726 such that each symbol includes a set of n bits indicating an amplitude in the modulation constellation. For example, as shown in FIG. 7B, an ordering (or "reordering") module 724 may receive the codeword 718 and arrange bits from the amplitude-shaped bits 712, the LSBs 706b, the sign bits 708 and the parity bits 722 into the M symbols 726. In some such implementations, the ordering module 724 receives the amplitude-shaped bits 712, the LSBs 706b, the sign bits 708 and the parity bits 722 associated with both of the first and the second PAM symbol streams and reorders them into a single QAM symbol stream. In one 1024-QAM example in which each symbol 726 includes ten bits including n=8 amplitude bits of which b=6 are the MSBs, the ordering module 724 may take from the codeword 718, for each of the symbols 726, a set of three amplitude bits from the amplitude-shaped bits 712 encoded from the first stream of amplitude bits as well as an amplitude bit from the LSBs 706b associated with the first stream of amplitude bits in order to obtain the first (real) amplitude component. Similarly, the ordering module 724 may take from the codeword 718, for each of the symbols 726, a set of three amplitude bits from the amplitude-shaped bits 712 encoded from the second stream of amplitude bits as well as an amplitude bit from the LSBs 706b associated with the second stream of amplitude bits in order to obtain the second (imaginary) amplitude component.

As described above, each of the symbols 726 may further include a pair of sign bits indicating one of the four quadrants in the modulation constellation in which the amplitude is located. In some implementations, the ordering module 724 may attempt to take all of the sign bits needed for the symbols 726 from the parity bits 722. As described above, because the sign bits do not impact the power, it may be generally satisfactory to perform the amplitude shaping operation on only the amplitude bits 706, and in some implementations, only the MSBs 706a. For example, based on the selected MCS, the shaping encoder 710 is aware, on a code-block basis, how many parity bits will be generated by the LDPC encoder 716. As such, the shaping encoder 710 will know if some data bits will need to be used for sign bits in advance of the first encoding operation. For example, depending on the LDPC coding rate and QAM constellation size, it may be possible that all of the parity bits 722, as well as some unshaped data bits (for example, the sign bits 708), are used as sign bits in the symbols 726. This may be desirable because it means that the amplitudes of all of the M symbols 726 can be shaped. If dedicated sign bits 708 are necessary, they may be parsed from the rest of the code block prior to the first encoding operation and passed directly to the LDPC encoder 716 as described above. Alternatively, it may be possible that some parity bits 722 must be used as amplitude bits for the symbols 726 because the number of parity bits 722 is greater than the number of sign bits needed for the symbols 726. In such instances, the shaping encoder 710 may not be capable of performing the first encoding operation on, and thereby amplitude shaping, all amplitude components for all of the symbols 726 in block 602. As such, the achievable SNR gain may be reduced.

In block 608, the wireless communication device transmits the M symbols 726 on a plurality of subcarriers to the receiving device in a wireless packet. In some implementations, to transmit each of the symbols 726 in block 610, a constellation mapper (for example, a QAM mapper) 728 maps each of the symbols 726 to a point in a (for example, QAM) modulation constellation to obtain, for example, complex number representations 730 indicating the amplitudes and phases of the symbols 726. In some implementations, the constellation mapper 728 includes a plurality of constellation mappers, one for each of a plurality of streams of the symbols 726.

In some implementations, the ordering module 724 also may include a spatial stream parser that parses the symbols 726 into a plurality of spatial streams. In some such implementations, the spatial stream parser parses the amplitude-shaped bits 712, the LSBs 706b, the sign bits 708 and the parity bits 722 separately for each of the spatial streams to ensure that the bits are properly arranged into the symbols in the different spatial streams. In some implementations, the ordering module 724 additionally includes a plurality of bandwidth segment parsers that parse the symbols 726 from the spatial streams into different bandwidth segments (for example, different 80 MHz subchannels of a 160 MHz or 320 MHz bonded channel). After spatial stream parsing and bandwidth segment parsing (if performed), each of the different streams of parsed symbols 726 may be provided to a respective one of the constellation mappers that maps the symbols to points in the modulation constellation to obtain a respective stream of complex number representations 730.

A modulator 732 may then modulate the subcarriers of the bandwidth segments of the wireless channel based on the amplitudes and phases indicated by the complex number representations 730 to generate modulated symbols 734, which are then transmitted to the receiving device via coupled transmit chains and antennas. For example, continuing the example presented above, after the constellation mapping, the streams of complex number representations 730 may be provided to respective tone mappers of the modulator 732 that map the complex number representations to respective subcarriers (or "tones") of the wireless channel. In some implementations, the modulator 732 further includes a bandwidth segment deparser that deparses the different bandwidth segment streams to a plurality of spatial streams of symbols. The spatial streams may then be provided to a spatial multiplexer that performs spatial mapping on the symbols. The spatially-mapped streams may then be provided to a transform block that performs, for example, an inverse discrete Fourier transform on the symbols in the respective streams. The resultant symbols may then be provided to an analog and RF block for transmission. In some implementations, to ensure a uniform average transmission power, the analog and RF block may apply a power scaling factor to the modulated symbols 734 in block 608 prior to transmission over the wireless channel based on an amount of amplitude shaping performed in the first encoding operation.

In some implementations, the wireless communication device may generate the wireless packet in the form of a PPDU that includes a PHY layer preamble followed by a PSDU payload that contains the modulated symbols 734. The wireless communication device may transmit, or output for transmission (hereinafter used interchangeably with "transmit"), the wireless packet to the receiving device utilizing any suitable techniques including SU-MIMO, MU-MIMO and OFDMA techniques conforming to one or more of the IEEE 802.11 family of wireless communication protocol standards (such as that defined by the IEEE 802.11-2016 specification or amendments thereof including, but not limited to, 802.11ax and 802.11be). In some implementations, the wireless channel can be a 20 MHz, 40 MHz, 80 MHz, 160 MHz or 320 MHz channel including one or more contiguous or non-contiguous portions.

In some implementations, the wireless communication device may, in the same wireless packet that includes the modulated symbols 734, also transmit an indication of the first encoding operation to the receiving device in block 608. For example, the wireless communication device may transmit the indication in a preamble of the wireless packet such as in a signaling field (for example, in an EHT-SIG field such as an EHT-SIG-A field or an EHT-SIG-C field). In some such implementations, the wireless communication device may transmit an MCS field (which may be in an EHT-SIG-A field) in the preamble of the packet that indicates a coding rate (for example, an LDPC coding rate) used in performing the second encoding operation in block 604, a modulation (for example, QAM) constellation size, and one or more indications of the first encoding operation. In some other implementations, the one or more indications of the first encoding operation may be transmitted in a second signaling field separate from the MCS field (for example, in another subfield within EHT-SIG-A or EHT-SIG-C). In some implementations, the MCS field or the second signaling field also includes an indication of the power scaling factor applied to the modulated symbols in block 608. In some implementations, the MCS field or the second signaling field may further indicate a size of the code block (or indications of the sizes and numbers of code blocks for a group of code blocks) input to the shaping encoder 710 on which the first encoding operation was performed in block 602. In some other implementations, one or both of the power scaling factor and the code block size may be signaled implicitly.

To indicate the first encoding operation, the MCS field or the second signaling field may include a first bit indicating whether the first encoding operation was performed and one or more second bits indicating one or more amplitude shaping parameters associated with the first encoding operation that define the non-uniform distribution of the amplitudes. In other words, the amplitude shaping parameters may define an amount of shaping or a probabilistic shaping rate associated with the amplitudes. For example, the amplitude shaping parameters may include an indication of the probability mass function associated with the first encoding operation for each MCS. In some specific examples, the amplitude shaping parameter may include information related to the sizes and amplitude levels associated with the bins used in an arithmetic encoding operation, or information related to the LUTs used in a prefix encoding operation. As described above, the MCS field or the second signaling field may also include signaling bits.

Figure 10:
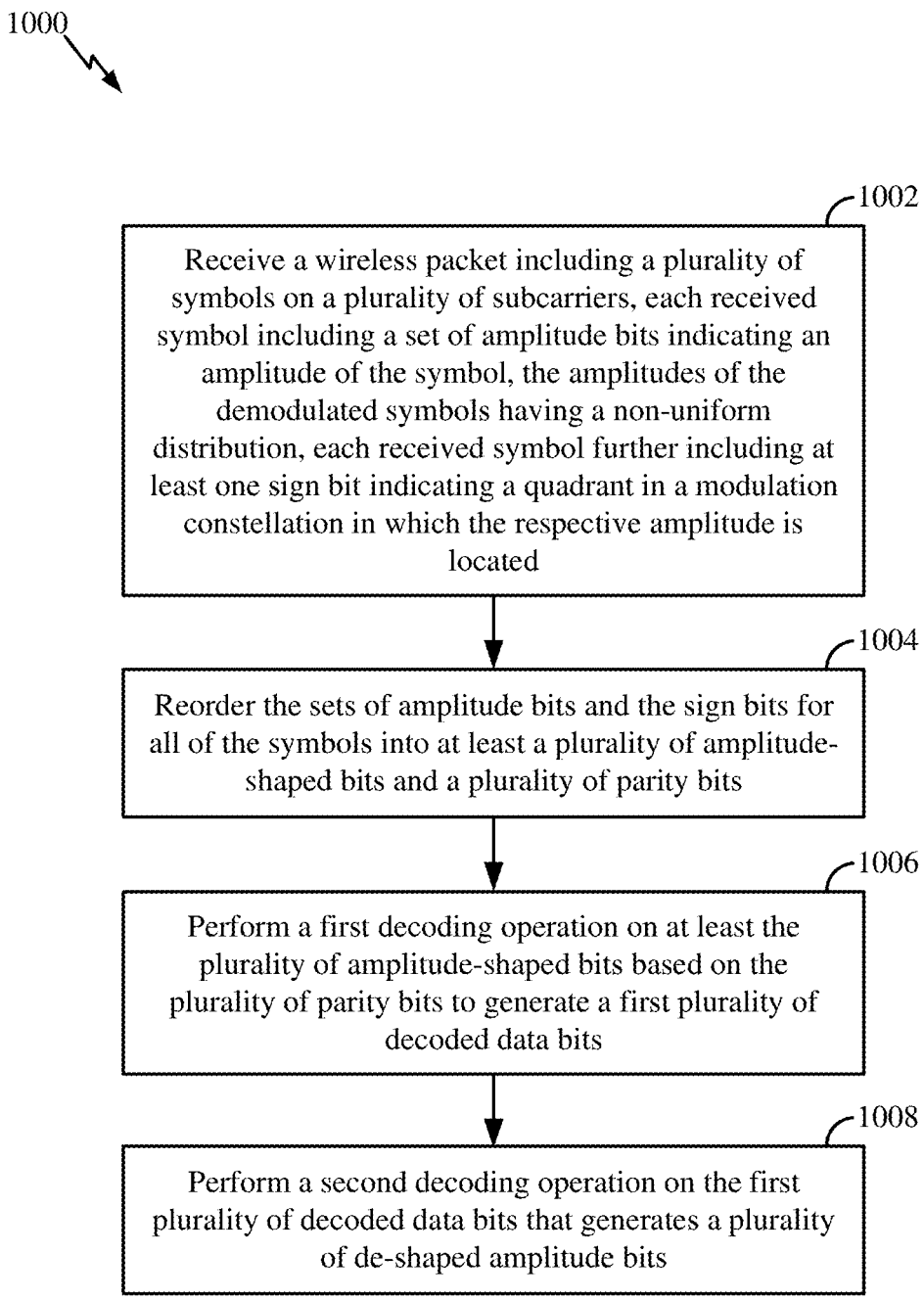
FIG. 10 shows a flowchart illustrating an example process for wireless communication that supports amplitude shaping according to some implementations.

FIG. 10 shows a flowchart illustrating an example process 1000 for wireless communication that supports amplitude shaping according to some implementations. The operations of the process 1000 may be implemented by a receiving device or its components as described herein. For example, the process 1000 may be performed by a wireless communication device such as the wireless communication device 400 described with reference to FIG. 4. In some implementations, the process 1000 may be performed by a wireless communication device operating as or within an AP, such as one of the APs 102 and 502 described with reference to FIGS. 1 and 5A, respectively. In some other implementations, the process 1000 may be performed by a wireless communication device operating as or within a STA, such as one of the STAs 104 and 504 described with reference to FIGS. 1 and 5B, respectively.

In block 1002, the wireless communication device receives a wireless packet including a plurality of modulated symbols on a plurality of subcarriers. Each received symbol includes a set of amplitude bits indicating an amplitude of the symbol. In some implementations, the amplitudes of the demodulated symbols have a non-uniform distribution. Each received symbol further includes at least one sign bit indicating a quadrant in a modulation constellation in which the respective amplitude is located. In block 1004, the wireless communication device reorders the sets of amplitude bits and the sign bits for all of the symbols into at least a plurality of amplitude-shaped bits and a plurality of parity bits. In block 1006, the wireless communication device performs a first decoding operation on at least the plurality of amplitude-shaped bits based on the plurality of parity bits to generate a first plurality of decoded data bits. In block 1008, the wireless communication device performs a second decoding operation on the first plurality of decoded data bits that generates a plurality of de-shaped amplitude bits.

Figure 11A:
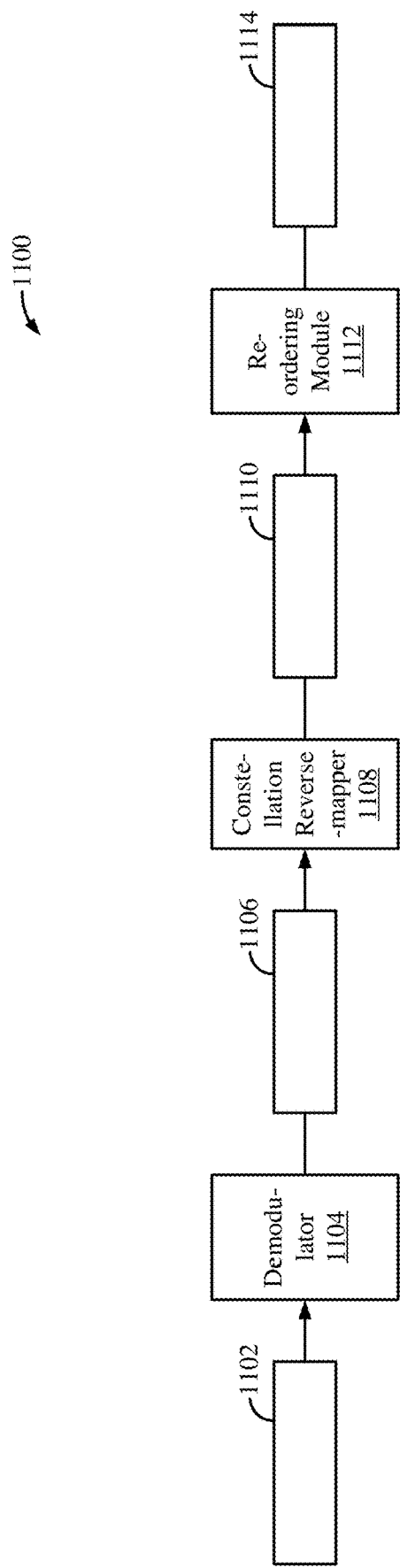
FIGS. 11A and 11B show a diagram of a flow that supports amplitude shaping according to some implementations.
Figure 11B:
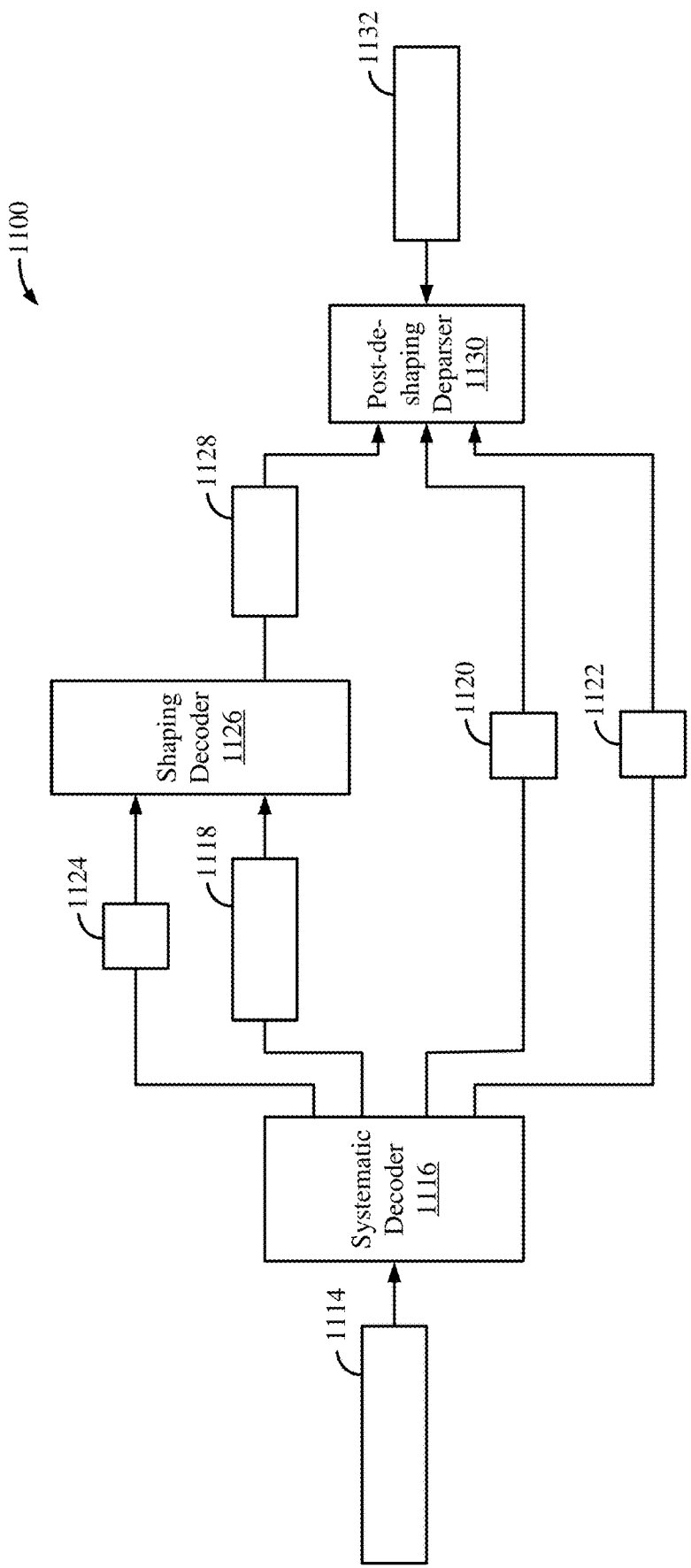

FIGS. 11A and 11B show a diagram of a flow 1100 that supports amplitude shaping according to some implementations. For example, the flow 1100 may illustrate aspects of the process 1000. The process 1000 and flow 1100 are further presented below in relation to the process 600 and flow 700 described with reference to FIGS. 6-9. For example, in some implementations, the wireless communication device receives, in block 1002, the wireless packet 1102 including the plurality of modulated symbols 734 that were transmitted from the transmitting wireless communication device in block 608 of the process 600.

In some implementations, a demodulator 1104 may receive the modulated symbols 734 via coupled antennas and receive chains and demodulate the subcarriers based on the detected amplitudes and phases in block 1002 to generate demodulated symbols in the form of complex number representations 1106 indicating the amplitudes and phases of the symbols, which are, ideally, identical to the complex number representations 730. For example, the demodulator 1104 may include an analog and RF block that receives the wireless packet 1102 and the modulated symbols over a plurality of spatial streams over a plurality of tones in one or more bandwidth segments via one or more coupled antennas. The received symbols may then be provided to a transform block of the demodulator 1104 that performs, for example, a discrete Fourier transform on the symbols in the streams. In some implementations, the demodulator 732 further includes a bandwidth segment parser that parses the different bandwidth segment streams. A tone reverse-mapper of the demodulator 732 may then reverse-map the tones to obtain a plurality of spatial streams for each of the bandwidth segments (if present).

A constellation reverse-mapper (for example, a QAM reverse-mapper) 1108 may then reverse map the complex number representations 1106 from the respective points in the (for example, QAM) modulation constellation to obtain the demodulated symbols 1110. For example, continuing the example presented above, the resultant streams of complex number representations 1106 may be provided to respective constellation de-mappers that provide respective spatial streams of the demodulated symbols 1110. Each of the demodulated symbols 1110 ultimately includes a set of n amplitude bits indicating an amplitude of the symbol. As described above in conjunction with the process 600 and flow 700, a first n/2 bits of the set of n amplitude bits for each demodulated symbol 1110 may indicate a first amplitude component of the amplitude of the symbol along a real axis of the modulation constellation, and a second n/2 bits of the set of n amplitude bits for each demodulated symbol 1110 may indicate a second amplitude component of the amplitude of the symbol along an imaginary axis of the modulation constellation. As such, there are $2^{n/2}$ possible first amplitude levels for the first (real) amplitude component and $2^{n/2}$ possible second amplitude levels for the second (imaginary) amplitude component of each demodulated symbol 1110. As described above, each of the demodulated symbols

1110 may further include a sign bit for each of the amplitude components that indicates the sign of the respective amplitude.

As described above, in block 1004, the wireless communication device reorders the sets of amplitude bits and the sign bits for all of the symbols into at least a plurality of amplitude-shaped bits and a plurality of parity bits. For example, the amplitude-shaped bits may include the MSBs 706a. In some such examples, the sets of amplitude bits may further include a plurality of unshaped bits, for example, including the LSBs 708. In some implementations, the demodulated symbols 1110 may further include a plurality of sign bits or signaling bits. In some implementations, a reordering module 1112 may receive the demodulated symbols 1110 including all of the amplitude bits (including the amplitude-shaped bits and any unshaped bits) and the parity bits and reassemble them into a codeword 1114. For example, continuing the example presented above, the reordering module 1112 may also include a plurality of bandwidth segment deparsers that deparse the symbols 1110 from the respective bandwidth segment streams. In some implementations, the reordering module 1112 also may include a spatial stream deparser that deparses the symbols in the resultant spatial streams into a single stream of bits. As described above, the reordering module 1112 may then reorder the bits from the demodulated symbols into the codeword 1114.

As described above, in block 1006, the wireless communication device performs a first decoding operation on at least the plurality of amplitude-shaped bits based on the plurality of parity bits to generate a first plurality of decoded data bits. For example, as shown in FIG. 11B, a first decoder 1116 may receive the codeword 1114 and perform the first decoding operation on the codeword 1114 in block 1008 to provide at least a first plurality of decoded data bits based on the amplitude-shaped bits. The first decoder 1116 may be a systematic decoder (for example, an LDPC decoder) that attempts to decode the amplitude bits with the aid of the parity bits. As described above, the codeword 1114 may also include unshaped amplitude bits (for example, LSBs or sign bits). As such, based on the decoding of the codeword 1114, the first decoder 1116 may output a decoded code block including decoded amplitude-shaped bits (for example, MSBs) 1118, decoded LSBs 1120, decoded sign bits 1122 and decoded signaling bits 1124.

As described above, the wireless communication device performs a second decoding operation in block 1008 on the amplitude-shaped bits 1118 to generate de-shaped amplitude bits. In some implementations, a shaping decoder 1126 performs the second decoding operation (also referred to herein as the "amplitude de-shaping operation") to remove redundancy from the amplitude-shaped bits 1118 to generate the de-shaped amplitude bits 1128 such that the number (numerical quantity) of de-shaped amplitude bits 1128 is less than the number of amplitude-shaped bits 1118. In some implementations in which the plurality of decoded data bits includes unshaped bits (for examples, LSBs 1120, sign bits 1122 or signaling bits 1124), the second decoding operation is performed on only the amplitude-shaped bits 1118 in block 1008. The amplitude de-shaping operation undoes the corresponding amplitude-shaping operation that was performed at the transmitting device such that the amplitudes associated with the respective symbols are reverted to a substantially uniform distribution.

In some implementations, the second decoding operation performed in block 1008 is or includes an arithmetic decoding operation. For example, the shaping decoder 1126 may perform an arithmetic decoding operation in block 1008 that is essentially the inverse of the arithmetic encoding operation described with reference to block 602 of the process 600. In some other implementations, the second decoding operation performed in block 1008 is or includes a prefix decoding operation. For example, the shaping decoder 1126 may perform a prefix decoding operation in block 1008 that is essentially the inverse of the prefix encoding operation described with reference to block 602 of the process 600. As described above, in some implementations, the performance of the prefix decoding operation can be parallelized.

In the illustrated example, a deparser 1130 reassembles the de-shaped bits (for example, the MSBs) 1128 and any LSBs 1120 or sign bits 1122 into one or more information blocks 1132. The information blocks 1132 may then be processed by the MAC layer of the wireless communication device to decode corresponding MPDUs.

As described above, in some implementations, the wireless communication device may, in the same wireless packet 1102 that includes the modulated symbols, also receive an indication of the second decoding operation from the transmitting device in block 1002. For example, the wireless communication device may receive the indication in a preamble of the wireless packet 1102 such as in a signaling field (for example, in an EHT-SIG field such as an EHT-SIG-A field or an EHT-SIG-C field). As described above, the preamble may include an MCS field (which may be in an EHT-SIG-A field) that indicates a coding rate (for example, an LDPC coding rate needed by the LDPC decoder 1116 to perform the LDPC decoding operation in block 1006), a modulation (for example, QAM) constellation size, and one or more indications of the second decoding operation. In some other implementations, the one or more indications of the second decoding operation may be received in a second signaling field separate from the MCS field (for example, in another subfield within EHT-SIG-A or EHT-SIG-C). For example, the MCS field or the second signaling field may include a first bit indicating whether the first encoding (amplitude shaping) operation was performed by the transmitting device and one or more second bits indicating one or more amplitude shaping parameters associated with the first encoding operation that define the non-uniform distribution of the amplitudes.

As described above, the MCS field or the second signaling field may also include an indication of a power scaling factor applied to the modulated symbols for use by the demodulator 1104 in descaling the modulated symbols. As further described above, the MCS field or the second signaling field may indicate a size of the code block (or indications of the sizes and numbers of code blocks for a group of code blocks) on which the first encoding (amplitude shaping) operation was performed by the transmitting device. In some other implementations, one or both of the power scaling factor and the code block size may be signaled implicitly.

As described with reference to the process 600, the flow 700, the distributions 800, and the LUT 900 described with reference to FIGS. 6, 7A and 7B, 8A-8D, and 9, respectively, the amplitude-shaping encoding operation adds redundancy to the amplitude bits input to the shaping encoder, and specifically, such that the number of amplitude-shaped bits output from the shaping encoder is greater than the number of amplitude bits input to the shaping encoder. Because the amplitude-shaping encoding operation results in the encoding of fewer information bits to obtain the same number of symbols as that which may be achieved conventionally, the amplitude-shaping encoding operation results in a reduction of the effective coding rate of the MPDUs. Because the number of amplitude-shaped bits output from the shaping encoder may be content dependent (it depends on the values of the bits input to the shaping encoder), the effective coding rate of the shaping encoder may be intrinsically variable. Additionally, as described above, the number of amplitude-shaped bits output from the shaping encoder also may vary. For example, unlike some arithmetic encoding operations described herein, when using a prefix encoding operation to perform the amplitude shaping, the number of amplitude-shaped bits output from the shaping encoder may be variable.

Existing versions of the IEEE 802.11 standard allow for peak spectral efficiency (of MCS13) with a coding rate of 5/6. That is, 6 bits of encoded data may be transmitted for every 5 bits of useful information. Some wireless communication devices may achieve peak spectral efficiency through LDPC encoding using a rate 5/6 LDPC code. For example, wireless communication devices operating in accordance with existing versions of the IEEE 802.11 standard may generate LDPC codewords that are 1944 bits in length with a 5/6 coding rate. The LDPC encoding process produces 324 parity bits for every 1620 information bits. Smaller codeword lengths (less than 1944 bits) are also available with existing versions of the IEEE 802.11 standard, however, coding gains are generally higher with longer codeword lengths.

In the present implementations, the spectral efficiency is affected by the coding rate of the systematic encoding operation (such as performed by the systematic encoder 716 of FIG. 7A) as well as the coding rate of the probabilistic amplitude shaping operation (such as performed by the shaping encoder 710 of FIG. 7A). As described above, the probabilistic amplitude shaping operation has an effective coding rate <1. When the amplitude shaping operation is combined with a systematic encoding operation defined by existing IEEE 802.11 standards (such as a rate 5/6 LDPC code), the overall effective coding rate will be less than 5/6.

Aspects of the present disclosure may improve spectral efficiency when performing amplitude shaping by combining the amplitude shaping operation with a systematic encoding operation having a coding rate >5/6. In some implementations, the amplitude shaping operation may be, or include, a prefix encoding having an effective coding rate greater than 0.94 but less than 1. In some aspects, peak spectral efficiency may be achieved (or maintained) by combining an amplitude shaping operation having an effective coding rate of 0.95 with a systematic encoding operation having a coding rate of 7/8. With reference for example to FIG. 7A, the shaping encoder 710 may implement a prefix encoding operation having a 0.95 effective coding rate and the systematic encoder 716 may implement an LDPC encoding operation having a 7/8 effective coding rate. As a result, the flow 700 may achieve an overall coding rate of ~5/6. In other words, the flow 700 may produce 6 codeword bits (of the codeword 718) for every 5 information bits (of the information block 702).

In some implementations, the systematic encoding operation may achieve an effective coding rate of 7/8 using an LDPC code having a native 7/8 coding rate. In other words, a generator matrix implementing the rate 7/8 LDPC code may generate 8 codeword bits for every 7 information bits. For example, the generator matrix may encode an information block containing 1701 information bits into an LDPC codeword of length 1944 (by adding 243 parity bits to the information block). In some prefix encoding implementations configured for 4096 QAM, there may be 32 different sequences or patterns of amplitude bits corresponding to 32 respective amplitudes levels for the in-phase (I) component or the quadrature (Q) component of an associated symbol. Each pattern of amplitude bits may be 5 bits in length. Thus, a codeword of length 1944 can be encoded using 324 PAM amplitudes (1944 codeword bits/(5 amplitude bits+1 sign bit)=324 PAM amplitudes). Since 1701 systematic bits are encoded and transmitted with each LDPC codeword, 1620 of the systematic bits may be used to shape all 324 PAM amplitudes (324 PAM amplitudes*5 amplitude bits/shaped amplitude=1620) and the remaining 81 unshaped systematic bits may be repurposed as sign bits. Assuming the prefix encoding operation has an effective coding rate of 0.95, the overall effective coding rate of the system is (1620*0.95+81)/1944=5/6.

In some other implementations, the systematic encoding operation may achieve an effective coding rate of 7/8 by puncturing one or more codeword bits generated by an LDPC code having a native coding rate <7/8. In some aspects, a higher effective coding rate may be achieved by puncturing one or more bits of an LDPC codeword generated using legacy LDPC codes (such as defined by existing versions of the IEEE 802.11 standard). For example, a rate 7/8 codeword may be derived by puncturing 93 bits of a rate 5/6 codeword of length 1944. Another example is to puncture 96 bits of a rate 5/6 codeword of length 1944, resulting in a coding rate close to 7/8. Puncturing 96 bits may be implemented in cases where it is desirable for the number of punctured bits to be a multiple of the bits in a modulation symbol (for a 4096 QAM, where each QAM symbol carries 12 bits). Yet another example is to puncture 90 bits of a rate 5/6 codeword of length 1944, resulting in 7.5 QAM punctured symbols (for a 4096 QAM). Effectively, 15 QAM symbols are punctured for every two codewords. As described in greater detail with respect to FIG. 12, the punctured bits may include information bits, parity bits, or any combination thereof.

In some other aspects, a higher effective coding rate may be achieved by puncturing one or more bits of an LDPC codeword generated that is optimized for the higher code rate (such as rate 7/8). For example, the new LDPC code may be optimized for encoding a greater number of parity bits for a given codeword length (compared to legacy LDPC codes). In some implementations, the number of parity bits generated using the new LDPC code may cause the resulting codeword to exceed the desired codeword length. For example, the LDPC encoding process may add 405 parity bits to an information block containing 1701 information bits, resulting in codeword of length 2106 (when the desired codeword length is 1944). Thus, one or more bits of the resulting codeword may be punctured to achieve the desired effective coding rate. As described in greater detail with respect to FIG. 12, the punctured bits may include information bits, parity bits, or any combination thereof.

Figure 12:
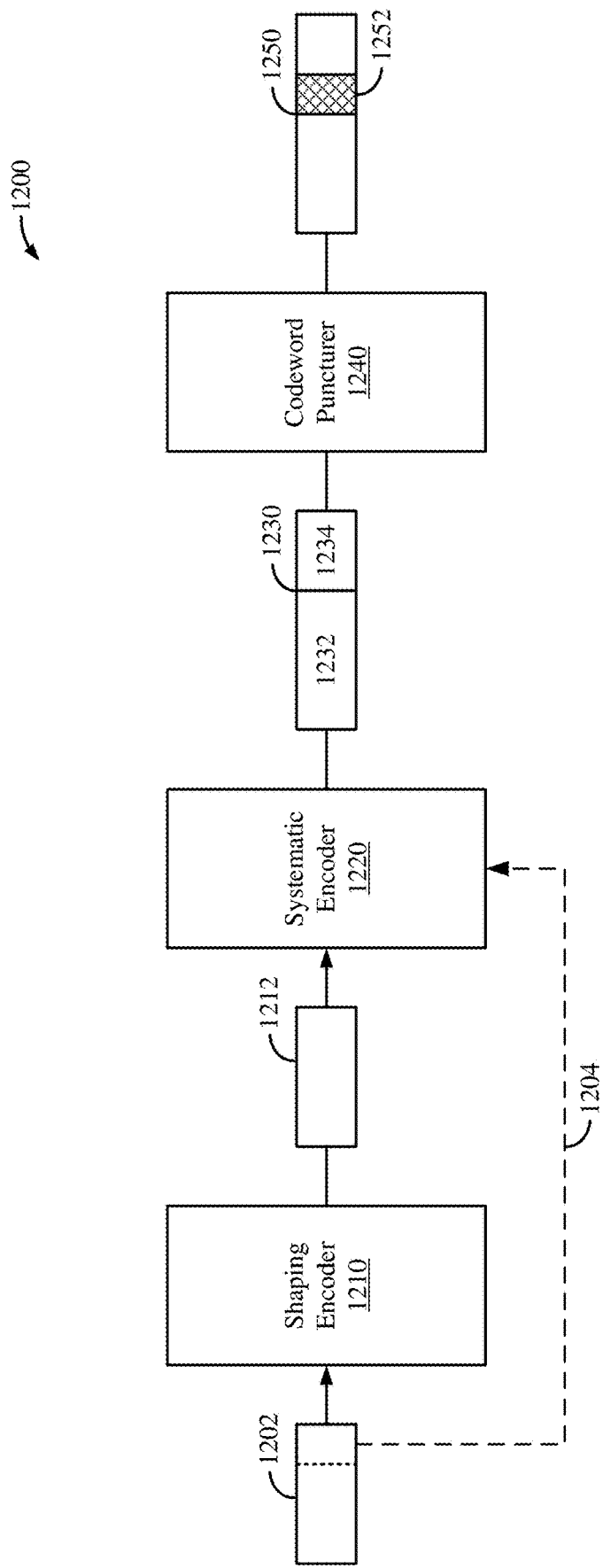
FIG. 12 shows another diagram of a flow that supports amplitude shaping according to some implementations.

FIG. 12 shows another diagram of a flow 1200 that supports amplitude shaping according to some implementations. For example, the flow 1200 may be another implementation of the flow 700 depicted in FIG. 7A. In the example of FIG. 12, an information block 1202 is provided to a shaping encoder 1210. In some implementations, a subset of bits 1204 (such as unshaped information bits or LSBs) of the information block 1202 may be provided directly to a systematic encoder 1220, as unshaped information bits, thereby bypassing the shaping encoder 1210. For example, the subset of bits 1204 may be parsed from the information block 1202 by a pre-shaping parser (such as the pre-shaping parser 704 of FIG. 7A). As a result, the shaping encoder 1210 may receive only a subset of bits of the information block 1202. In some aspects, the number of bits 1204 sent directly to the systematic encoder 1220 may depend on a puncturing operation performed by the codeword puncturer 1240. In some other implementations, each bit of the information block 1202 may be provided to the shaping encoder 1210.

The shaping encoder 1210 may be one example of the shaping encoder 710 of FIG. 7A. Thus, the shaping encoder 1210 may encode one or more bits of the information block 1202 to generate amplitude-shaped bits 1212 such that the amplitudes of the associated symbols have a non-uniform distribution, and specifically, a distribution in which the probabilities associated with the respective amplitudes generally increase with decreasing amplitude (such as a Gaussian distribution). In some implementations, the shaping encoder 1210 is or includes a prefix encoder having an effective coding rate of approximately 0.95.

As described above, the performance of a prefix encoding operation may include comparing sequences of consecutive bits of the information block 1202 to one or more patterns of bit values of a set of patterns of bit values having non-uniform lengths. More specifically, the patterns of bit values may be defined such that each of the patterns of bit values has an associated probability of occurrence in the information block 1202 such that the patterns of bit values associated with relatively lower symbol amplitudes have relatively higher probabilities of occurrence than the patterns of bit values associated with relative higher symbol amplitudes. In some implementations configured for 4096 QAM, there may be up to 32 possible sequences of information bits that may be input into the shaping encoder 1210 for the prefix encoding operation.

For example, as shown in Tables 1-4, there are 32 sequences or patterns of amplitude bits that may be output by the shaping encoder 1210. Each sequence of amplitude bits may consist of 5 bit values representing the magnitude of either the in-phase (I) component or the quadrature (Q) component of the amplitude of an associated symbol. Each of the sequences of amplitude bits is associated with a respective symbol amplitude. For example, there are 32 different possible sequences of amplitude bits and associated amplitude level values ranging from 1 to 63 (odd numbers only).

TABLE 1

| Input Sequence of Information Bits | Output Sequence of Amplitude Bits | Amplitude (I/Q Level) | Probability |
|---|---|---|---|
| 0011 | 10000 | 1 | 1/16 |
| 0000 | 10001 | 3 | 1/16 |
| 0001 | 10011 | 5 | 1/16 |
| 0110 | 10010 | 7 | 1/16 |
| 0111 | 10110 | 9 | 1/16 |
| 0100 | 10111 | 11 | 1/16 |
| 0101 | 10101 | 13 | 1/16 |
| 11001 | 10100 | 15 | 1/32 |
| 11110 | 11100 | 17 | 1/32 |
| 11111 | 11101 | 19 | 1/32 |
| 11100 | 11111 | 21 | 1/32 |
| 11101 | 11110 | 23 | 1/32 |
| 10010 | 11010 | 25 | 1/32 |
| 10011 | 11011 | 27 | 1/32 |
| 10000 | 11001 | 29 | 1/32 |
| 10001 | 11000 | 31 | 1/32 |
| 10110 | 01000 | 33 | 1/32 |
| 10111 | 01001 | 35 | 1/32 |
| 10100 | 01011 | 37 | 1/32 |
| 10101 | 01010 | 39 | 1/32 |
| 110110 | 01110 | 41 | 1/64 |
| 110111 | 01111 | 43 | 1/64 |

TABLE 1-continued

| Input Sequence of Information Bits | Output Sequence of Amplitude Bits | Amplitude (I/Q Level) | Probability |
|---|---|---|---|
| 110100 | 01101 | 45 | 1/64 |
| 110101 | 01100 | 47 | 1/64 |
| 001010 | 00100 | 49 | 1/64 |
| 001011 | 00101 | 51 | 1/64 |
| 001000 | 00111 | 53 | 1/64 |
| 001001 | 00110 | 55 | 1/64 |
| 1100010 | 00010 | 57 | 1/128 |
| 1100011 | 00011 | 59 | 1/128 |
| 1100000 | 00001 | 61 | 1/128 |
| 1100001 | 00000 | 63 | 1/128 |

As shown in Table 1, there are 32 possible sequences of information bits that may be input into the shaping encoder 1210. In this example, each sequence of amplitude bits has a probability of occurrence associated with a probability mass function (PMF), where PMF=[8, 8, 8, 8, 8, 8, 8, 4, 4, 4, 4, 4, 4, 4, 4, 4, 4, 4, 4, 2, 2, 2, 2, 2, 2, 2, 2, 1, 1, 1, 1]/128. With reference for example to Equation (2), the effective coding rate of a prefix encoding table can be derived by dividing the average number of amplitude-shaped bits (# of bits) by the length (5) of each sequence of amplitude bits. Thus, the prefix encoding table above (Table 1) has an effective coding rate of 0.9500.

TABLE 2

| Input Sequence of Information Bits | Output Sequence of Amplitude Bits | Amplitude (I/Q Level) | Probability |
|---|---|---|---|
| 0000 | 10000 | 1 | 1/16 |
| 0001 | 10001 | 3 | 1/16 |
| 0110 | 10011 | 5 | 1/16 |
| 0111 | 10010 | 7 | 1/16 |
| 0100 | 10110 | 9 | 1/16 |
| 0101 | 10111 | 11 | 1/16 |
| 11010 | 10101 | 13 | 1/32 |
| 11011 | 10100 | 15 | 1/32 |
| 11000 | 11100 | 17 | 1/32 |
| 11001 | 11101 | 19 | 1/32 |
| 11110 | 11111 | 21 | 1/32 |
| 11111 | 11110 | 23 | 1/32 |
| 11100 | 11010 | 25 | 1/32 |
| 11101 | 11011 | 27 | 1/32 |
| 10010 | 11001 | 29 | 1/32 |
| 10011 | 11000 | 31 | 1/32 |
| 10000 | 01000 | 33 | 1/32 |
| 10001 | 01001 | 35 | 1/32 |
| 10110 | 01011 | 37 | 1/32 |
| 10111 | 01010 | 39 | 1/32 |
| 10100 | 01110 | 41 | 1/32 |
| 10101 | 01111 | 43 | 1/32 |
| 001010 | 01101 | 45 | 1/64 |
| 001011 | 01100 | 47 | 1/64 |
| 001000 | 00100 | 49 | 1/64 |
| 001001 | 00101 | 51 | 1/64 |
| 001110 | 00111 | 53 | 1/64 |
| 001111 | 00110 | 55 | 1/64 |
| 001100 | 00010 | 57 | 1/64 |
| 001101 | 00011 | 59 | 1/64 |
| N/A | 00001 | 61 | 0 |
| N/A | 00000 | 63 | 0 |

As shown in Table 2, there are 30 possible sequences of information bits that may be input into the shaping encoder 1210. In this example, each sequence of amplitude bits has a probability of occurrence associated with a PMF, where PMF=[8, 8, 8, 8, 8, 8, 4, 4, 4, 4, 4, 4, 4, 4, 4, 4, 4, 4, 4, 4, 2, 2, 2, 2, 2, 2, 2, 2, 0, 0]/128. The prefix encoding table above (Table 2) has an effective coding rate of 0.9500.

TABLE 3

| Input Sequence of Information Bits | Output Sequence of Amplitude Bits | Amplitude (I/Q Level) | Probability |
|---|---|---|---|
| 0011 | 10000 | 1 | 1/16 |
| 0000 | 10001 | 3 | 1/16 |
| 0001 | 10011 | 5 | 1/16 |
| 0110 | 10010 | 7 | 1/16 |
| 0111 | 10110 | 9 | 1/16 |
| 0100 | 10111 | 11 | 1/16 |
| 0101 | 10101 | 13 | 1/16 |
| 11001 | 10100 | 15 | 1/32 |
| 11110 | 11100 | 17 | 1/32 |
| 11111 | 11101 | 19 | 1/32 |
| 11100 | 11111 | 21 | 1/32 |
| 11101 | 11110 | 23 | 1/32 |
| 10010 | 11010 | 25 | 1/32 |
| 10011 | 11011 | 27 | 1/32 |
| 10000 | 11001 | 29 | 1/32 |
| 10001 | 11000 | 31 | 1/32 |
| 10110 | 01000 | 33 | 1/32 |
| 10111 | 01001 | 35 | 1/32 |
| 10100 | 01011 | 37 | 1/32 |
| 10101 | 01010 | 39 | 1/32 |
| 110001 | 01110 | 41 | 1/64 |
| 110110 | 01111 | 43 | 1/64 |
| 110111 | 01101 | 45 | 1/64 |
| 110100 | 01100 | 47 | 1/64 |
| 110101 | 00100 | 49 | 1/64 |
| 001010 | 00101 | 51 | 1/64 |
| 001011 | 00111 | 53 | 1/64 |
| 001000 | 00110 | 55 | 1/64 |
| 001001 | 00010 | 57 | 1/64 |
| 1100000 | 00011 | 59 | 1/128 |
| 1100001 | 00001 | 61 | 1/128 |
| N/A | 00000 | 63 | 0 |

As shown in Table 3, there are 31 possible sequences of information bits that may be input into the shaping encoder 1210. In this example, each sequence of amplitude bits has a probability of occurrence associated with a PMF, where PMF=[8, 8, 8, 8, 8, 8, 8, 4, 4, 4, 4, 4, 4, 4, 4, 4, 4, 4, 4, 4, 2, 2, 2, 2, 2, 2, 2, 2, 1, 1, 0]/128. The prefix encoding table above (Table 3) has an effective coding rate of 0.9469.

TABLE 4

| Input Sequence of Information Bits | Output Sequence of Amplitude Bits | Amplitude (I/Q Level) | Probability |
|---|---|---|---|
| 0000 | 10000 | 1 | 1/16 |
| 0001 | 10001 | 3 | 1/16 |
| 0110 | 10011 | 5 | 1/16 |
| 0111 | 10010 | 7 | 1/16 |
| 0100 | 10110 | 9 | 1/16 |
| 0101 | 10111 | 11 | 1/16 |
| 11010 | 10101 | 13 | 1/32 |
| 11011 | 10100 | 15 | 1/32 |
| 11000 | 11100 | 17 | 1/32 |
| 11001 | 11101 | 19 | 1/32 |
| 11110 | 11111 | 21 | 1/32 |
| 11111 | 11110 | 23 | 1/32 |
| 11100 | 11010 | 25 | 1/32 |
| 11101 | 11011 | 27 | 1/32 |
| 10010 | 11001 | 29 | 1/32 |
| 10011 | 11000 | 31 | 1/32 |
| 10000 | 01000 | 33 | 1/32 |
| 10001 | 01001 | 35 | 1/32 |
| 10110 | 01011 | 37 | 1/32 |
| 10111 | 01010 | 39 | 1/32 |
| 10100 | 01110 | 41 | 1/32 |
| 10101 | 01111 | 43 | 1/32 |
| 001011 | 01101 | 45 | 1/64 |
| 001000 | 01100 | 47 | 1/64 |
| 001001 | 00100 | 49 | 1/64 |
| 001110 | 00101 | 51 | 1/64 |
| 001111 | 00111 | 53 | 1/64 |
| 001100 | 00110 | 55 | 1/64 |
| 001101 | 00010 | 57 | 1/64 |
| 0010100 | 00011 | 59 | 1/128 |
| 0010101 | 00001 | 61 | 1/128 |
| N/A | 00000 | 63 | 0 |

As shown in Table 4, there are 31 possible sequences of information bits that may be input into the shaping encoder 1210. In this example, each sequence of amplitude bits has a probability of occurrence associated with a PMF, where PMF=[8, 8, 8, 8, 8, 8, 4, 4, 4, 4, 4, 4, 4, 4, 4, 4, 4, 4, 4, 4, 4, 4, 2, 2, 2, 2, 2, 2, 2, 1, 1, 0]/128. The prefix encoding table above (Table 4) has an effective coding rate of 0.9531.

Aspects of the present disclosure recognize that, although 5 bits may be used to encode each of the amplitude levels for a 4096 QAM, not all 5 bits need to be amplitude-shaped to achieve an effective coding rate ~0.95. As shown in Tables 5-7, an effective coding rate close to 0.95 can be achieved by shaping only 4 (MSBs) of the 5 bits. In other words, each unique sequence of information bits may be mapped to a respective 4-bit sequence of amplitude bits. The 1 remaining bit (LSB) is not used in amplitude shaping but may be used to determine the corresponding amplitude level associated with the sequence of amplitude-shaped bits. As shown in Tables 8 and 9, an effective coding rate of approximately 0.95 also can be achieved by shaping only 3 (MSBs) of the 5 bits. In other words, each unique sequence of information bits may be mapped to a respective 3-bit sequence of amplitude bits. The remaining 2 bits (LSBs) are not used in amplitude shaping but may be used to determine the corresponding amplitude level associated with the sequence of amplitude-shaped bits.

TABLE 5

| Input Sequence of Information Bits | Output Sequence of Amplitude Bits | Amplitude (I/Q Level) | Probability |
|---|---|---|---|
| 110 | 1000 | 1 or 3 | 1/8 |
| 111 | 1001 | 3 or 7 | 1/8 |
| 100 | 1011 | 9 or 11 | 1/8 |
| 101 | 1010 | 13 or 15 | 1/8 |
| 0000 | 1110 | 17 or 19 | 1/16 |
| 0001 | 1111 | 21 or 23 | 1/16 |
| 0110 | 1101 | 25 or 27 | 1/16 |
| 0111 | 1100 | 29 or 31 | 1/16 |
| 0100 | 0100 | 33 or 35 | 1/16 |
| 0101 | 0101 | 37 or 39 | 1/16 |
| 00100 | 0111 | 41 or 43 | 1/32 |
| 00101 | 0110 | 45 or 47 | 1/32 |
| 001110 | 0010 | 49 or 51 | 1/64 |
| 001111 | 0011 | 53 or 55 | 1/64 |
| 001100 | 0001 | 57 or 59 | 1/64 |
| 001101 | 0000 | 61 or 63 | 1/64 |

As shown in Table 5, there are 16 possible sequences of information bits that may be input into the shaping encoder 1210. Each sequence of information bits maps to a 4-bit sequence of amplitude bits. Each sequence of amplitude bits (MSBs) is further associated with 2 amplitude levels. Thus, the remaining unshaped bit (LSB) may be used to distinguish between the two amplitude levels. In this example, each sequence of amplitude bits has a probability of occurrence associated with a PMF, where PMF=[8, 8, 8, 8, 8, 4, 4, 4, 4, 2, 2, 1, 1, 1, 1]/64. The prefix encoding table above (Table 5) has a native coding rate of 0.9219. The effective coding rate ($R_{eff}$) can be determined as a function of the number of amplitude-shaped bits (MSBs), the number of unshaped amplitude bits (LSBs), and the native coding rate (R):

$$R_{eff} = \frac{MSB * R + LSB}{MSB + LSB}$$

Thus, the prefix encoding table above (Table 5) has an effective coding rate of 0.9375 ((4*0.9219+1)/5=0.9375).

TABLE 6

| Input Sequence of Information Bits | Output Sequence of Amplitude Bits | Amplitude (I/Q Level) | Probability |
|---|---|---|---|
| 110 | 1000 | 1 or 3 | 1/8 |
| 111 | 1001 | 3 or 7 | 1/8 |
| 100 | 1011 | 9 or 11 | 1/8 |
| 101 | 1010 | 13 or 15 | 1/8 |
| 0001 | 1110 | 17 or 19 | 1/16 |
| 0110 | 1111 | 21 or 23 | 1/16 |
| 0111 | 1101 | 25 or 27 | 1/16 |
| 0100 | 1100 | 29 or 31 | 1/16 |
| 0101 | 0100 | 33 or 35 | 1/16 |
| 00001 | 0101 | 37 or 39 | 1/32 |
| 00110 | 0111 | 41 or 43 | 1/32 |
| 00111 | 0110 | 45 or 47 | 1/32 |
| 00100 | 0010 | 49 or 51 | 1/32 |
| 00101 | 0011 | 53 or 55 | 1/32 |
| 000000 | 0001 | 57 or 59 | 1/64 |
| 000001 | 0000 | 61 or 63 | 1/64 |

As shown in Table 6, there are 16 possible sequences of information bits that may be input into the shaping encoder 1210. Each sequence of information bits maps to a 4-bit sequence of amplitude bits. Each sequence of amplitude bits (MSBs) is further associated with 2 amplitude levels. Thus, the remaining unshaped bit (LSB) may be used to distinguish between the two amplitude levels. In this example, each sequence of amplitude bits has a probability of occurrence associated with a PMF, where PMF=[8, 8, 8, 8, 4, 4, 4, 4, 4, 2, 2, 2, 2, 2, 1, 1]/64. The prefix encoding table above (Table 6) has a native coding rate of 0.9297 and an effective coding rate of 0.9438.

TABLE 7

| Input Sequence of Information Bits | Output Sequence of Amplitude Bits | Amplitude (I/Q Level) | Probability |
|---|---|---|---|
| 111 | 1000 | 1 or 3 | 1/8 |
| 100 | 1001 | 3 or 7 | 1/8 |
| 101 | 1011 | 9 or 11 | 1/8 |
| 0010 | 1010 | 13 or 15 | 1/16 |
| 0011 | 1110 | 17 or 19 | 1/16 |
| 0000 | 1111 | 21 or 23 | 1/16 |
| 0001 | 1101 | 25 or 27 | 1/16 |
| 0110 | 1100 | 29 or 31 | 1/16 |
| 0111 | 0100 | 33 or 35 | 1/16 |
| 0100 | 0101 | 37 or 39 | 1/16 |
| 0101 | 0111 | 41 or 43 | 1/16 |
| 11011 | 0110 | 45 or 47 | 1/32 |
| 11000 | 0010 | 49 or 51 | 1/32 |
| 11001 | 0011 | 53 or 55 | 1/32 |
| 110100 | 0001 | 57 or 59 | 1/64 |
| 110101 | 0000 | 61 or 63 | 1/64 |

As shown in Table 7, there are 16 possible sequences of information bits that may be input into the shaping encoder 1210. Each sequence of information bits maps to a 4-bit sequence of amplitude bits. Each sequence of amplitude bits (MSBs) is further associated with 2 amplitude levels. Thus, the remaining unshaped bit (LSB) may be used to distinguish between the two amplitude levels. In this example, each sequence of amplitude bits has a probability of occurrence associated with a PMF, where PMF=[8, 8, 8, 4, 4, 4, 4, 4, 4, 4, 2, 2, 2, 1, 1]/64. The prefix encoding table above (Table 7) has a native coding rate of 0.9453 and an effective coding rate of 0.9562.

TABLE 8

| Input Sequence of Information Bits | Output Sequence of Amplitude Bits | Amplitude (I/Q Level) | Probability |
|---|---|---|---|
| 00 | 100 | {1, 3, 5, 7} | 1/4 |
| 01 | 101 | {9, 11, 13, 15} | 1/4 |
| 111 | 111 | {17, 19, 21, 23} | 1/8 |
| 100 | 110 | {25, 27, 29, 31} | 1/8 |
| 101 | 010 | {33, 35, 37, 39} | 1/8 |
| 1101 | 011 | {41, 43, 45, 47} | 1/16 |
| 11000 | 001 | {49, 51, 53, 55} | 1/32 |
| 11001 | 000 | {57, 59, 61, 63} | 1/32 |

As shown in Table 8, there are 8 possible sequences of information bits that may be input into the shaping encoder 1210. Each sequence of information bits maps to a 3-bit sequence of amplitude bits. Each sequence of amplitude bits (MSBs) is further associated with 4 amplitude levels. Thus, the remaining 2 unshaped bits (LSBs) may be used to distinguish between the 4 amplitude levels. In this example, each sequence of amplitude bits has a probability of occurrence associated with a PMF, where PMF=[8, 8, 4, 4, 4, 2, 1, 1]/32. The prefix encoding table above (Table 8) has a native coding rate of 0.8958 and an effective coding rate of 0.9375.

TABLE 9

| Input Sequence of Information Bits | Output Sequence of Amplitude Bits | Amplitude (I/Q Level) | Probability |
|---|---|---|---|
| 01 | 100 | {1, 3, 5, 7} | 1/4 |
| 001 | 101 | {9, 11, 13, 15} | 1/8 |
| 110 | 111 | {17, 19, 21, 23} | 1/8 |
| 111 | 110 | {25, 27, 29, 31} | 1/8 |
| 100 | 010 | {33, 35, 37, 39} | 1/8 |
| 101 | 011 | {41, 43, 45, 47} | 1/8 |
| 0000 | 001 | {49, 51, 53, 55} | 1/16 |
| 0001 | 000 | {57, 59, 61, 63} | 1/16 |

As shown in Table 9, there are 8 possible sequences of information bits that may be input into the shaping encoder 1210. Each sequence of information bits maps to a 3-bit sequence of amplitude bits. Each sequence of amplitude bits (MSBs) is further associated with 4 amplitude levels. Thus, the remaining 2 unshaped bits (LSBs) may be used to distinguish between the 4 amplitude levels. In this example, each sequence of amplitude bits has a probability of occurrence associated with a PMF, where PMF=[8, 4, 4, 4, 4, 4, 2, 2]/32. The prefix encoding table above (Table 9) has a native coding rate of 0.9583 and an effective coding rate of 0.9751. It is noted that, the input sequence of information bits in any of Tables 1-9 can be flipped (by replacing 1's with 0's and 0's with 1's), resulting in a new prefix encoding table with an identical PMF as the corresponding table.

After matching a sequence of information bits to one of the patterns of bit values in a prefix encoding table, the shaping encoder 1210 may then output a sequence of amplitude bits 1212 that is associated with the pattern of bit values. For example, suppose the next four information bits to be encoded by the shaping encoder 1210 are 0110. Based on this sequence of information bits, the shaping encoder 1210 may identify the pattern 0110 in a LUT that includes the set of patterns of bit values. For example, the LUT may implement Table 1. The shaping encoder 1210 may then map the pattern 0110 to the corresponding sequence of amplitude bits having the pattern 10010, which has an associated amplitude level of 7, and output the sequence of amplitude bits to a systematic encoder 1220.

The systematic encoder 1220 may be one example of the systematic encoder 716 of FIG. 7A. Thus, the systematic encoder 1220 may perform a systematic encoding operation on the sequence of amplitude bits 1212 such that the bits output from the systematic encoder 1220 match those input to the systematic encoder 1220. In some implementations, the systematic encoder 1220 is or includes an LDPC encoder. As such, for each code block input to the systematic encoder 1220, the systematic encoder 1220 produces a resultant codeword 1230 that includes a systematic portion 1232 and a parity portion 1234. The systematic portion includes the amplitude bits 1212 as well as any LSBs, sign bits, or signaling bits (not shown for simplicity) that may be included with the code block input to the systematic encoder 1220. The parity portion 1234 includes a number of parity bits which add redundancy to, and may be used in the decoding of, the codeword 1230.

In some implementations, the systematic encoder 1220 may use a legacy LDPC code, having a coding rate of 5/6 (such as described by existing versions of the IEEE 802.11 standard), to generate the codeword 1230. For example, the systematic encoder 1220 may receive a 1620-bit code block as its input and output a codeword of length 1944. As described above, peak spectral efficiency may be achieved with a 5/6 coding rate. However, because the amplitude shaping operation has an effective coding rate <1, the resulting codeword 1230 output by the systematic encoder 1220 (implementing a rate 5/6 LDPC code) will have an overall coding rate <5/6. In some implementations, the effective coding rate of the systematic encoder 1220 may be improved (or increased) through puncturing. For example, the codeword 1230 may be provided as an input to a codeword puncturer 1240.

The codeword puncturer 1240 may puncture one or more bits of the codeword 1230 to produce a punctured codeword 1250 that is effectively shorter in length than the input codeword 1230. More specifically, the punctured codeword 1250 may include a number of punctured bits 1252 that will not be transmitted or encoded into QAM symbols. With reference for example to FIG. 7B, the punctured bits 1252 may be excluded from the codeword 718 input to the ordering module 724. For example, when the systematic encoder 1220 uses a legacy LDPC code, the codeword puncturer 1240 may puncture 93 bits of the resulting codeword 1230. Thus, of the 1944 total codeword bits, only 1851 of the codeword bits may be transmitted or encoded into QAM symbols. As a result, the punctured codeword 1250 has an effective coding rate equal to 1620/1851=0.875 (or 7/8). The punctured bits 1252 may be treated as erasures and thereby corrected or recovered by an LDPC decoder of the receiving device. In some implementations, the punctured bits 1252 may include information bits, parity bits, or any combination thereof.

As described above, the number of punctured bits 1252 may be a function of modulation order so that the number of punctured bits is a multiple of half the number of bits carried by a QAM symbol. Given a legacy LDPC code, another example is to puncture 96 bits of the 1944 codeword bits, resulting in a punctured codeword of length 1848. The effective coding rate of the punctured codeword is 1620/1848=0.8766 (which is close to rate 7/8). Puncturing 96 bits may be implemented in cases where it is desirable for the number of punctured bits to be a multiple of the bits in a modulation symbol (for a 4096 QAM, where each QAM symbol carries 12 bits). Yet another example is to puncture 90 bits of a rate 5/6 codeword of length 1944, resulting in 7.5 QAM punctured symbols (for a 4096 QAM). Effectively, 15 QAM symbols are punctured for every two codewords.

In some other implementations, the systematic encoder 1220 may generate the codeword 1230 using a new LDPC code that is optimized for higher coding rates (also referred to herein as a "non-legacy LDPC code"). For example, the non-legacy LDPC code may be optimized for encoding a greater number of parity bits for a given codeword length (compared to legacy LDPC codes). In some implementations, the non-legacy LDPC code may be based on a quasi-cyclic (QC) parity-check matrix. Such codes may be referred to as QC LDPC codes. A parity-check matrix for a QC LDPC code may be represented by a base matrix and expansion submatrices for expanding the elements of the base matrix. Each submatrix of a parity-check matrix may correspond to an all-zero matrix or a cyclic permutation matrix (also referred to as a "circulant matrix") having a circulant weight greater than or equal to 1. For a cyclic permutation matrix with a circulant weight of 1, each row and column of the cyclic permutation matrix may contain only one non-zero element.

Figure 13:
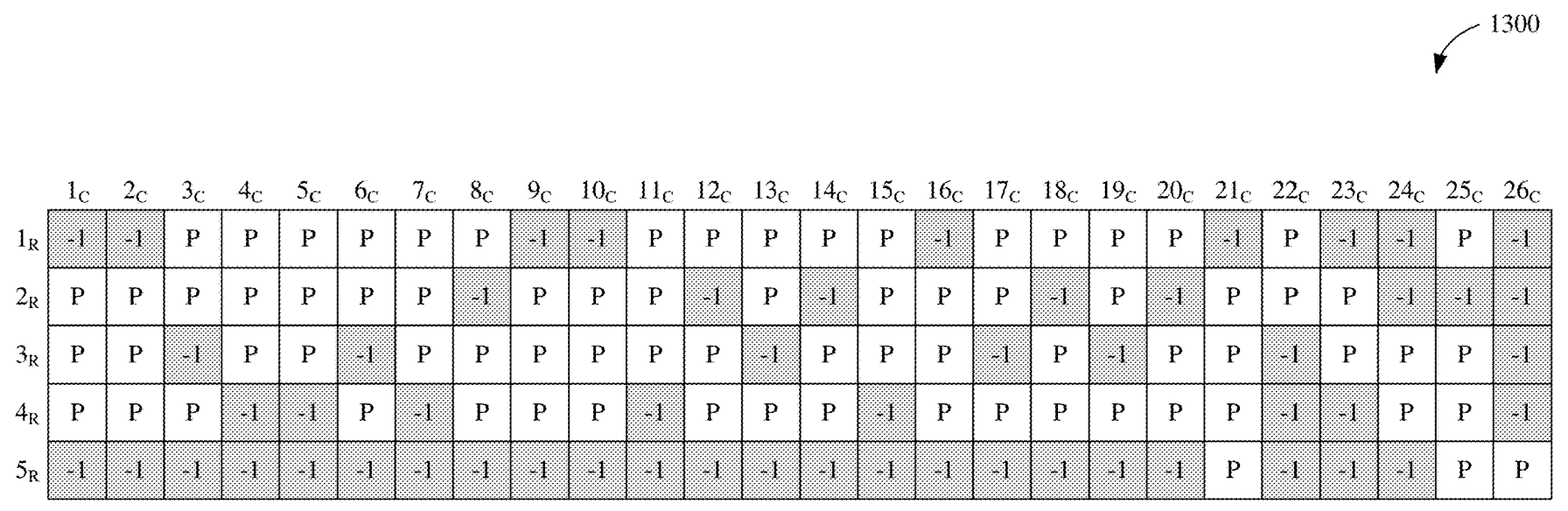

FIG. 13 shows an example parity-check matrix 1300 for an LDPC code. In some implementations, the parity-check matrix 1300 may be optimized for rate 7/8 LDPC codewords. With reference for example to FIG. 12, the parity-check matrix 1300 (or a generator matrix based on the parity-check matrix 1300) may be used by the systematic encoder 1220 to generate the codewords 1230. More specifically, the systematic encoder 1220 may use the parity-check matrix 1300 to generate a number of parity bits for a number (M) of information bits of an input code block. The parity bits are added to the systematic bits to produce a number (L) of codeword bits representing a codeword 1230. An LDPC decoder may use the same parity-check matrix 1300 to validate and correct individual bits of a received codeword. More specifically, the LDPC decoder may determine that a received codeword is a valid codeword if the following condition is satisfied: $Hc^T=0$, where H represents the parity-check matrix 1300 and c is a vector representing the codeword.

In some implementations, the parity-check matrix 1300 may correspond to a base matrix of a QC LDPC code. As shown in FIG. 13, the base matrix includes 5 rows (denoted with a subscript "R") and 26 columns (denoted with a subscript "C"). At the intersection of each row and column of the parity-check matrix 1300 resides a submatrix of dimension Z×Z. For example, each "−1" entry in the parity-check matrix 500 may be expanded to an all-zero submatrix and each "P" in the parity-check matrix 500 may be expanded to a cyclic permutation matrix having a circulant weight equal to or greater than 1. As shown in FIG. 13, an all-zero submatrix resides at the intersection of row 1 and each of columns 1, 2, 9, 10, 16, 21, 23, 24 and 26, at the intersection of row 2 and each of columns 8, 12, 14, 18, 20, 24, 25 and 26, at the intersection of row 3 and each of columns 3, 6, 13, 17, 19, 22 and 26, at the intersection of row 4 and each of columns 4, 5, 7, 11, 15, 22, 23 and 26, and at the intersection of row 5 and each of columns 1-20 and 22-24 of the parity-check matrix 1300.

In some implementations, each cyclic permutation matrix P of the parity-check matrix 1300 may have circulant weight equal to 1. In other words, each row and each column of the cyclic permutation matrix P contains only one non-zero value (equal to 1). FIG. 14A shows an example 3×3 cyclic permutation matrix 1400 having a circulant weight equal to 1 and a rotation of size 0. It is noted that the cyclic permutation matrix 1400 is a 3×3 identity matrix. FIG. 14B shows an example 3×3 cyclic permutation matrix 1410 having a circulant weight equal to 1 and a rotation of size 1. With reference for example to FIG. 14A, the cyclic permutation matrix 1410 may be generated by shifting or "rotating" each column of the cyclic permutation matrix 1400 to the right by one column. FIG. 14C shows an example 3×3 cyclic permutation matrix 1420 having a circulant weight equal to 1 and a rotation of size 2. With reference for example to FIG. 14A, the cyclic permutation matrix 1420 may be generated by shifting or rotating each column of the cyclic permutation matrix 1400 to the right by two columns.

In some implementations, each entry in the parity-check matrix 1300 may correspond to a submatrix of dimension 81×81 (Z=81). The systematic encoder 1220 may use the parity-check matrix 1300 (or a generator matrix based on the parity-check matrix 1300) to encode 1701 information bits into LDPC codewords of length 1944, for example, to achieve a 7/8 code rate. However, the encoding process generates 405 parity bits for every 1701 information bits, resulting in 2106 total codeword bits. Thus, the codeword puncturer 1240 may puncture 162 codeword bits of the 2106-bit codeword so that the resulting punctured codeword has an effective length of 1944. In some implementations, the punctured codeword bits 1252 may consist of 162 information bits. In some other implementations, the punctured codeword bits 1252 may include 81 parity bits and 81 information bits. Still further, in some implementations, the punctured codeword bits 1252 may include any number of information bits, parity bits, or combination thereof. If one or more information bits are punctured from the 2106-bit long codeword, the resulting punctured code may be referred to as "semi-systematic," where the number of systematic bits is less than the number of information bits.

As described above, the punctured codeword bits 1252 are not transmitted or encoded into QAM symbols. As such, the punctured codeword bits 1252 do not affect the amplitude levels of the QAM symbols and therefore cannot be used for amplitude shaping. In some implementations, the operation or configuration of the shaping encoder 1210 may depend, at least in part, on the number and type of punctured codeword bits 1252. For example, when the systematic encoder 1220 uses a non-legacy LDPC code to generate 405 parity bits for every 1701 information bits (such as described with respect to FIG. 13) and the codeword puncturer 1240 punctures 162 of the information bits, at most 1539 bits (referred to herein as "systematic bits") of the 1701-bit input to the systematic encoder 1220 can be used for amplitude shaping. In other words, a pre-shaping parser (such as the pre-shaping parser 704 of FIG. 7A) may parse at least 162 bits from the information block 1202, as the subset of bits 1204, to be provided directly to the systematic encoder 1220.

In implementations where the shaping encoder 1210 uses a sequence of 5 amplitude bits to represent each amplitude level (such as shown in Tables 1-4), 1535 of the 1539 systematic bits may be shaped or output by the shaping encoder 1210. The remaining 4 systematic bits are insufficient for amplitude shaping and may therefore be used as sign bits. The 4 unshaped systematic bits, combined with the 162 punctured bits, yields a total of 166 unshaped information bits. On the other hand, 1535 shaped bits result in 1535/5=307 shaped PAM amplitudes. Since a codeword of length 1944 contains 324 PAM amplitudes, 17 of the PAM amplitudes will be unshaped. Assuming the systematic encoder 1210 has an effective coding rate of 0.95, the overall effective coding rate of the system is (1535*0.95+166)/1944=0.8355, which is slightly greater than a 5/6 coding rate.

Aspects of the present disclosure recognize that, by reducing the number of amplitude bits required for shaping, even more of the PAM amplitudes may be shaped. For example, in implementations where the shaping encoder 1210 uses a sequence of 4 amplitude bits to represent each amplitude level (such as shown in Tables 5-7), only 1296 of the 1539 systematic bits are needed to shape all 324 PAM amplitudes (324 PAM amplitudes*4 MSBs/shaped amplitude=1296). This leaves 243 unshaped systematic bits. The 243 unshaped systematic bits, combined with the 162 punctured bits, yields a total of 409 unshaped information bits. Assuming the systematic encoder 1210 has an effective coding rate of 0.95, the overall effective coding rate of the system is (1296*0.95+409)/1944=0.8437.

As described above, the punctured codewords bits 1252 may be treated as erasures and thereby recovered or corrected through a conventional LDPC decoding process that uses the same LDPC code as the systematic encoder 1220. Thus, the flow 1100 described above with respect to FIGS. 11A and 11B may be used to decode the punctured codeword 1250. Specifically, the systematic decoder 1116 may use the same LDPC code used by the systematic encoder 1220 to decode the received codeword 1114. Further, the shaping decoder 1126 may use the same prefix encoding table used by the shaping encoder 1210 to decode (or de-shape) the amplitude-shaped bits 1118.

Figure 15:
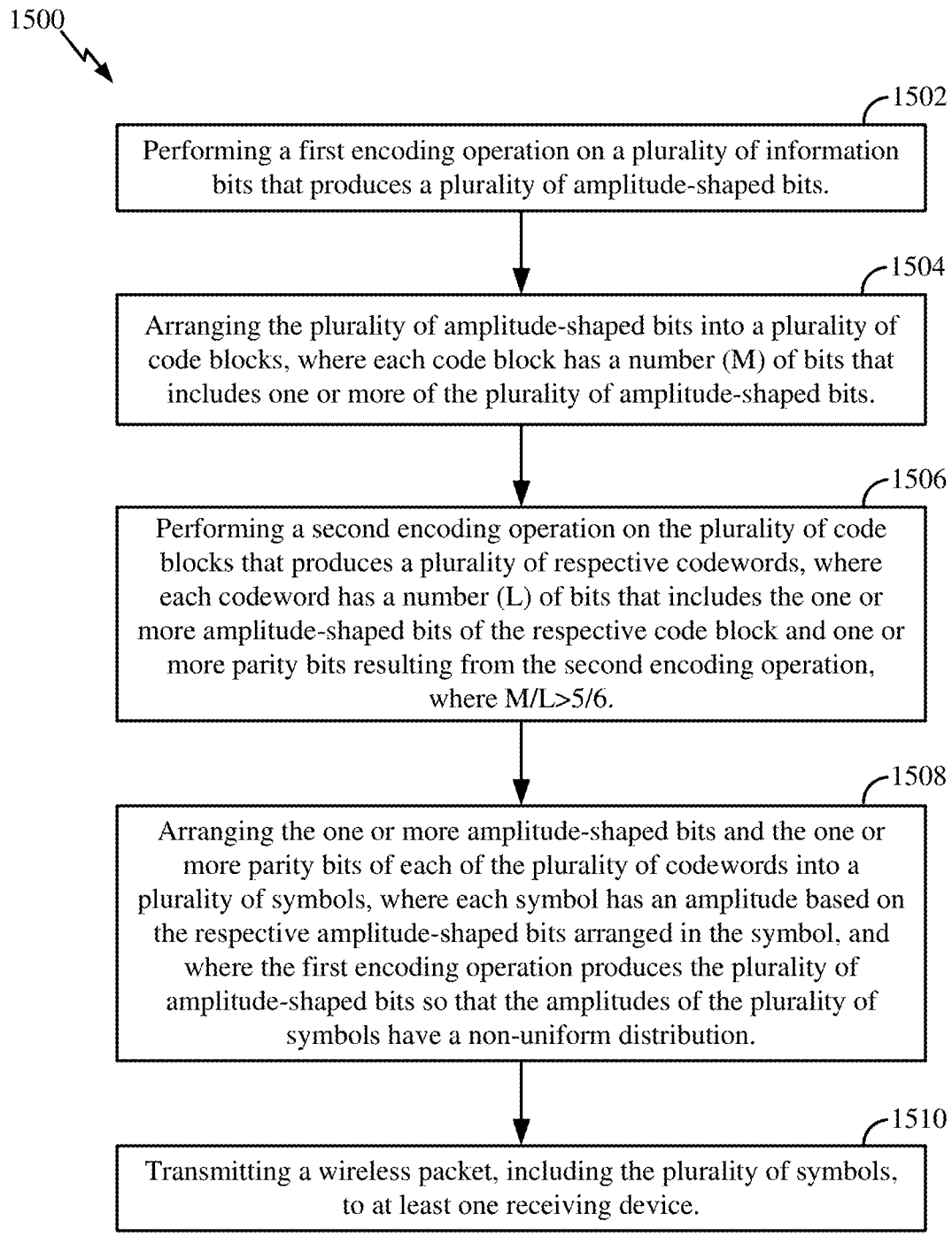
FIG. 15 shows a flowchart illustrating an example process for wireless communication that supports amplitude shaping according to some implementations.

FIG. 15 shows a flowchart illustrating an example process 1500 for wireless communication that supports amplitude shaping according to some implementations. In some implementations, the process 1500 may be performed by a wireless communication device operating as or within a network node, such as one of the STAs 104 or 504 described above with reference to FIGS. 1 and 5B, respectively. In some other implementations, the process 1500 may be performed by a wireless communication device operating as or within an AP, such as one of the APs 102 or 502 described above with reference to FIGS. 1 and 5A, respectively.

In some implementations, the process 1500 begins in block 1502 with performing a first encoding operation on a plurality of information bits that produces a plurality of amplitude-shaped bits. In some implementations, the first encoding operation has an effective coding rate greater than or equal to 0.5 and less than 1. In some implementations, the first encoding operation is not performed on a plurality of unshaped information bits, the M bits of each code block further including one or more of the plurality of unshaped information bits.

In some implementations, the performing of the first encoding operation includes selecting, from a LUT, a pattern of bit values that matches a subset of the information bits, where the LUT stores a plurality of patterns of bit values corresponding to a respective plurality of patterns of amplitude-shaped bits, and where the plurality of amplitude-shaped bits includes the pattern of amplitude-shaped bits corresponding to the selected pattern of bit values. In some aspects, each of the plurality of patterns of amplitude-shaped bits may represent a respective amplitude level having a probability of occurrence based on a PMF. In some other aspects, each of the plurality of patterns of amplitude-shaped bits may represent two or more amplitude levels having a probability of occurrence based on a PMF.

In block 1504, the process 1500 proceeds with arranging the plurality of amplitude-shaped bits into a plurality of code blocks, where each code block has a number (M) of bits that includes one or more of the plurality of amplitude-shaped bits. In block 1506, the process 1500 proceeds with performing a second encoding operation on the plurality of code blocks that produces a plurality of respective codewords, where each codeword has a number (L) of bits that includes the one or more amplitude-shaped bits of the respective code block and one or more parity bits resulting from the second encoding operation, where M/L>5/6. In some implementations, M/L=7/8. In some implementations, the second encoding operation is based on an LDPC code. In some aspects, the LDPC code may have a coding rate equal to 7/8. In some other aspects, the LDPC code may have a coding rate equal to 5/6.

In some implementations, the performing of the second encoding operation includes encoding the M bits of each code block as a respective number (N) of codeword bits based on the LDPC code and puncturing a number (K) of the codeword bits associated with each code block so that L=N−K. In some aspects, M=1620, N=1944, and K≥90. In some other aspects, M=1701, N=2106, and K=162. In some implementations, the puncturing is not performed on the plurality of amplitude-shaped bits.

In block 1508, the process 1500 proceeds with arranging the one or more amplitude-shaped bits and the one or more parity bits of each of the plurality of codewords into a plurality of symbols, where each symbol has an amplitude based on the respective amplitude-shaped bits arranged in the symbol, and where the first encoding operation produces the plurality of amplitude-shaped bits so that the amplitudes of the plurality of symbols have a non-uniform distribution. In block 1510, the process 1500 proceeds with transmitting a wireless packet, including the plurality of symbols, to at least one receiving device.

Figure 16:
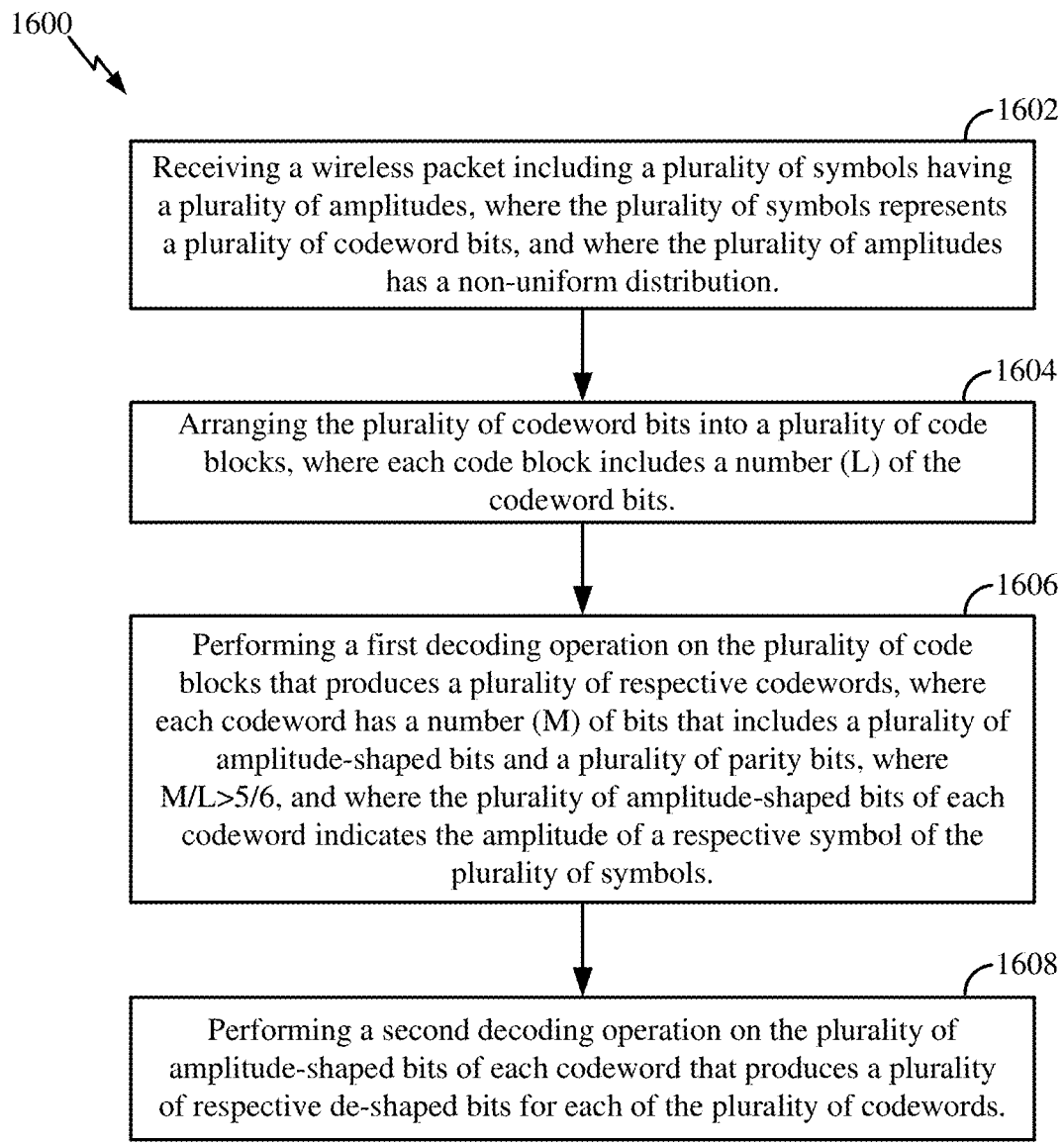
FIG. 16 shows a flowchart illustrating an example process for wireless communication that supports amplitude shaping according to some implementations.

FIG. 16 shows a flowchart illustrating an example process 1600 for wireless communication that supports amplitude shaping according to some implementations. In some implementations, the process 1600 may be performed by a wireless communication device operating as or within a network node, such as one of the STAs 104 or 504 described above with reference to FIGS. 1 and 5B, respectively. In some other implementations, the process 1600 may be performed by a wireless communication device operating as or within an AP, such as one of the APs 102 or 502 described above with reference to FIGS. 1 and 5A, respectively.

In some implementations, the process 1600 begins in block 1602 with receiving a wireless packet including a plurality of symbols having a plurality of amplitudes, where the plurality of symbols represents a plurality of codeword bits, and where the plurality of amplitudes has a non-uniform distribution. In block 1604, the process 1600 proceeds with arranging the plurality of codeword bits into a plurality of code blocks, where each code block includes a number (L) of the codeword bits. In block 1606, the process 1600 proceeds with performing a first decoding operation on the plurality of code blocks that produces a plurality of respective codewords, where each codeword has a number (M) of bits that includes a plurality of amplitude-shaped bits and a plurality of parity bits, where M/L>5/6, and where the plurality of amplitude-shaped bits of each codeword indicates the amplitude of a respective symbol of the plurality of symbols. In some implementations, M/L=7/8. In some implementations, the first decoding operation is based on an LDPC code. In some aspects, the LDPC code has a coding rate equal to 7/8. In some other aspects, the LDPC code has a coding rate equal to 5/6.

In block 1608, the process 1600 proceeds with performing a second decoding operation on the plurality of amplitude-shaped bits of each codeword that produces a plurality of respective de-shaped bits for each of the plurality of codewords. In some implementations, the second decoding operation reverses a prefix encoding operation having an effective coding rate greater than or equal to 0.5 and less than 1. In some implementations, the performing of the second decoding operation includes selecting, from a LUT, a pattern of de-shaped bits that matches the plurality of amplitude-shaped bits of a respective codeword of the plurality of codewords, where the LUT stores a plurality of patterns of de-shaped bits corresponding to a respective plurality of patterns of amplitude-shaped bits, and where the plurality of de-shaped bits including the selected pattern of de-shaped bits. In some aspects, each of the plurality of patterns of amplitude-shaped bits may represent a respective amplitude of the plurality of amplitudes having a probability of occurrence based on a PMF. In some other aspects, each of the plurality of patterns of amplitude-shaped bits represents two or more amplitudes of the plurality of amplitudes having a probability of occurrence based on a PMF.

Figure 17:
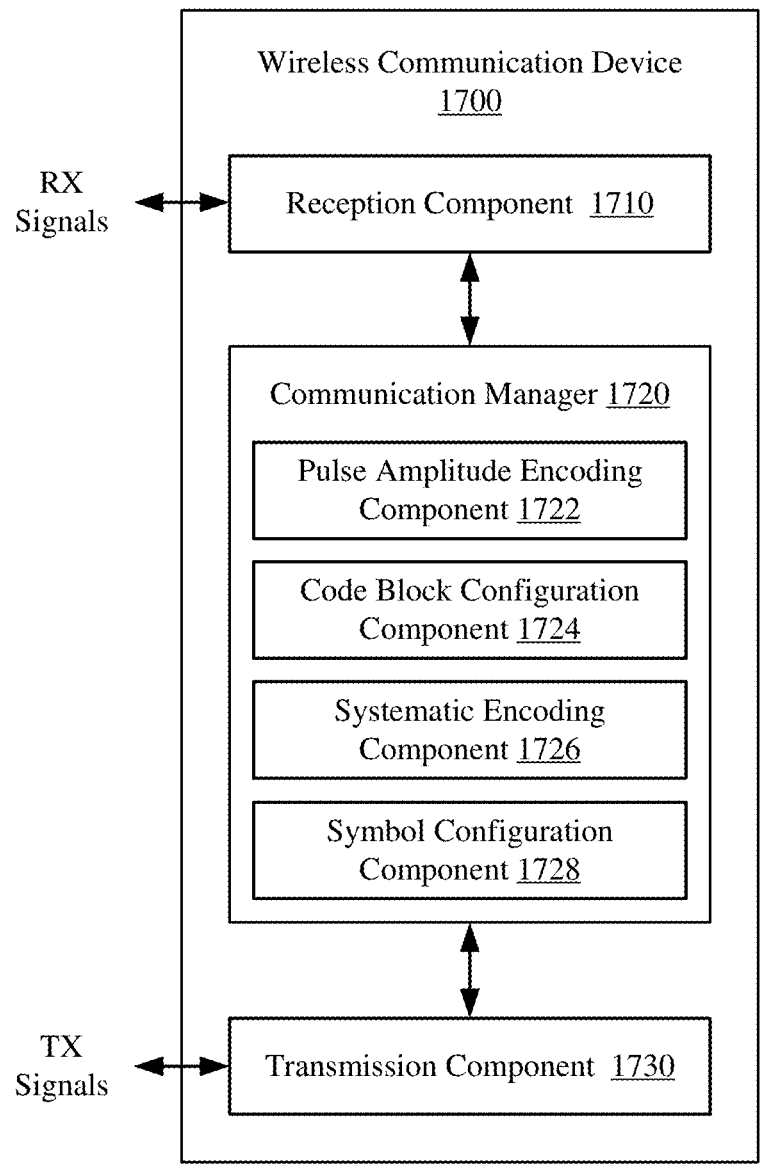
FIG. 17 shows a block diagram of an example wireless communication device according to some implementations.

FIG. 17 shows a block diagram of an example wireless communication device 1700 according to some implementations. In some implementations, the wireless communication device 1700 is configured to perform the process 1500 described above with reference to FIG. 15. The wireless communication device 1700 can be an example implementation of the wireless communication device 400 described above with reference to FIG. 4. For example, the wireless communication device 1700 can be a chip, SoC, chipset, package or device that includes at least one processor and at least one modem (for example, a Wi-Fi (IEEE 802.11) modem or a cellular modem).

The wireless communication device 1700 includes a reception component 1710, a communication manager 1720, and a transmission component 1730. The communication manager 1720 further includes a pulse amplitude encoding component 1722, a code block configuration component 1724, a systematic encoding component 1726, and a symbol configuration component 1728. Portions of one or more of the components 1722-1728 may be implemented at least in part in hardware or firmware. In some implementations, at least some of the components 1722-1728 are implemented at least in part as software stored in a memory (such as the memory 408). For example, portions of one or more of the components 1722-1728 can be implemented as non-transitory instructions (or "code") executable by a processor (such as the processor 406) to perform the functions or operations of the respective component.

The reception component 1710 is configured to receive RX signals, over a wireless channel, from one or more other wireless communication devices. The communication manager 1720 is configured to control or manage communications with the one or more other wireless communication devices. In some implementations, the pulse amplitude encoding component 1722 may perform a first encoding operation on a plurality of information bits that produces a plurality of amplitude-shaped bits; the code block configuration component 1724 may arrange the plurality of amplitude-shaped bits into a plurality of code blocks, where each code block has a number (M) of bits that includes one or more of the plurality of amplitude-shaped bits; the systematic encoding component 1726 may perform a second encoding operation on the plurality of code blocks that produces a plurality of respective codewords, where each codeword has a number (L) of bits that includes the one or more amplitude-shaped bits for the respective code block and one or more parity bits resulting from the second encoding operation, where M/L>5/6; and the symbol configuration component 1728 may arrange the one or more amplitude-shaped bits and the one or more parity bits of each of the plurality of codewords into a plurality of symbols, where each symbols has an amplitude based on the respective amplitude-shaped bits arranged in the symbol, and where the first encoding operation produces the plurality of amplitude-shaped bits so that the amplitudes of the plurality of the symbols have a non-uniform distribution. The transmission component 1730 is configured to transmit TX signals to the one or more other wireless communication devices. In some implementations the TX signals may include a wireless packet that includes the plurality of symbols.

Figure 18:
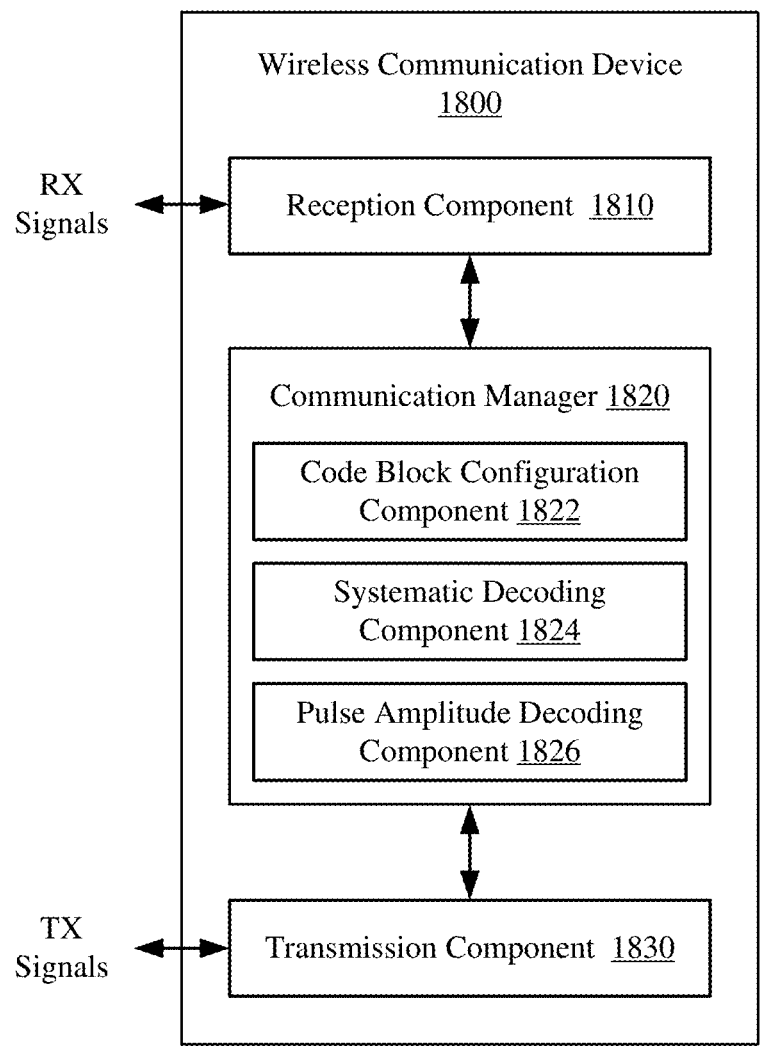
FIG. 18 shows a block diagram of an example wireless communication device according to some implementations.

FIG. 18 shows a block diagram of an example wireless communication device 1800 according to some implementations. In some implementations, the wireless communication device 1800 is configured to perform the process 1600 described above with reference to FIG. 16. The wireless communication device 1800 can be an example implementation of the wireless communication device 400 described above with reference to FIG. 4. For example, the wireless communication device 1800 can be a chip, SoC, chipset, package or device that includes at least one processor and at least one modem (for example, a Wi-Fi (IEEE 802.11) modem or a cellular modem).

The wireless communication device 1800 includes a reception component 1810, a communication manager 1820, and a transmission component 1830. The communication manager 1820 further includes a code block configuration component 1822, a systematic decoding component 1824, and a pulse amplitude decoding component 1826. Portions of one or more of the components 1822-1826 may be implemented at least in part in hardware or firmware. In some implementations, at least some of the components 1822-1826 are implemented at least in part as software stored in a memory (such as the memory 408). For example, portions of one or more of the components 1822-1826 can be implemented as non-transitory instructions (or "code") executable by a processor (such as the processor 406) to perform the functions or operations of the respective component.

The reception component 1810 is configured to receive RX signals, over a wireless channel, from one or more other wireless communication devices. In some implementations, the RX signals may include a wireless packet that includes a plurality of symbols having a plurality of amplitudes, where the plurality of symbols represent a plurality of codeword bits, and where the plurality of amplitudes have a non-uniform distribution. The communication manager 1820 is configured to control or manage communications with the one or more other wireless communication devices. In some implementations, the code block configuration component 1822 may arrange the plurality of codeword bits into a plurality of code blocks, where each code block includes a number (L) of the codeword bits; the systematic decoding component 1824 may perform a first decoding operation on the plurality of code blocks that produces a plurality of respective codewords, where each codeword has a number (M) of bits that includes a plurality of amplitude-shaped bits and a plurality of parity bits, where M/L>5/6; and the pulse amplitude decoding component 1826 may perform a second decoding operation on the plurality of amplitude-shaped bits of each codeword that produces a plurality of respective de-shaped bits for each of the plurality of codewords. The transmission component 1830 is configured to transmit TX signals to the one or more other wireless communication devices.

Implementation examples are described in the following numbered clauses:

1. A method for wireless communication by a wireless communication device, the method including:

performing a first encoding operation on a plurality of information bits that produces a plurality of amplitude-shaped bits;

arranging the plurality of amplitude-shaped bits into a plurality of code blocks, each code block having a number (M) of bits that includes one or more of the plurality of amplitude-shaped bits;

performing a second encoding operation on the plurality of code blocks that produces a plurality of respective codewords, each codeword having a number (L) of bits that includes the one or more amplitude-shaped bits of the respective code block and one or more parity bits resulting from the second encoding operation, where M/L>5/6;

arranging the one or more amplitude-shaped bits and the one or more parity bits of each of the plurality of codewords into a plurality of symbols, each symbol having an amplitude based on the respective amplitude-shaped bits arranged in the symbol, the first encoding operation producing the plurality of amplitude-shaped bits so that the amplitudes of the plurality of symbols have a non-uniform distribution; and transmitting a wireless packet, including the plurality of symbols, to at least one receiving device.

2. The method of clause 1, wherein M/L=7/8.

3. The method of any of clauses 1 or 2, wherein the first encoding operation has an effective coding rate greater than or equal to 0.5 and less than 1.

4. The method of any of clauses 1-3, wherein the performing of the first encoding operation includes:

selecting, from a look-up table (LUT), a pattern of bit values that matches a subset of the information bits, the LUT storing a plurality of patterns of bit values corresponding to a respective plurality of patterns of amplitude-shaped bits, the plurality of amplitude-shaped bits including the pattern of amplitude-shaped bits corresponding to the selected pattern of bit values.

5. The method of any of clauses 1-4, wherein each of the plurality of patterns of amplitude-shaped bits represents a respective amplitude level having a probability of occurrence based on a probability mass function (PMF).

6. The method of any of clauses 1-4, wherein each of the plurality of patterns of amplitude-shaped bits represents two or more amplitude levels having a probability of occurrence based on a PMF.

7. The method of any of clauses 1-6, wherein the first encoding operation is not performed on a plurality of unshaped information bits, the M bits of each code block further including one or more of the plurality of unshaped information bits.

8. The method of any of clauses 1-7, wherein the second encoding operation is based on a low-density parity-check (LDPC) code.

9. The method of any of clauses 1-8, wherein the LDPC code has a coding rate equal to 7/8.

10. The method of any of clauses 1-8, wherein the LDPC code has a coding rate equal to 5/6.

11. The method of any of clauses 1-8 or 10, wherein the performing of the second encoding operation comprises:
encoding the M bits of each code block as a respective number (N) of codeword bits based on the LDPC code; and
puncturing a number (K) of the codeword bits associated with each code block so that L=N−K.

12. The method of any of clauses 1-8,10 or 11, wherein the puncturing is not performed on the plurality of amplitude-shaped bits.

13. The method of any of clauses 1-8 or 10-12, wherein M=1620, N=1944, and K≥90.

14. The method of any of clauses 1-8 or 10-12, wherein M=1701, N=2106, and K=162.

15. A wireless communication device comprising:
at least one modem;
at least one processor communicatively coupled with the at least one modem; and
at least one memory communicatively coupled with the at least one processor and storing processor-readable code that, when executed by the at least one processor in conjunction with the at least one modem, is configured to perform the method of any one or more of clauses 1-14.

16. A method for wireless communication by a wireless communication device, the method including:
receiving a wireless packet including a plurality of symbols having a plurality of amplitudes, the plurality of symbols representing a plurality of codeword bits, the plurality of amplitudes having a non-uniform distribution;
arranging the plurality of codeword bits into a plurality of code blocks, each code block including a number (L) of the codeword bits;
performing a first decoding operation on the plurality of code blocks that produces a plurality of respective codewords, each codeword having a number (M) of bits that includes a plurality of amplitude-shaped bits and a plurality of parity bits, where M/L>5/6, the plurality of amplitude-shaped bits of each codeword indicating the amplitude of a respective symbol of the plurality of symbols; and
performing a second decoding operation on the plurality of amplitude-shaped bits of each codeword that produces a plurality of respective de-shaped bits for each of the plurality of codewords.

17. The method of clause 16, wherein M/L=7/8.

18. The method of any of clauses 16 or 17, wherein the first decoding operation is based on a low-density parity-check (LDPC) code.

19. The method of any of clauses 16-18, wherein the LDPC code has a coding rate equal to 7/8.

20. The method of any of clauses 16-18, wherein the LDPC code has a coding rate equal to 5/6.

21. The method of any of clauses 16-20, wherein the second decoding operation reverses a prefix encoding operation having an effective coding rate greater than or equal to 0.5 and less than 1.

22. The method of any of clauses 16-21, wherein the performing of the second decoding operation includes:
selecting, from a look-up table (LUT), a pattern of de-shaped bits that matches the plurality of amplitude-shaped bits of a respective codeword of the plurality of codewords, the LUT storing a plurality of patterns of de-shaped bits corresponding to a respective plurality of patterns of amplitude-shaped bits, the plurality of de-shaped bits including the selected pattern of de-shaped bits.

23. The method of any of clauses 16-22, wherein each of the plurality of patterns of amplitude-shaped bits represents a respective amplitude of the plurality of amplitudes having a probability of occurrence based on a probability mass function (PMF).

24. The method of any of clauses 16-22, wherein each of the plurality of patterns of amplitude-shaped bits represents two or more amplitudes of the plurality of amplitudes having a probability of occurrence based on a PMF.

25. A wireless communication device comprising:
at least one modem;
at least one processor communicatively coupled with the at least one modem; and
at least one memory communicatively coupled with the at least one processor and storing processor-readable code that, when executed by the at least one processor in conjunction with the at least one modem, is configured to perform the method of any one or more of the clauses 16-24.

As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a and b and c.

The various illustrative components, logic, logical blocks, modules, circuits, operations and algorithm processes described in connection with the implementations disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

What is claimed is:

1. A method for wireless communication by a wireless communication device, the method comprising:
    performing a first encoding operation on a plurality of information bits that produces a plurality of amplitude-shaped bits;
    arranging the plurality of amplitude-shaped bits into a plurality of code blocks, each code block having a number (M) of bits that includes one or more of the plurality of amplitude-shaped bits;
    performing a second encoding operation on the plurality of code blocks that produces a plurality of respective codewords, each codeword having a number (L) of bits that includes the one or more amplitude-shaped bits of the respective code block and one or more parity bits resulting from the second encoding operation, where M/L>5/6;
    arranging the one or more amplitude-shaped bits and the one or more parity bits of each of the plurality of codewords into a plurality of symbols, each symbol having an amplitude based on the respective amplitude-shaped bits arranged in the symbol, the first encoding operation producing the plurality of amplitude-shaped bits so that the amplitudes of the plurality of symbols have a non-uniform distribution; and
    transmitting a wireless packet, including the plurality of symbols, to at least one receiving device.

2. The method of claim 1, wherein M/L=7/8.

3. The method of claim 1, wherein the first encoding operation has an effective coding rate greater than or equal to 0.5 and less than 1.

4. The method of claim 1, wherein the performing of the first encoding operation comprises:
    selecting, from a look-up table (LUT), a pattern of bit values that matches a subset of the information bits, the LUT storing a plurality of patterns of bit values corresponding to a respective plurality of patterns of amplitude-shaped bits, the plurality of amplitude-shaped bits including the pattern of amplitude-shaped bits corresponding to the selected pattern of bit values.

5. The method of claim 4, wherein each of the plurality of patterns of amplitude-shaped bits represents a respective amplitude level having a probability of occurrence based on a probability mass function (PMF).

6. The method of claim 4, wherein each of the plurality of patterns of amplitude-shaped bits represents two or more amplitude levels having a probability of occurrence based on a PMF.

7. The method of claim 1, wherein the first encoding operation is not performed on a plurality of unshaped information bits, the M bits of each code block further including one or more of the plurality of unshaped information bits.

8. The method of claim 1, wherein the second encoding operation is based on a low-density parity-check (LDPC) code.

9. The method of claim 8, wherein the LDPC code has a coding rate equal to 7/8.

10. The method of claim 8, wherein the LDPC code has a coding rate equal to 5/6.

11. The method of claim 8, wherein the performing of the second encoding operation comprises:
    encoding the M bits of each code block as a respective number (N) of codeword bits based on the LDPC code; and
    puncturing a number (K) of the codeword bits associated with each code block so that L=N−K.

12. The method of claim 11, wherein the puncturing is not performed on the plurality of amplitude-shaped bits.

13. The method of claim 11, wherein M=1620, N=1944, and K≥90.

14. The method of claim 11, wherein M=1701, N=2106, and K=162.

15. A wireless communication device comprising:
    at least one modem;
    at least one processor communicatively coupled with the at least one modem; and
    at least one memory communicatively coupled with the at least one processor and storing processor-readable code that, when executed by the at least one processor in conjunction with the at least one modem, is configured to:
    perform a first encoding operation on a plurality of information bits that produces a plurality of amplitude-shaped bits;
    arrange the plurality of amplitude-shaped bits into a plurality of code blocks, each code block having a number (M) of bits that includes one or more of the plurality of amplitude-shaped bits;
    perform a second encoding operation on the plurality of code blocks that produces a plurality of respective codewords, each codeword having a number (L) of bits that includes the one or more amplitude-shaped bits of the respective code block and one or more parity bits resulting from the second encoding operation, where M/L>5/6;
    arrange the one or more amplitude-shaped bits and the one or more parity bits of each of the plurality of codewords into a plurality of symbols, each symbol having an amplitude based on the respective amplitude-shaped bits arranged in the symbol, the first encoding operation producing the plurality of amplitude-shaped bits so that the amplitudes of the plurality of symbols have a non-uniform distribution; and
    transmit a wireless packet, including the plurality of symbols, to at least one receiving device.

16. The wireless communication device of claim 15, wherein M/L=7/8.

17. The wireless communication device of claim 15, wherein the first encoding operation has an effective coding rate greater than or equal to 0.5 and less than 1.

18. The wireless communication device of claim 15, wherein the performing of the first encoding operation comprises:
selecting, from a look-up table (LUT), a pattern of bit values that matches a subset of the information bits, the LUT storing a plurality of patterns of bit values corresponding to a respective plurality of patterns of amplitude-shaped bits, the plurality of amplitude-shaped bits including the pattern of amplitude-shaped bits corresponding to the selected pattern of bit values.

19. The wireless communication device of claim 15, wherein the performing of the second encoding operation comprises:
encoding the M bits of each code block as a respective number (N) of codeword bits based on a low-density parity-check (LDPC) code; and
puncturing a number (K) of the codeword bits associated with each code block so that L=N−K.

20. The wireless communication device of claim 19, wherein the puncturing is not performed on the plurality of amplitude-shaped bits.

21. A method for wireless communication by a wireless communication device, the method comprising:
receiving a wireless packet including a plurality of symbols having a plurality of amplitudes, the plurality of symbols representing a plurality of codeword bits, the plurality of amplitudes having a non-uniform distribution;
arranging the plurality of codeword bits into a plurality of code blocks, each code block including a number (L) of the codeword bits;
performing a first decoding operation on the plurality of code blocks that produces a plurality of respective codewords, each codeword having a number (M) of bits that includes a plurality of amplitude-shaped bits and a plurality of parity bits, where M/L>5/6, the plurality of amplitude-shaped bits of each codeword indicating the amplitude of a respective symbol of the plurality of symbols; and
performing a second decoding operation on the plurality of amplitude-shaped bits of each codeword that produces a plurality of respective de-shaped bits for each of the plurality of codewords.

22. The method of claim 21, wherein M/L=7/8.

23. The method of claim 21, wherein the first decoding operation is based on a low-density parity-check (LDPC) code.

24. The method of claim 23, wherein the LDPC code has a coding rate equal to 7/8.

25. The method of claim 23, wherein the LDPC code has a coding rate equal to 5/6.

26. The method of claim 21, wherein the second decoding operation reverses a prefix encoding operation having an effective coding rate greater than or equal to 0.5 and less than 1.

27. The method of claim 21, wherein the performing of the second decoding operation comprises:
selecting, from a look-up table (LUT), a pattern of de-shaped bits that matches the plurality of amplitude-shaped bits of a respective codeword of the plurality of codewords, the LUT storing a plurality of patterns of de-shaped bits corresponding to a respective plurality of patterns of amplitude-shaped bits, the plurality of de-shaped bits including the selected pattern of de-shaped bits.

28. The method of claim 27, wherein each of the plurality of patterns of amplitude-shaped bits represents a respective amplitude of the plurality of amplitudes having a probability of occurrence based on a probability mass function (PMF).

29. The method of claim 27, wherein each of the plurality of patterns of amplitude-shaped bits represents two or more amplitudes of the plurality of amplitudes having a probability of occurrence based on a PMF.

30. A wireless communication device comprising:
at least one modem;
at least one processor communicatively coupled with the at least one modem; and
at least one memory communicatively coupled with the at least one processor and storing processor-readable code that, when executed by the at least one processor in conjunction with the at least one modem, is configured to:
receive a wireless packet including a plurality of symbols having a plurality of amplitudes, the plurality of symbols representing a plurality of codeword bits, the plurality of amplitudes having a non-uniform distribution;
arrange the plurality of codeword bits into a plurality of code blocks, each code block including a number (L) of the codeword bits;
perform a first decoding operation on the plurality of code blocks that produces a plurality of respective codewords, each codeword having a number (M) of bits that includes a plurality of amplitude-shaped bits and a plurality of parity bits, where M/L>5/6, the plurality of amplitude-shaped bits of each codeword indicating the amplitude of a respective symbol of the plurality of symbols; and
perform a second decoding operation on the plurality of amplitude-shaped bits of each codeword that produces a plurality of respective de-shaped bits for each of the plurality of codewords.

31. The wireless communication device of claim 30, wherein M/L=7/8.

32. The wireless communication device of claim 30, wherein the first decoding operation is based on a low-density parity-check (LDPC) code.

33. The wireless communication device of claim 30, wherein the second decoding operation reverses a prefix encoding operation having an effective coding rate greater than or equal to 0.5 and less than 1.

34. The wireless communication device of claim 30, wherein the performing of the second decoding operation comprises:
selecting, from a look-up table (LUT), a pattern of de-shaped bits that matches the plurality of amplitude-shaped bits of a respective codeword of the plurality of codewords, the LUT storing a plurality of patterns of de-shaped bits corresponding to a respective plurality of patterns of amplitude-shaped bits, the plurality of de-shaped bits including the selected pattern of de-shaped bits.

\* \* \* \* \*